(12) United States Patent
Whetsel

(10) Patent No.: US 6,560,734 B1
(45) Date of Patent: May 6, 2003

(54) IC WITH ADDRESSABLE TEST PORT

(75) Inventor: Lee D. Whetsel, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/334,993

(22) Filed: Jun. 17, 1999

Related U.S. Application Data

(60) Provisional application No. 60/090,064, filed on Jun. 19, 1998.

(51) Int. Cl.$^7$ ............................................. G01R 31/28
(52) U.S. Cl. ..................................................... 714/724
(58) Field of Search ................................ 714/724–727, 714/733–734, 740

(56) References Cited

U.S. PATENT DOCUMENTS

| | | | |
|---|---|---|---|
| 4,357,703 A | 11/1982 | Van Brunt | 371/15 |
| 4,602,210 A | 7/1986 | Fasang et al. | 324/73 |
| 4,710,931 A | 12/1987 | Bellay et al. | 371/25 |
| 4,857,835 A | 8/1989 | Whetsel, Jr. | 324/73 |
| 4,872,169 A | 10/1989 | Whetsel, Jr. | 371/22.3 |
| 5,001,713 A | 3/1991 | Whetsel | 371/22.3 |
| 5,056,093 A | 10/1991 | Whetsel | 371/22.3 |
| 5,056,094 A | 10/1991 | Whetsel | 371/25.1 |
| 5,329,471 A | 7/1994 | Swoboda et al. | 364/578 |
| 5,428,622 A | 6/1995 | Kuban et al. | 371/22.3 |
| 5,453,992 A | 9/1995 | Whetsel | 371/22.3 |
| 5,483,518 A | 1/1996 | Whetsel | 370/13 |
| 5,495,487 A | 2/1996 | Whetsel, Jr. | 371/25.1 |
| 5,526,365 A | 6/1996 | Whetsel | 371/22.3 |
| 5,544,174 A * | 8/1996 | Abend | 714/726 |
| 5,576,980 A | 11/1996 | Whetsel | 364/579 |
| 5,610,530 A | 3/1997 | Whetsel | 324/763 |
| 5,610,826 A | 3/1997 | Whetsel | 364/487 |
| 5,623,500 A | 4/1997 | Whetsel, Jr. | 371/22.1 |
| 5,627,839 A | 5/1997 | Whetsel | 371/22.3 |
| 5,677,915 A | 10/1997 | Whetsel | 371/22.3 |
| 5,687,179 A | 11/1997 | Whetsel, Jr. et al. | 371/22.3 |
| 5,701,307 A | 12/1997 | Whetsel | 371/22.3 |
| 5,710,779 A | 1/1998 | Whetsel | 371/22.3 |
| 5,715,254 A | 2/1998 | Whetsel | 371/22.3 |
| 5,715,255 A | 2/1998 | Whetsel | 371/22.3 |
| 5,744,949 A * | 4/1998 | Whetsel | 324/158.1 |

(List continued on next page.)

OTHER PUBLICATIONS

Adshead, Dave, "*Embedded Systems: JTAG Accelerates Debugging Process,*" Electronic Engineering Times, Jun. 22, 1998, pp 106.

(List continued on next page.)

*Primary Examiner*—Albert Decady
*Assistant Examiner*—Cynthia Harris
(74) *Attorney, Agent, or Firm*—Lawrence J. Bassuk; W. James Brady; Frederick J. Telecky, Jr.

(57) ABSTRACT

An integrated circuit (100) includes functional input and output signal leads (101,111), input and output circuits (102,112) connectes to the functional input and output signal leads, core circuitry (120, 122, 124), and interconnect wires and circuits (103) connecting the input and output circuits and the core circuitry. The integrated circuit further includes an addressable test port (105, 115, 135) for each core circuitry. Each test port is connected to its respective core circuitry and to the interconnect wires and circuits. External test signal leads (106) connectes to each test port.

5 Claims, 29 Drawing Sheets

U.S. PATENT DOCUMENTS

| | | | | |
|---|---|---|---|---|
| 5,802,270 | A | | 9/1998 | Ko et al. ............... 395/183.03 |
| 5,805,792 | A | | 9/1998 | Swoboda et al. ...... 395/183.04 |
| 5,841,670 | A | | 11/1998 | Swoboda .................... 364/578 |
| 5,847,561 | A | | 12/1998 | Whetsel .................... 324/158.1 |
| 5,862,152 | A | * | 1/1999 | Handly et al. .............. 714/724 |
| 5,872,908 | A | | 2/1999 | Whetsel ................. 395/183.06 |
| 5,883,524 | A | | 3/1999 | Whetsel ....................... 326/16 |
| 5,887,004 | A | | 3/1999 | Walther .................... 371/22.31 |
| 5,905,738 | A | | 5/1999 | Whetsel ..................... 371/22.4 |
| 5,907,562 | A | | 5/1999 | Wrape et al. ............ 371/22.31 |
| 6,046,600 | A | | 4/2000 | Whetsel ....................... 324/763 |
| 6,073,254 | A | | 6/2000 | Whetsel ........................ 714/30 |
| 6,115,763 | A | * | 9/2000 | Douskey et al. .............. 710/72 |
| 6,199,182 | B1 | | 3/2001 | Whetsel ....................... 714/724 |
| 6,223,315 | B1 | * | 4/2001 | Whetsel ....................... 714/727 |
| 6,242,269 | B1 | | 6/2001 | Whetsel ........................ 438/11 |
| 6,311,302 | B1 | | 10/2001 | Cassetti et al. ............. 714/727 |

OTHER PUBLICATIONS

Carbine, Adrian and Feltham, Derek, "*Pentium Pro Processor Design for Test and Debug,* " International Test Conference 1997, Nov. 1–6, 1997, pp. 294–303, IEEE Computer Society.

Colwell, Robert P. and Steck, Randy L., "*TP 10.4: A 0.6um BiCMOS Processor with Dynamic Execution,*" 1995 IEEE International Solid–State Circuits Conference, pp. 176–177.

Gott, Robert A., "*Embedded Systems: Debugging Embedded Software,*" pp. 71–73, 76, 78, Computer Design, Feb. 1998.

Maunder, Colin, and Beenker, Frans, "*Boundary–Scan: A Framework for Structured Design–for–Test,*" paper 30.1, International Test Conference 1987 Proceedings.

Sharp, John, "*JTAG Emulation Systems Explore Embedded Cores,*" pp. 62, Electronic Engineering Times, Jun. 15, 1998.

Whetsel, Lee, "*A Standard Test Bus and Boundary Scan Architecture,*" pp. 48–59, Texas Instruments Technical Journal, Jul.–Aug. 1988, vol. 5, No. 4.

Whetsel, Lee, "*An IEEE 1149.1 Based Logic/Signature Analyzer in a Chip,*" International Test Conference 1991 Proceedings, Oct. 26–30, 1991.

\* cited by examiner

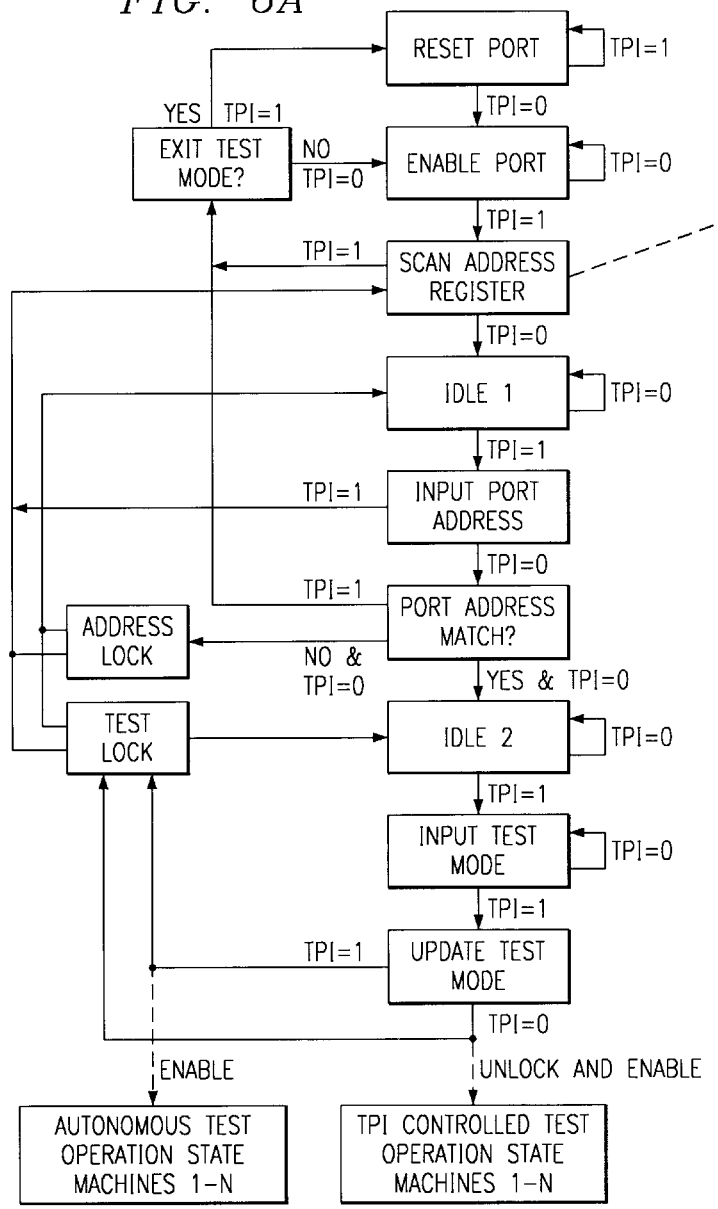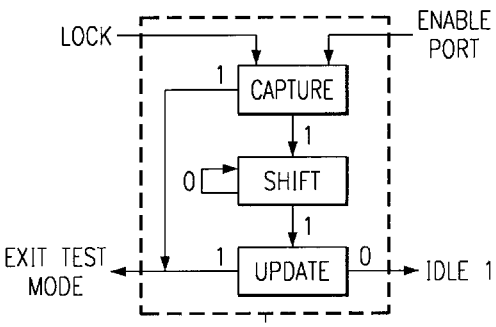
FIG. 6A
FIG. 6B

LOCK TEST
OPERATIONS

LOCK TEST
OPERATIONS

LOCK TEST
OPERATIONS

LOCK TEST
OPERATIONS

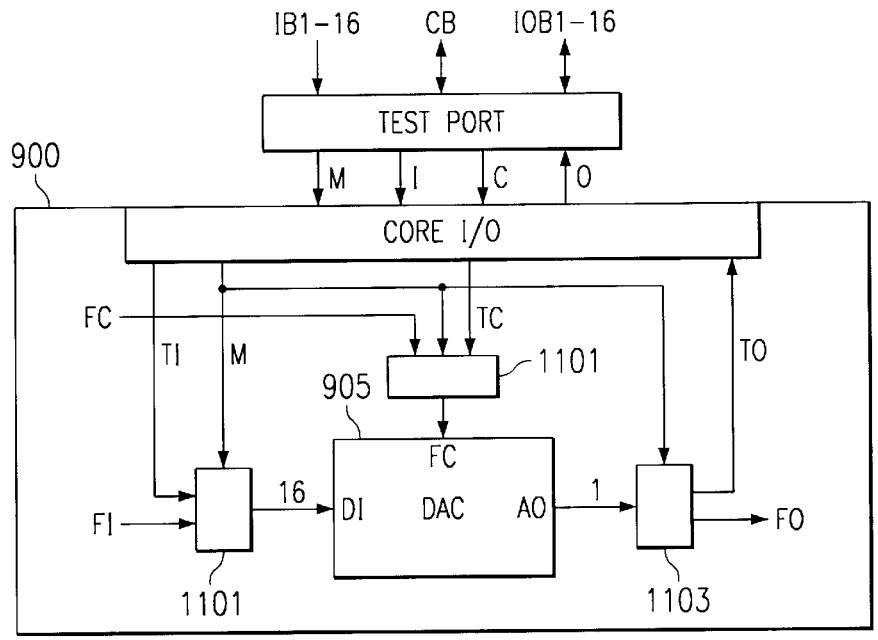
FIG. 13A
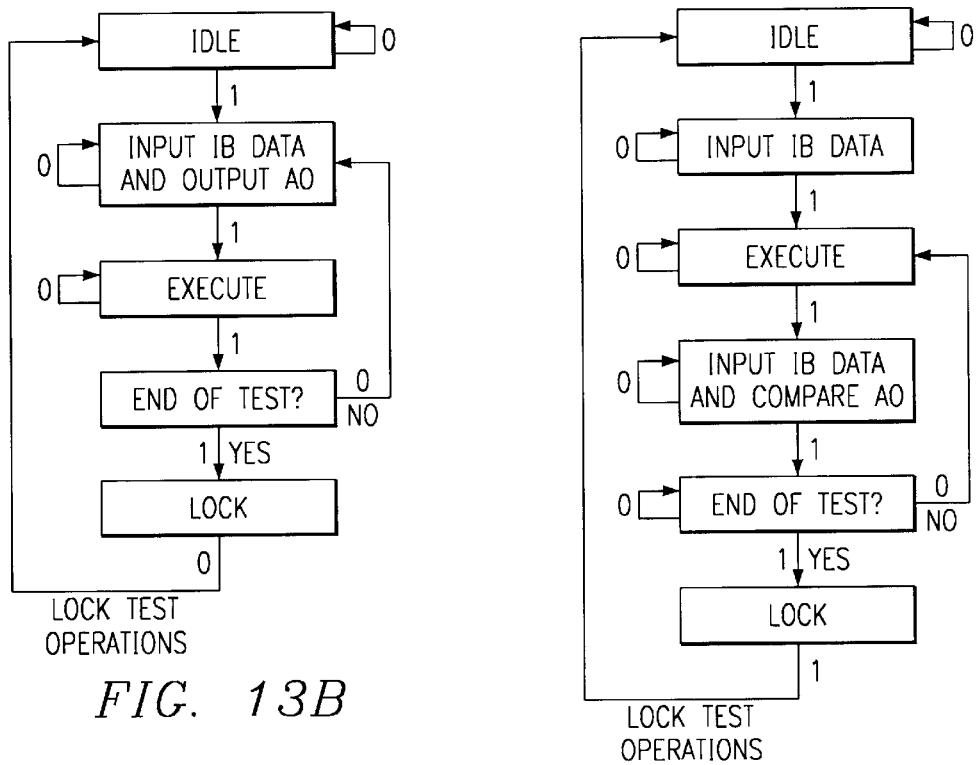
FIG. 13B
FIG. 13C

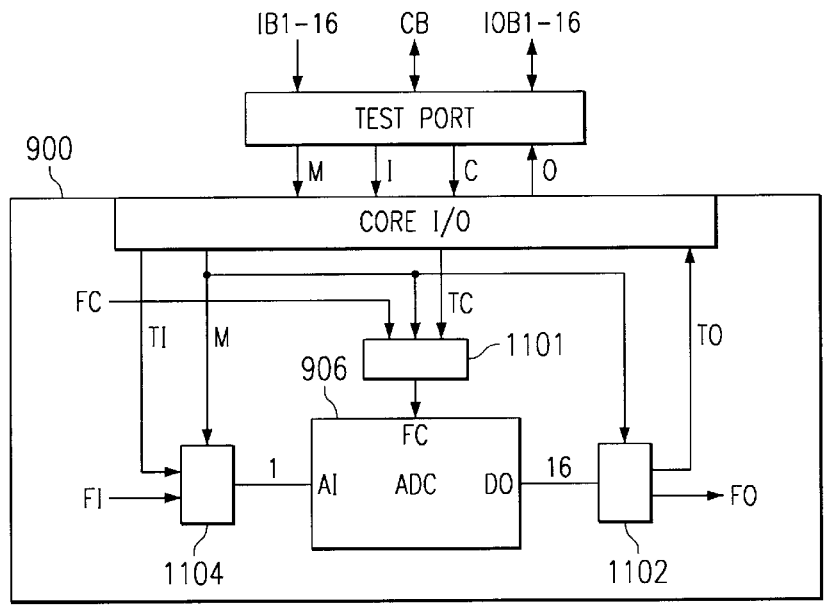
FIG. 15A
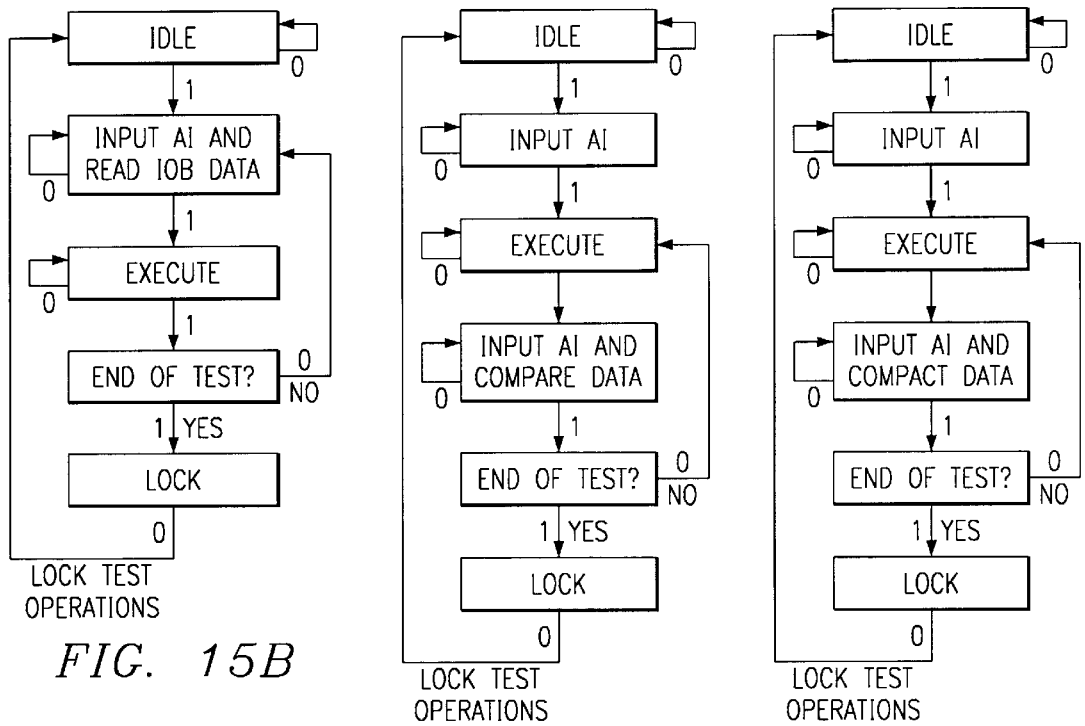
FIG. 15B
FIG. 15C
FIG. 15D

IC WITH ADDRESSABLE TEST PORT This application claims priority under 35 USC § 119(e)(1) of provisional application No. 60/090,064, filed Jun. 19, 1998.

FIELD OF THE INVENTION

This invention relates generally to testing integrated circuits and particularly relates to testing intellectual property cores formed on integrated circuits.

BACKGROUND OF THE INVENTION

Cost effective integrated circuit or IC testing is very important to IC manufacturers from a profit and loss standpoint. Increases in complexity of ICs are being accompanied by an increasing difficulty to test ICs. New test techniques must be developed to offset increasing IC test cost, otherwise advancements in IC technology may be slowed. One emerging technology that is going to accelerate the complexity of ICs even more is intellectual property cores. These cores will provide highly complex pre-designed circuit functions such as; DSPs, CPUs, I/O peripherals, memories, and mixed signal A/D and D/A functions. These cores will exist in a library and can be selected and placed in an IC to quickly provide a complex circuit function. The low cost testing of ICs containing highly complex core functions will be challenging.

SUMMARY OF THE INVENTION

The way to improve test access to cores embedded within ICs is by providing an addressable test port for each core. The addressable test ports provide the capability of directly addressing a core to be tested and, once addressed, cost effectively testing the core. The addressable test port is scalable, allowing it to increase or decrease its test capabilities, depending upon the type of circuitry contained in the core to be tested.

In particular, this invention provides an integrated circuit comprising functional input and output signal leads, input and output circuits connected to the functional input and output signal leads, core circuitry, and interconnect wires and circuits connecting the input and output circuits and the core circuitry. The integrated circuit further includes an addressable test port for each core circuitry. Each test port is connected to its respective core circuitry and to the interconnect wires and circuits. External test signal leads are connected to each test port.

The test ports are connected to their respective core circuitry by mode, input, output, and control signals. The test ports are connected to the interconnect wires and circuits by an input bus and an input/output bus, and the external test signal leads include a serial input, a serial output and a control bus.

Each test port includes an address register, a test controller, an input port, and an input/output port. The address register connects in series to a serial input lead and a serial output lead. The test controller connects to control bus leads and a mode signal lead connected to the core circuitry. The input port is connected to input bus leads, which are connected to the interconnect wires and circuits, and is connected to input leads that connect to the core circuitry. The input/output port is connected to input/output bus leads, which are connected to the interconnect wires and circuits, and is connected to output leads connected to the core circuitry and a status lead connected to the core circuitry.

The control bus leads include leads for analog inputs/outputs, a test status output, a test protocol input, a test clock input, and a reset input.

The test controller includes a test port state machine and plural test operation state machines connected to leads for a test protocol input and a test clock input and the test port state machine connects to a reset input.

The input port includes a comparator circuit, an input register circuit, a mode and address register circuit, an update register circuit and a decode logic circuit interconnected with one another.

The input/output port includes read enable sequencer circuitry, input buffer circuitry, multiplexer circuitry and input/output buffer circuitry.

DESCRIPTION OF THE SEVERAL VIEWS OF THE DRAWINGS

FIGS. 6A, 6B, 6C, and 6D are state diagrams of state machine 510.

FIG. 13A is a block diagram of an integrated circuit including a digital to analog circuit in an intellectual property core and a test port, and FIGS. 13B and 13C are state diagrams describing testing procedures for the digital to analog circuit.

FIG. 15A is a block diagram of an integrated circuit including an analog to digital circuit in an intellectual property core and a test port, and FIGS. 15B, 15C and 15D are state diagrams describing testing procedures for the analog to digital circuit.

DESCRIPTION OF THE INVENTION

Figure 1:
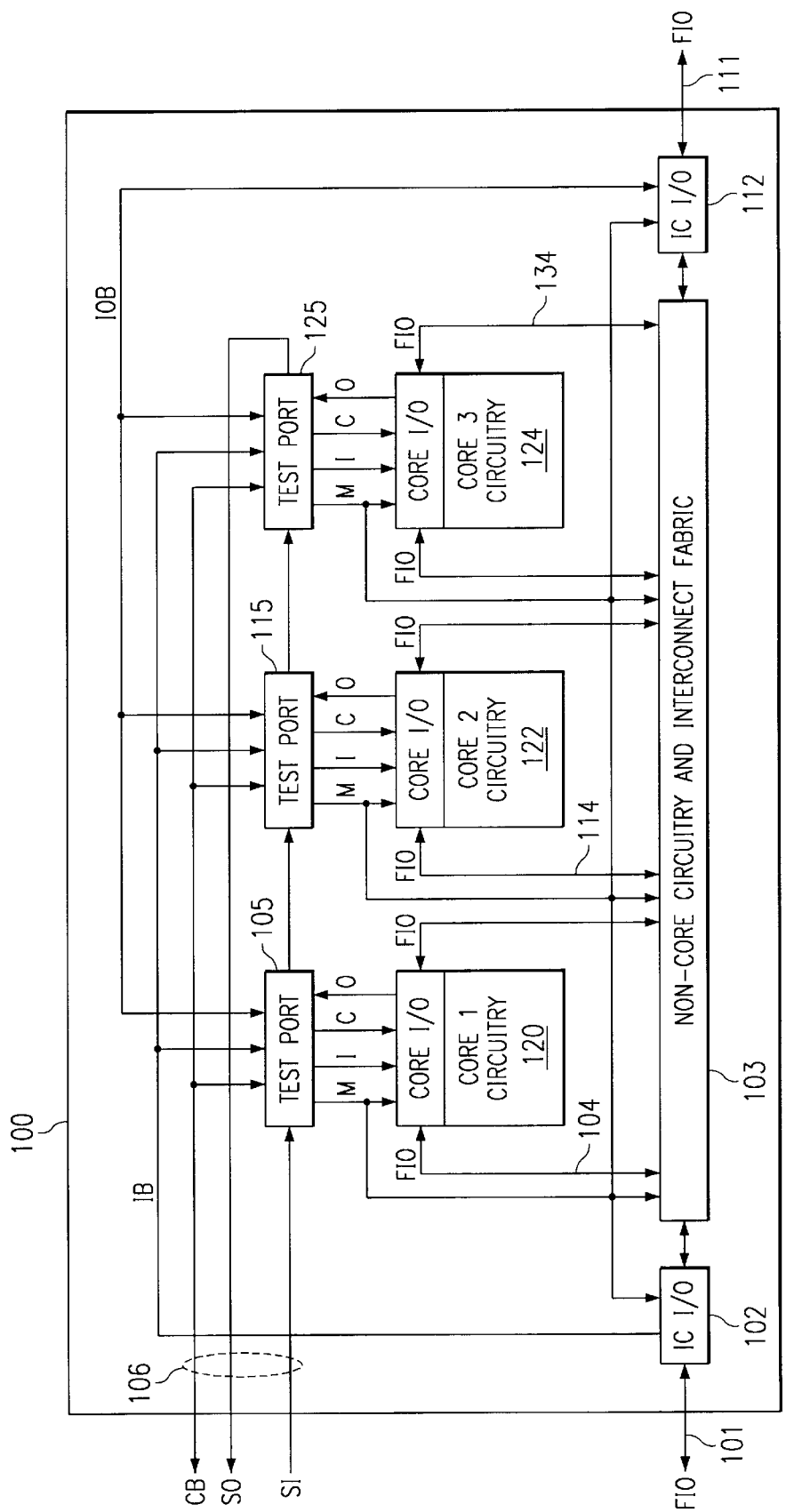
FIG. 1 is a block diagram of an integrated circuit including intellectual property cores and test ports of the invention

In FIG. 1, integrated circuit (IC) 100 includes the inventions to be described. The IC of FIG. 1, without the invention, comprises; (1) externally accessible functional input and output (FIO) signals 101, 111; (2) IC I/O circuitry 102,112 connected to the FIO 101, 111; (3) an interconnect fabric 103 consisting of wires and non-core circuitry connected to IC I/O 102, 112; and (4) cores 1–3 120, 122, and 124. Each core contains core circuitry and core I/O and each core I/O is connected to the interconnect fabric 103 via internal FIO signals 104, 114 and 134. The cores could be any type of pre-designed circuit such as digital signal processors, microcontrollers, microprocessors, memories, mixed signal circuits, or I/O peripherals such as IEEE 1394 serial interface circuits. The fabric 103 connects the cores together either through direct wiring or through interface circuitry such that the cores may communicate between themselves via FIO 104, 114 and 134 and external of the IC via FIO 101 and 111 to provide the intended functionality of the IC.

The invention portion of the IC of FIG. 1 comprises addressable test ports 105, 115 and 125 and their connection to cores, fabric, IC I/O, and external test signals 106. A test port 105, 115, 125 is provided for each core 1–3, 120, 122, 124. The test ports are connected to their respective cores via mode (M), input (I), control (C), and output (O) test signaling interfaces. The test ports are also connected to the fabric 103 via an input bus (IB), input/output bus (IOB), and the mode interface (M). Further, the test ports are connected to serial input (SI), serial output (SO), and control bus (CB) signals 106 which are accessible external of the IC.

The test ports are located close to their respective cores to allow the M, I, C, and O wiring interfaces to be localized. In some instances, the test ports may be designed as part of the cores, such that the test ports and cores form a completely predesigned unit. The CB, IB and IOB are routed globally through the IC and connected to each test port. The test ports are serially connected via the SI and SO connections, such that data can be shifted into the external SI of the IC, through each test port, and out of the IC from the external SO. The shift operation is controlled by the external CB inputs. The shift operation is used to load a unique address into each test port. After addresses are loaded into the test ports, each test port can be individually addressed and enabled by parallel address input from IB. Once addressed, a test port is enabled for external parallel communication via the IB and IOB buses. The CB provides control to the test ports for serial communication via SI and SO, and for parallel communication via IB and IOB, as will be described later.

IC I/O 102,112 Description

Figure 2A:
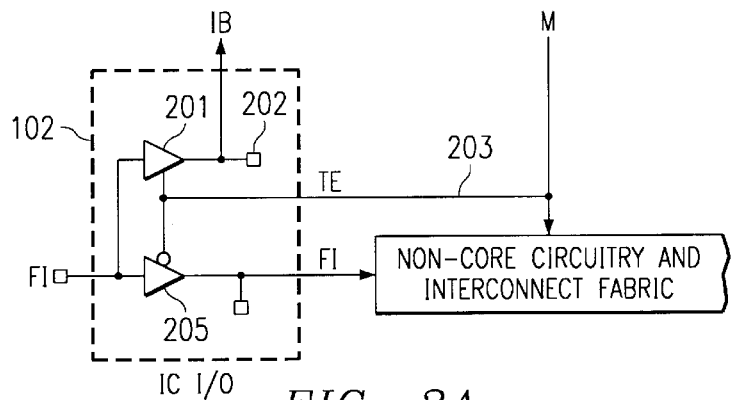
FIGS. 2A, 2B, 2C, and 2D are block diagrams of variations of the IC I/O circuits.

FIGS. 2A–D illustrate some examples of how IC I/O 102 is modified to provide external input and output for the IB and IOB bussing paths routed to the test ports of FIG. 1. IC I/O 112 can be like IC I/O 102. FIG. 2A shows how a test input buffer 201 could be added to a functional input (FI) buffer 205 to provide a test input to the IB bus. A test enable (TE) signal 203, to be described later, from the mode (M) interface is used to enable the test input buffer during test mode or the functional input buffer during functional mode. Also, bus holder circuits 202 are added to maintain the last driven logic state when the buffers are disabled.

Figure 2B:
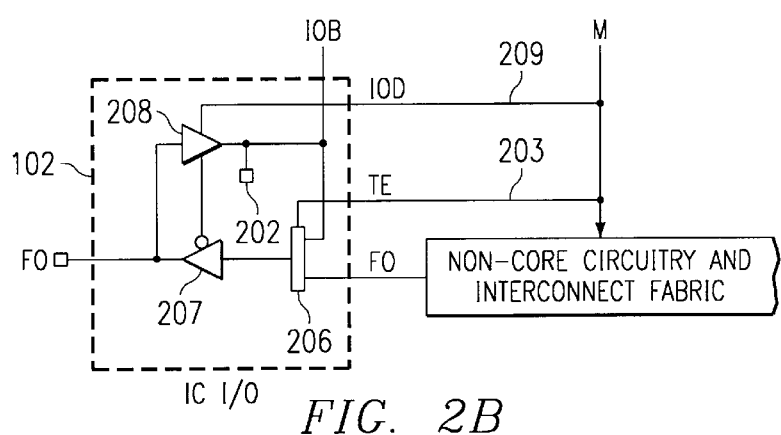
Figure 2C:
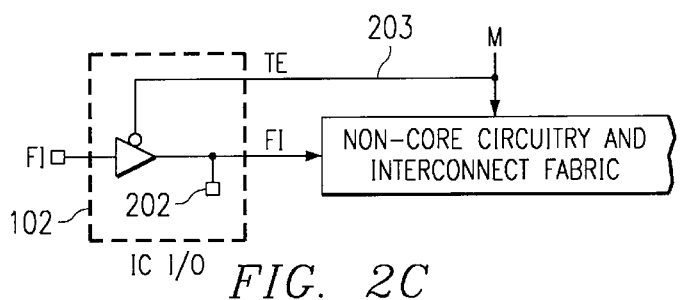
Figure 2D:
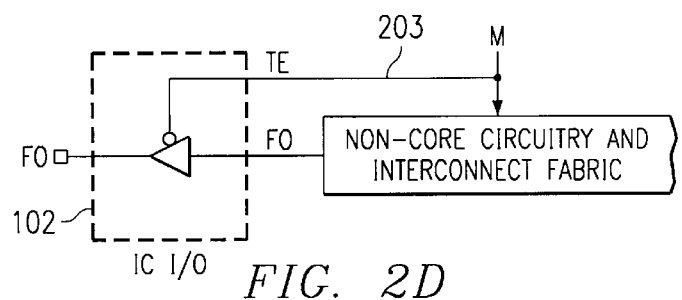

FIG. 2B shows how a multiplexer 206, input buffer 208, and bus holder 202 are added to a functional output buffer 207 to provide test input and output for the IOB. TE 203 controls multiplexer 206 to output test or functional data to the OF pad via buffer 207, while an input/output direction (IOD) signal 209 from the mode (M) interface controls whether IOB inputs data from the OF pad or outputs test data to the OF pad. FIGS. 2C and 2D illustrate some examples of how an IC's functional inputs and outputs, that are not associated with IB and IOB, may optionally be disabled during test mode using the TE signal.

Figure 3:
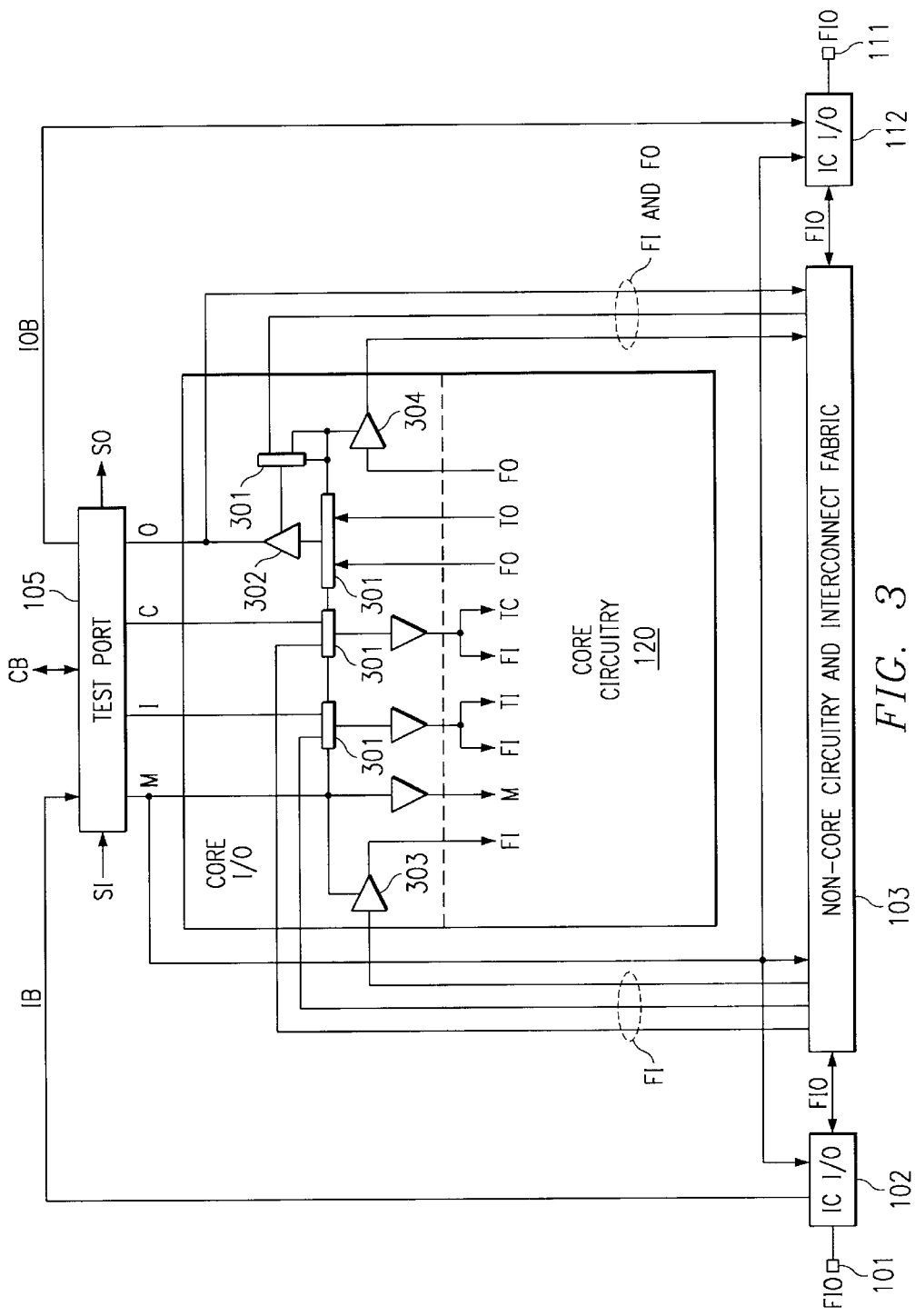
FIG. 3 is a detailed block diagram of a test port connection to a core and other circuits.

In FIG. 3, test port 105 is connected to the core 120 and to the IC I/O and fabric 103. Test ports 105, 115 and 125 are alike. The IC I/Os 102, 112 connected to IB and IOB are assumed modified as shown in the FIG. 2A and 2B examples. During test mode, a portion of the IC I/O's are used to provide input bussing of IB signals to the test ports and input/output bussing of IOB signals to and from the test ports. During functional mode, all the IC I/Os are connected to the fabric 103 to provide functional IC input and output signals.

Functional inputs (FI) from the fabric 103 are input to the core 120 I/O, and functional outputs (OF) from the core 120 I/O are input to the fabric 103. Test mode (M), test input (I), and test control (C) signals from the test port are input to the core I/O, while test output (O) signals from the core I/O are input to the test port. During functional operation, multiplexers 301 within the core I/O, which are added for testing, route FIs from the fabric to core circuitry and route FOs from the core circuitry to the fabric.

During test operation, the multiplexers 301 route: (1) inputs (I) from the test port for use as core test data inputs (TI), (2) control (C) from the test port for use as core test control inputs (TC), and (3) outputs (O) to the test port for use as core test data outputs (TO). Multiplexers can also be added and used to control 3-state output buffers during test, as seen in regard to output buffer 302. While in this example, multiplexers are shown for routing functional and test signals, other types of switching circuits could be used as well. The TI's and TO's are connected to the core's circuitry when the circuitry is configured into a test mode, as will be shown later in FIGS. 9 and 10. The mode (M) input from the test port controls the multiplexers for functional or test routing and configures the core circuitry for functional or test mode. Input buffers 303 and output buffers 304, which are not used for testing, may be disabled during test by mode (M) input as shown in FIG. 3.

Test Port 105 Architecture Description

Figure 4A:
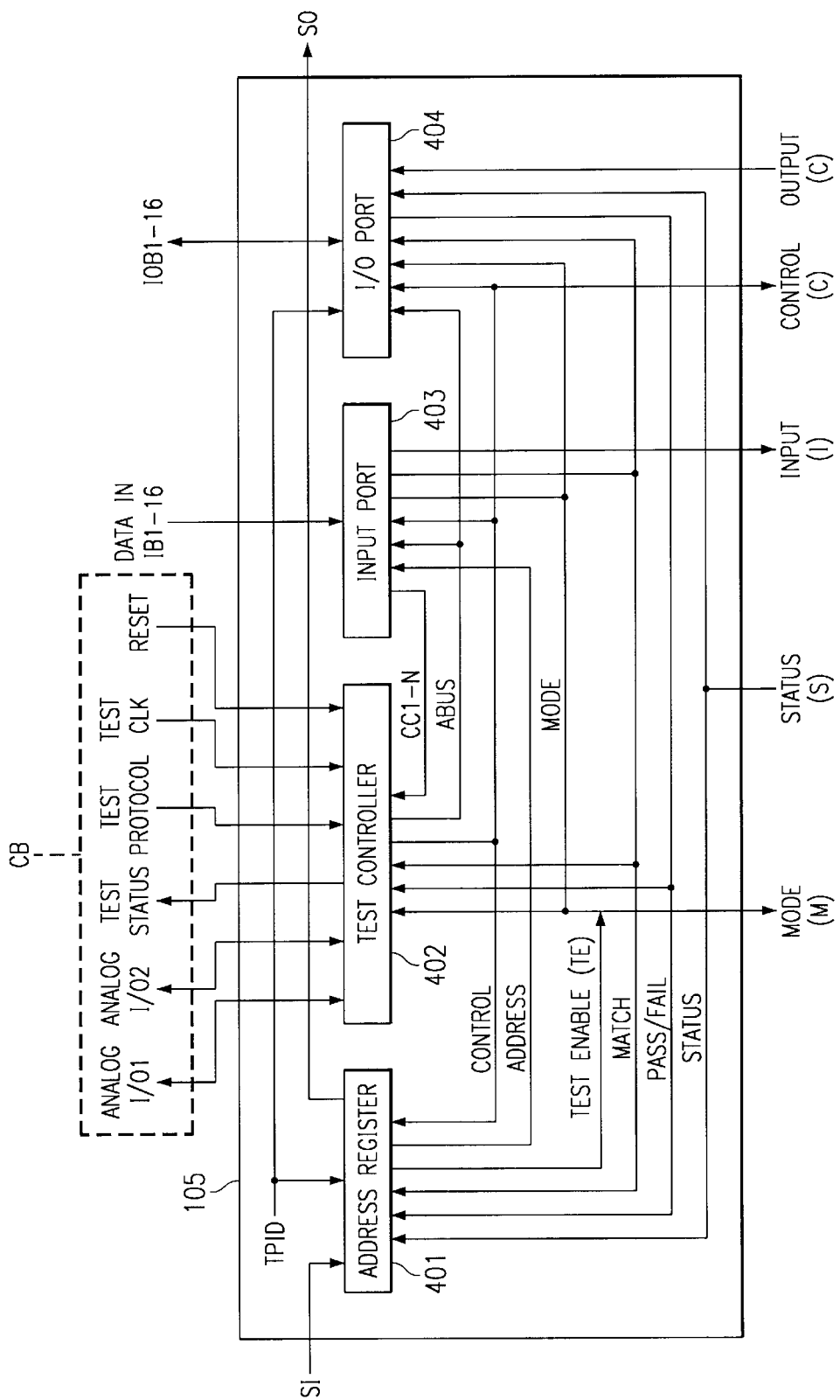
FIG. 4A is a detailed block diagram of a test port circuit.

In FIG. 4A, test port 105 comprises address register 401, test controller 402, input port 403, and input/output (I/O) port 404. Test controller 402 is connected to the external control bus (CB) which consists of: analog input/outputs 1 and 2 (AIO1, AIO2), a test status output (TSO), a test protocol input (TPI), a test clock input (TCI), and a reset input (RST). Test controller 402 regulates test port operations by outputting control (C) signals to the address register, input port, I/O port, and connected core.

Input port 403 receives control (C) signals from the test controller, data input from IB, and an address input from the address register. The input port supplies: (1) a match signal to the address register, test controller, and I/O port, (2) count complete signals (CC1–N) to the test controller, (3) mode (M) signals to the test controller, I/O port, and connected core, and (3) inputs (I) to the connected core I/O. Input port 403 is connectable to AIO1 and AIO2 via the analog bus (ABUS) connection to test controller 402.

I/O port 404 receives data from IOB, test port identification inputs (TPID), control (C) inputs from the test controller, mode (M) and match signals from the input port, outputs (O) from the connected core I/O, and status (S) inputs from the either the connected core I/O or other circuitry within the IC. The I/O port supplies data to IOB and a pass/fail signal to the address register. I/O port 404 is connectable to AIO1 and AIO2 via the analog bus (ABUS) connection to test controller 402.

Address register 401 receives serial input (SI), TPID inputs, status inputs (S), the pass/fail signal from the I/O port, match signal from the input port, and control (C) input from the test controller. The address register supplies serial output (SO), address output to the input port, and a test enable (TE) signal to be combined into the mode (M) interface outputs from test port 105.

In the example of FIG. 4A, the bus width of IB and IOB is shown being 16-bits (IB-16 and IOB1–16). However, the IB and IOB buses could be set to any desired or available width. In general, according to the present invention, the wider the bus width of IB and IOB the more effective the invention is at reducing the time to setup and execute tests on embedded cores.

Figure 4B:
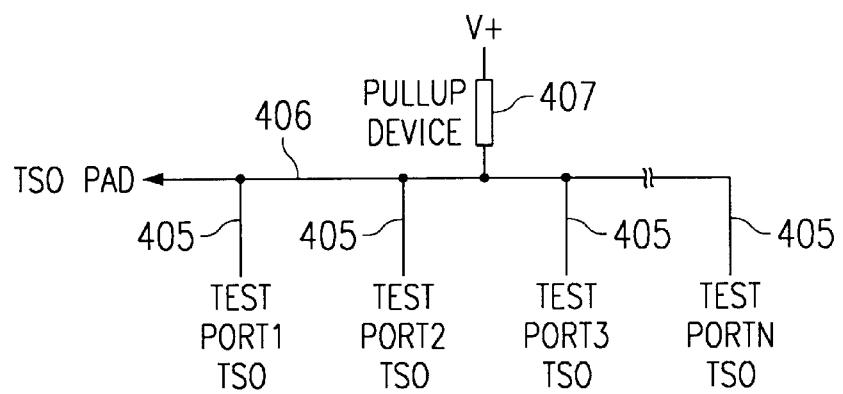
FIGS. 4B, 4C, and 4D are preferred embodiments of circuits extending from the test port.
Figure 4C:
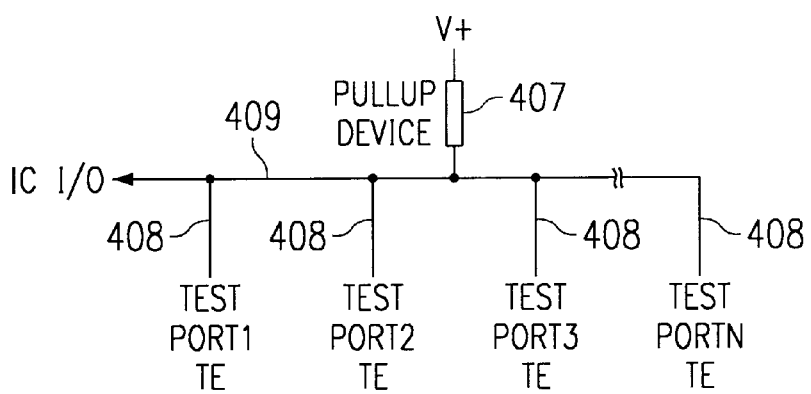
Figure 4D:
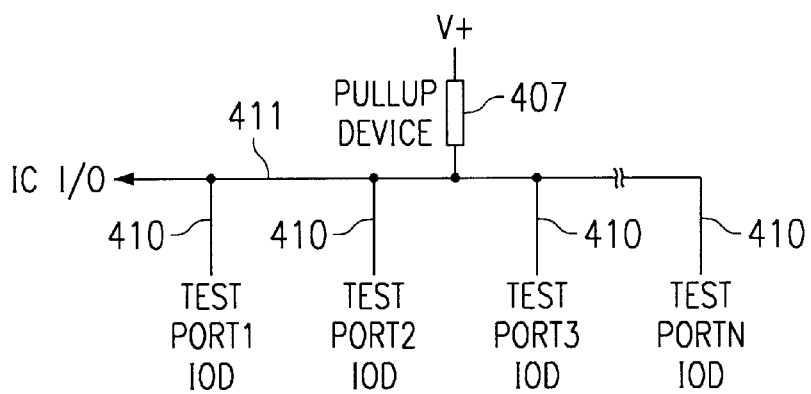

FIGS. 4B, 4C, and 4D illustrate a preferred bussing arrangement for the TSO 405, TE 408, and IOD 410 signal outputs from test ports 1–N. Each test port TSO 405 signal is connected to a globally routed bussing wire 406 which is connected to the TSO pad of the external CB and to one or more pullup devices 407 within the IC. Each test port TE 405 signal is connected to a globally routed bussing wire 409 which is connected to the IC I/O (see FIGS. 2A–D) and to one or more pullup devices 407 within the IC. Each test port IOD 410 signal is connected to a globally routed bussing wire 411 which is connected to the IC I/O (see FIG. 2B) and to one or more pullup devices 407 within the IC. The bussing arrangements of FIG. 4B, 4C, and 4D allow any one or more of the test port outputs (TSO, TE, IOD) to pull the globally routed bussing wire (406, 409, 411) low. If none of the test port outputs (TSO, TE, IOD) pull the globally routed bussing wire (406, 409, 411) low, it will be pulled high by pull up device 407. Manipulation of a single globally routed bussing wire (406, 409, 411) by multiple localized test port output signals (TSO, TE, IOD) reduces test wire routing within the IC.

Test Port 105 Operation Description

Figures 5A, 5B:
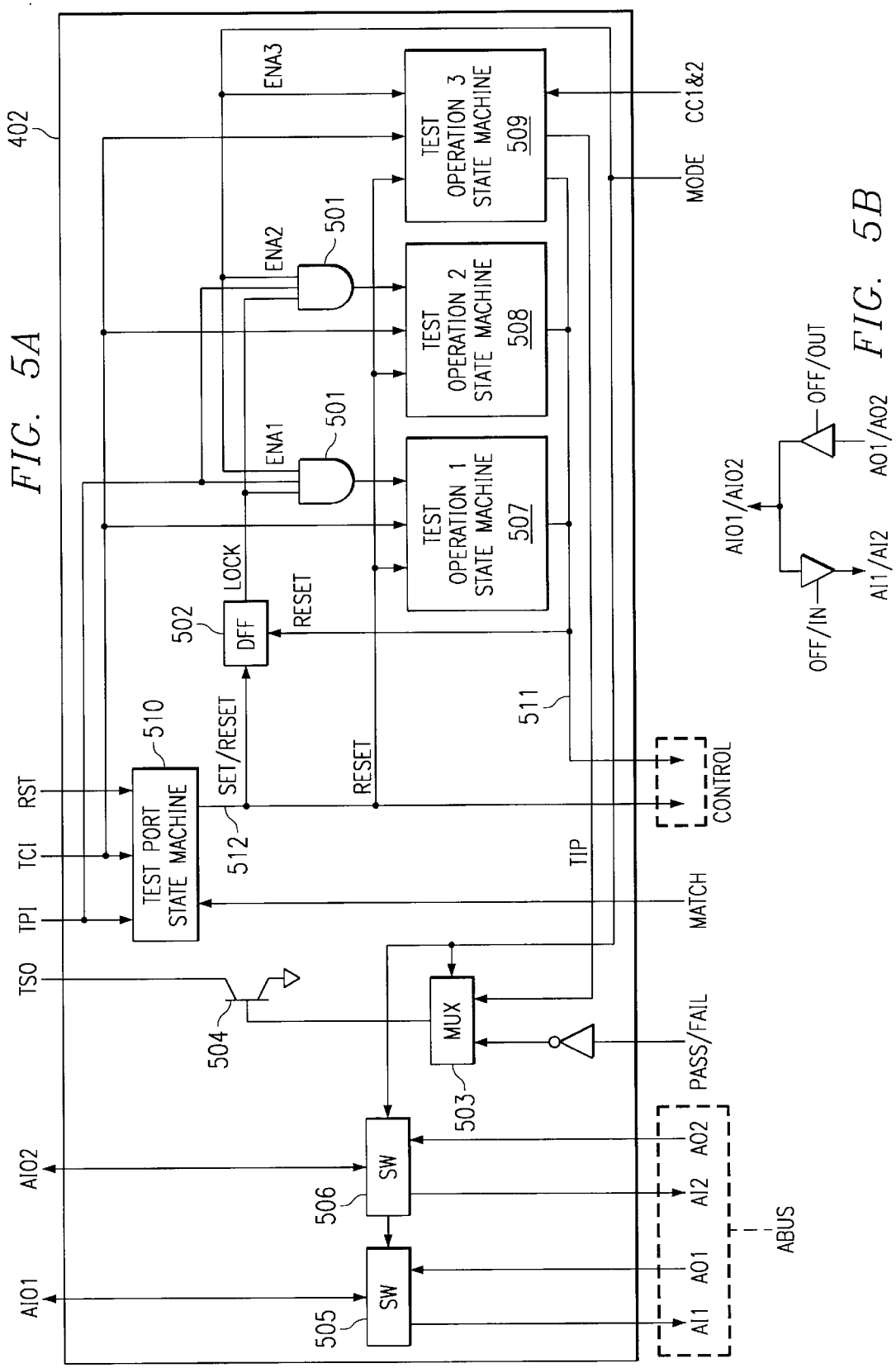
FIG. 5A is a detailed block diagram of a test controller of the test port.
FIG. 5B is an example implementation of a switch used in the test controller.

FIGS. 4A–D, 5A–B, 6A–D, 7A–E and 8A–E, describe the operation of the test ports 105, 115, 125. In FIG. 5A, test controller 402 comprises a test port state machine 510 and multiple test operation state machines 507, 508, 509. Switch 505 couples AIO1 to analog input 1 (AI1) or analog output 1 (AO1) of ABUS. Switch 506 couples AIO2 to analog input 2 (AI2) or analog output 2 (AO2) of ABUS. Multiplexer 503 couples TSO to the pass/fail signal from I/O port 404 or to a test in progress (TIP) output from test operation state machine 509. Switches 505 and 506 facilitate testing of mixed signal cores that require external input and/or output of analog signals. In FIG. 5B, an example implementation of switch 505 and 506 and mode (M) input is used to: (1) connect AI (1 or 2) to AIO (1 or 2) for externally inputting an analog signal during an analog test operation, (2) connect AO (1 or 2) to AIO (1 or 2) for externally outputting an analog signal during an analog test operation, and (3) isolating AI and AO (1 or 2) from AIO (1 or 2) when analog testing is not being performed. Multiplexer 503 enables external output of test status signals such as the pass/fail signal and the TIP signal. When multiplexer 503 outputs a low, transistor 504 is off and the external TSO bus is pulled high (see FIG. 4B). When multiplexer 503 outputs a high, transistor 504 is on and the external TSO bus is pulled low (see FIG. 4B). The reason for outputting test status signals on TSO will be described later.

Test port state machine 510 receives the TPI, TCI, and RST inputs of the CB and the match input from the I/O port 404. The test port state machine 510 outputs control (C) to the address register, input port, and I/O port, set and reset control to DFF 502 which is used to enable or disable the interface to the test operation state machines, and reset control to the test operation state machines.

Test operation state machines 507, 508, 509 receive the reset input from the test port state machine and the TCI input. Test operation state machines 507 and 508 also receive a gated version of the TPI input. The test operation state machines output control signals 511 which are combined with the output control signals 512 from the test port state machine to be output from the test port as one control (C) bus. The control output 511 from the test operation state machines is used to control test operations such as: (1) control input port 403 to transfer data between IB and I, (2) control I/O port 404 to transfer data between IOB and O, (3) and control the connected core to input I data from input port 403 and output O data to I/O port 404.

Test Port State Machines Description

Test port state machine 510 is the main state machine of the test port and regulates the scanning of data through the address register, inputting data to the input port from IB for test port addressing and for selecting a test operation state machine. The test port state machine 510 also analyzes the match signal from the input port to detect whether the test port has been addressed following an address input from IB. The test operation state machines are targeted at providing specific control for a particular type of test being performed on circuits within the connected core. The test operation state machines are modular in design such that any number can be interfaced to and controlled by the test port state machine to provide the test port with an expandable range of test control capability.

Two types of test operation state machines are shown in FIG. 5A, TPI controlled state machines 507 and 508, and autonomous state machine 509. Test operation state machines 507 and 508 are a type that is controlled by TPI input. Test operation state machine 509 is a type that is self controlling. The interface to test operation state machines 507 and 508 consists of TCI, Reset, and the output from And gates 501. The And gates input the lock output from DFF 502, the TPI input, and enable (ENA1–2) inputs from the mode (M) input from input port 403. Test operation state machine 507 or 508 is enabled to respond to TPI when the lock and enable input to the And gate are high, and disabled from responding to TPI when either the lock or enable is low. Enable inputs ENA1 and 2 select which one of the test operation state machines, 507 or 508, is enabled to respond to TPI when the lock signal is set high by test port state machine 510.

The interface to test operation state machine 509 consists of the enable 3 (ENA3) input. Test operation state machine 509 is enabled to operate when the ENA3 input is high. Once enabled it operates independent of TPI. During operation, test operation state machine 509 outputs a test in progress (TIP) status signal to multiplexer 503 to be externally output on TSO. An IC or wafer tester can monitor the TSO output to determine when the test operation begins (TSO goes low) and ends (TSO goes high). While three test operation state machines are shown, the test port can contain any number of the two types of test operation state machines. If multiple autonomous test operations state machines 509 are used, the TIP signals from each can be bussed onto a single wire to multiplexer 503, as shown in the example of FIG. 4B.

Test Port State Diagram Description

The state diagram of FIG. 6A illustrates the operation of test port state machine 510 in response to TPI input. It should be understood that the state diagrams included in this specification are provided as an aid to teaching the operation of the test controller and not as an exacting definition for implementing the test controller.

However, in general, the state diagrams accurately reflect one preferred embodiment of implementing the test controller of the present invention.

Test port state machine 510 is timed by TCI. When the IC powers up or when RST (FIG. 4A) is low, the test port state machine is initialized to the Reset Port state.

During initialization, test port state machine 510 outputs control 512, FIG. 5A, to reset DFF 502, address register 401, input port 403, I/O port 404, and the test operation state machines. Following initialization, the address register contains an address of all zeros. Also following initialization, the TE output from address register 401 and the mode output from input port 403 are set to enable functional operation of the IC and connected core.

Test port state machine 510 goes to or remains in the Reset Port state while RST is low, independent of the TPI input. When RST is taken high, the test port state machine is enabled to respond to TPI. The test port state machine remains in the Reset Port state while TPI is high, and transitions to the Enable Port state when TPI is low. The test port state machine remains in the Enable Port state while TPI is low, and transitions to the Scan Address Register state when TPI is high, to scan data through address register 401 from SI to SO.

The Scan Address State comprises three states, Capture, Shift, and Update, as indicated in FIG. 6B. The Capture state is used to capture status, pass/fail, match, and TPID data into the address register. The Shift state is used to shift out the captured data from the address register and shift in address and TE data to the address register. The TPID data shifted out primarily identifies the test port. However, the TPID data may contain additional information such as: the type of connected intellectual property (IP) core (DSP, CPU, I/O peripheral, memory, etc), the provider of the connected IP core (i.e. the company providing the IP), and IP core version. The pass/fail data shifted out indicates, as will be seen later, whether the core passed or failed a test. The status data shifted out indicates status conditions within the IC that may be useful to examine during test or functional IC modes. The match signal shifted out is used to test that the addressing circuitry of the test port is working correctly.

The Update state is used to output the new address and TE data from the address register. Updating TE to a first logic state (low in this example) forces the IC and connected core into a functional mode. Updating TE to a second logic state (high in this example) forces the IC and connected core into a test mode. From the Update state, the test port state machine can transition to the Exit Test Mode state to enter the Reset Port or Enable Port states, or it can transition to the Idle 1 state. The Idle 1 state is assumed to be the next state.

The test port remains in the Idle 1 state while TPI is low. Being able to remain in the Idle 1 state for several TCI clock inputs provides time for the IC and connected core to change from functional mode to test mode when the TE output from the address register is set high in the Update state. For example, in FIGS. 2A–D it is seen that the TE input going high configures the IC I/O from inputting and outputting functional data to the fabric to inputting and outputting test data to the test port via IB and IOB. Being able to stay in the Idle 1 state for a number of TCI clocks allows time for the IC I/O to respond to the TE input and transition from functional to test I/O mode. Also remaining in the Idle 1 state for multiple TCI clocks provides time for the IC or wafer probe tester to prepare for inputting data on IB from predetermined IC pads and inputting and outputting data on IOB from predetermined IC pads. From the Idle 1 state, the test port state machine can transition to the Input Port Address state.

In the Input Port Address state, test port state machine 510 outputs control to input port 403 to cause the input port to store data present on IB, which is input via the ICs I/O as previously described in regard to FIGS. 2A. The data stored is an externally input address from an IC or wafer probe tester contacting the IC I/O at predetermined pads. With an 16-bit wide IB, one data input from IB provides addressing of up to $2^{16}-1$ test ports, assuming the previously mentioned all zeros (initialization) address is not used for test port addressing. From the Input Port Address state, the test port state machine can transition to the Scan Address Register state to re-scan the address register or to the Port Address Match state. The Port Address Match state is assumed to be the next state.

In the Port Address Match state, the address from IB stored in input port 403 is compared with the address scanned into the address register. An address match signal is output from the input port to the test port state machine. The test port state machine evaluates the state of the match signal. If the match signal indicates a match between the address input from the IB and the address scanned into the address register, the test port has been addressed and the test port state machine transitions to the Idle 2 state, if TPI is low. If the match signal does not indicate a match, the test port has not been addressed and the test port state machine transitions to the Address Lock state, if TPI is low, where it remains until a particular sequence occurs on TPI allowing the test port state machine to escape the Address Lock state. If TPI is high, the match signal is ignored and the test port state machine transitions to the Exit Test Mode state from the Port Address Match state. The Idle 2 state is assumed to be the next state.

The test port state machine can remain in the Idle 2 state or transition to the Input Test Mode state. In the Input Test Mode state, the test port state machine outputs control to input port 403 to cause the input port to input and store data from the IB bus. The Input Test Mode state is maintained while TPI is low to allow inputting a number of data (i.e. mode and counter data to be described later in regard to FIG. 7A) to the input port. From the Input Test Mode state the test port state machine transitions to the Update Test Mode state.

In the Update Test Mode state, the mode data is output from the input port to configure I/O port 404 for testing, configure the IC and connected core for testing, and to enable a particular one of the test operation state machines 507, 508, 509 as described in regard to FIG. 5A. If TPI is high, the test port state machine transitions from the Update Test Mode state to the Test Lock state. This transition sets the lock output of DFF 502 high (FIG. 5A) to unlock an enabled TPI controlled test operation state machine. An unlocked and enabled TPI controlled state machine can respond to TPI input via And gate 501 to execute test operations. If TPI is low, the test port state machine transitions from the Update Test Mode state to the Test Lock state, but does not set the lock output of DFF 502 high.

This transition enables autonomous test operation state machines, but not TPI controlled test operation state machines since the lock output of DFF 502 remains low.

TPI Controlled Test Operation State Machines 507 & 508 Description

TPI controlled test operation state machines 507 & 508 of FIG. 5A are preferably separate state machines from the test port state machine. This simplifies the addition of multiple TPI controlled test operation state machines to the test port, since it does not impact the design of the test port state machine. The Address Lock and Test Lock states are important in simplifying the addition of multiple TPI controlled test operation state machines to the test port state machine. The Address Lock state provides a state where a non-addressed test port state machine goes to and remains until an unlock sequence on TPI is received. The Test Lock state provides a state where an addressed test port state machine goes to and remains until an unlock sequence on TPI is received.

While an addressed test port state machine is in the Test Lock state, the enabled TPI controlled test operation state machine is unlocked to perform a test operation. When a TPI controlled test operation state machine has completed its test control operation, it also contains a lock state where it goes to and remains until an unlock sequence on TPI is received. When the unlock TPI sequence is received, the enabled TPI controlled test operation state machine outputs a reset signal to DFF 502 to set the lock signal low. Also, when the unlock TPI sequence is received, an addressed test port state machine is allowed to transition from the Test Lock state to either the Idle 1, Idle 2, or Scan Address Register state. Further, when the unlock TPI sequence is received, a non-addressed test port state machine is allowed to either remain in the Address Lock state, transition to the Idle 1 state, or transition to the Scan Address Register state. A TPI sequence that causes a transition from the Test Lock state to the Idle 2 state will cause the Address Lock state to be maintained. A TPI sequence that causes a transition from the Test Lock state to the Idle 1 state will also cause a transition from the Address Lock state to the Idle 1 state. A TPI sequence that causes a transition from the Test Lock state to the Scan Address Register state will also cause a transition from the Address Lock state to the Scan Address Register state.

The TPI unlock sequence must be considered in the TPI state transition assignment in designing TPI controlled test operation state machines 507 & 508, as will be described in regard to FIGS. 9–16. Using the above described lock and unlock mechanisms in combination with the selective enablement of a particular TPI controlled test operation state machine, a plug-n-play like interface is provided between the test port state machine and any number of user defined and added TPI controlled test operation state machines.

Figure 6C:
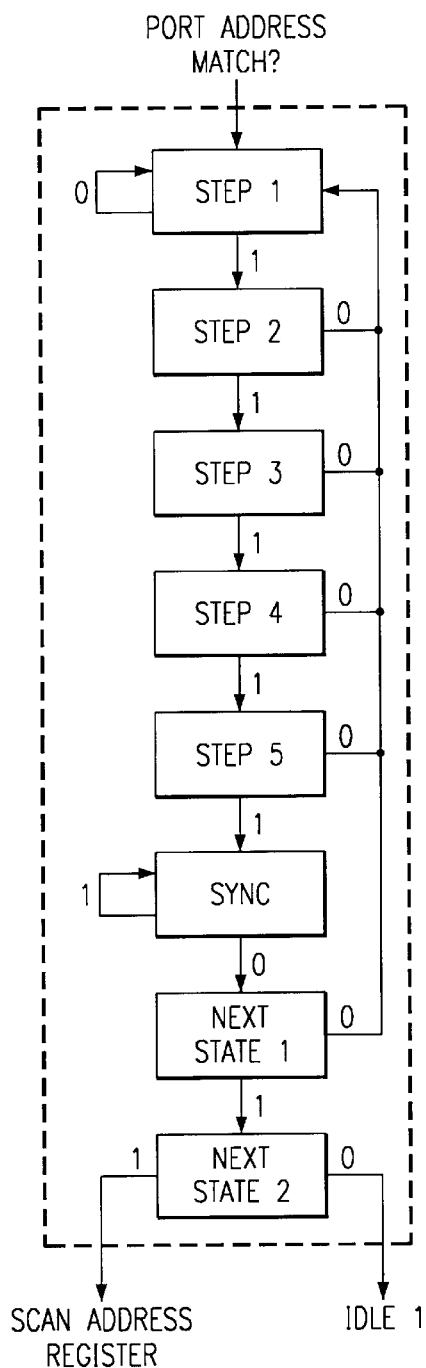

FIG. 6C shows the test port state machine's Address Lock state in more detail. The Address Lock state consists of Step 1–5 states, a Sync state, a Next State 1 state, and a Next State 2 state. Entry into the Address Lock state occurs by entering the Step 1 state. If five consecutive TPI highs occur after entering the Step 1 state, the Sync state will be entered from the Step 5 state. However, if a TPI low occurs prior to receiving five consecutive TPI highs, the Step 1 state will be re-entered. Thus the unlock sequence for escaping the Address Lock state is a sequence of five consecutive TPI highs. While five consecutive TPI highs are used in this example, lesser or greater numbers of TPI highs may be used as well. Also, while TPI highs were chosen in this example, other TPI logic level sequences may be used to provide an escape sequence from the lock states.

When defining an escape TPI sequence, it is important to choose a sequence that is not used by any TPI controlled test operation state machine the when the TPI controlled test operation state machine is performing a test operation. Once the Sync state is entered, it will be maintained as long as TPI highs are received. The term Sync state is descriptive of the state's purpose in that it allows synchronizing the test port state machine and TPI controlled test operation state machines to a common state at the end of a test operation. When a TPI low is received a transition from the Sync state to the Next State 1 occurs. From Next State 1, a TPI low will cause a transition to Step 1 state, whereas a TPI high will cause a transition to Next State 2. From Next State 2, a TPI low will cause a transition to Idle 1, whereas a TPI high will cause a transition to Scan Address Register.

Figure 6D:
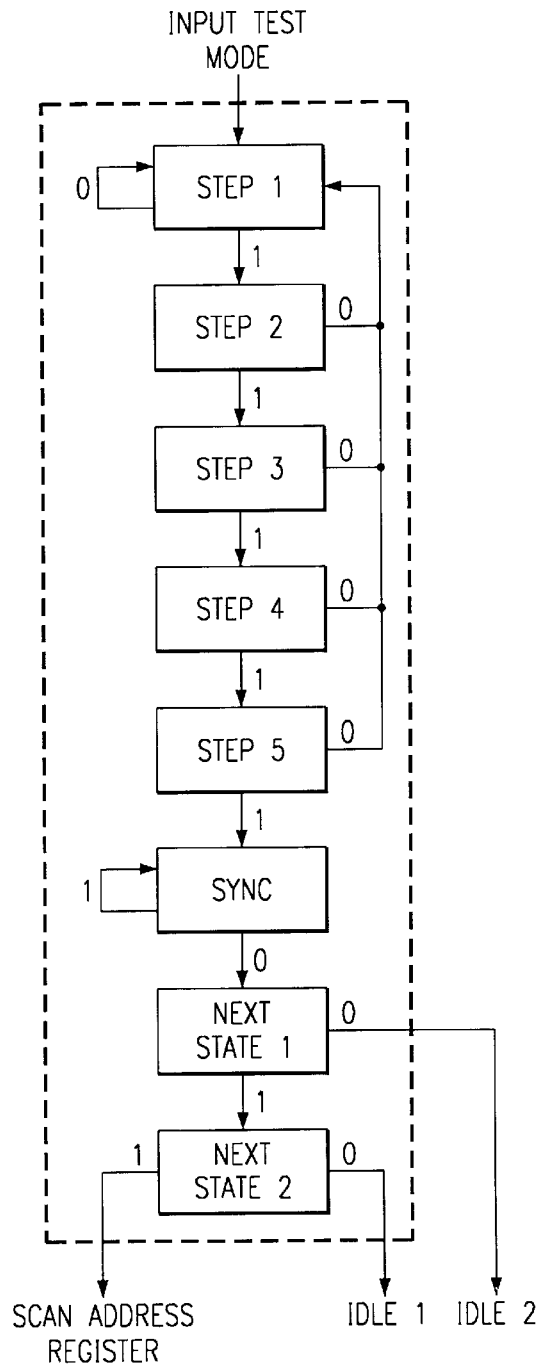

FIG. 6D shows the test port state machine's Test Lock state in more detail. The Test Lock state diagram is identical to the Address Lock state diagram except that the Test Lock state transitions from the Next State 1 state to the Idle 2 state instead of to the Step 1 state. Transitioning to the Idle 2 state allows the addressed test port state machine to re-enter the Input Test Mode state to select another test operation state machine to be unlocked and enabled. All non-addressed test ports remain in the Address Lock state.

In both the Address Lock and Test Lock states, transitioning from the Sync state to Next State 2, via Next State 1, allows transitioning to either the Idle 1 or Scan Address Register states. Transitioning to Idle 1 allows addressing a new test port and performing the above described steps to allow a test operation state machine within the newly addressed test port to be enabled to perform a test operation on the core connected to the newly addressed test port. Transitioning to Scan Address Register state allows capturing and shifting the address registers of all test ports to load new data and to extract information from each test port, in particular pass/fail and status information. Also, transitioning to the Scan Address Register state is used to terminate testing and return the IC to functional mode by transitioning into the Reset State via the Exit Test Mode state.

Autonomous Test Operation State Machine 509 Description

Autonomous test operation state machine 509 is different from the TPI controlled state machines 507 & 508 described above in that it is enabled for operation directly by the enable input from the mode (M) input (see FIG. 5A). When the test port state machine enters the Input Test Mode state, mode or mode and counter data is input to input port 403 from IB. When mode data is output from input port 403 during the Update Test Mode state, the enable input to an autonomous state machine 509 goes high. In response to high enable, the autonomous test operation state machine 509 starts, executes, and stops its test operation independent of TPI.

An important difference between TPI controlled and autonomous test operation state machines is that autonomous test operation state machines do not require the test port state machine to remain in the Test Lock state while an autonomous test operation state machine executes. For example, a first test port can be addressed to enable one of its autonomous test operation state machines. While the autonomous test operation state machine executes, a second test port can be addressed, by entry into Input Port Address state via the Test Lock and Idle 1 states, to enable one of its autonomous test operation state machines. Addressing of subsequent test ports allows enabling additional autonomous test operation state machines. This is possible because the TPI input is not required to control the execution of autonomous test operation state machine. Therefore the TPI input can be used to address additional test ports to enable additional test operation state machines, allowing multiple cores to be tested in parallel.

Input Port 403 Description

Figure 7A:
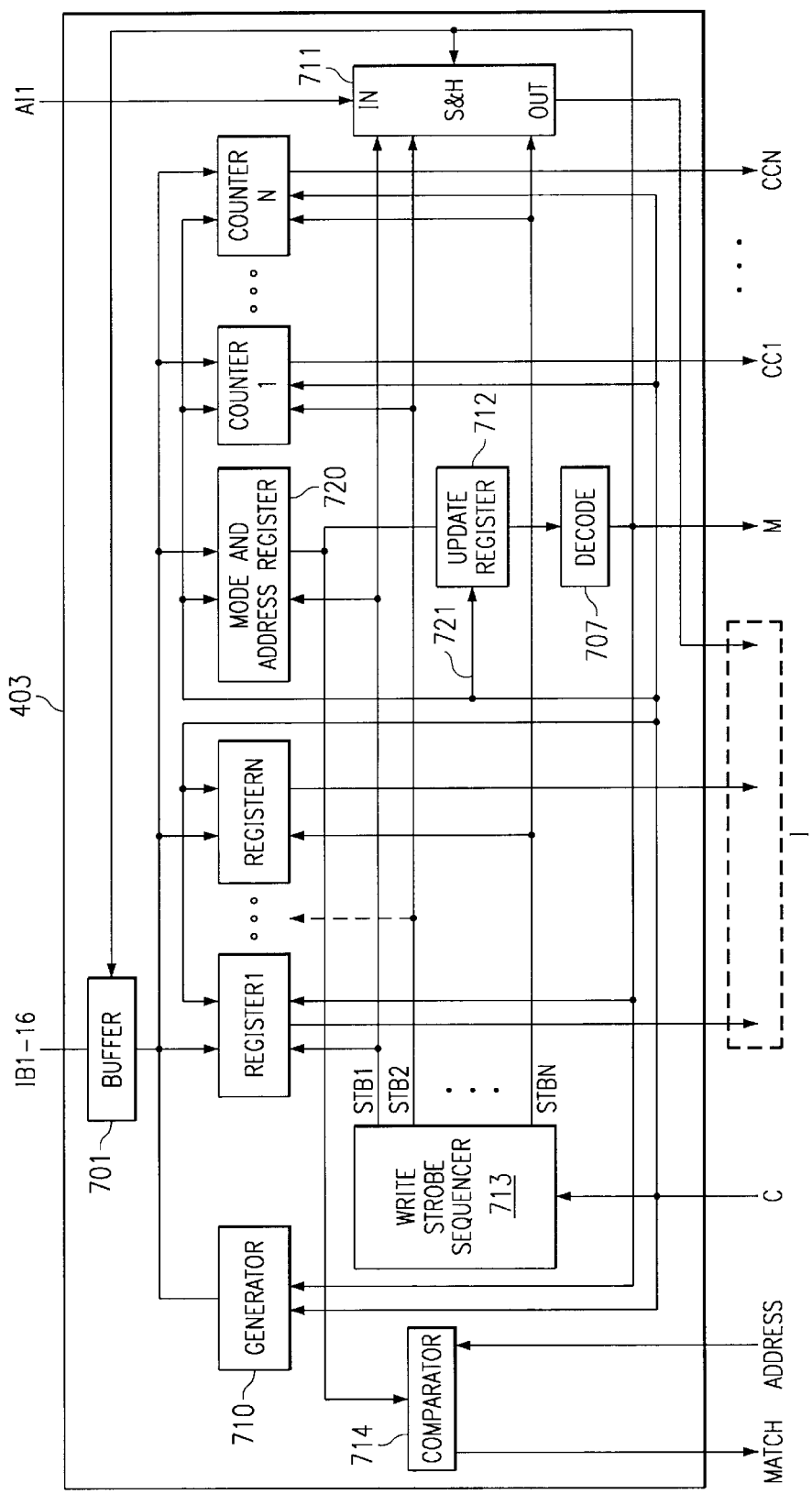
FIG. 7A is a detailed block diagram of an input port of the test port.

In FIG. 7A, input port 403 comprises an input buffer 701, registers 1–N, a mode & address register (MAR) 720, update register 712, decode logic 707, counters 1–N, write strobe sequencer 713, comparator 714, generator 710, and sample/hold circuit 711. When the test controller is reset (i.e. in Reset Port state of FIG. 6A), all circuitry of the input port, especially MAR 720 and update register 712, is initialized to enable functional operation of the IC and connected core. Following initialization, the generator 710 outputs are disabled and the buffer 701 outputs are enabled. Initialization is accomplished by a reset signal (not shown) on the control (C) input from the test controller. The input buffer 701 is used to buffer the IB from the loads of the generator, registers 1–N, MAR, and counters 1–N.

The input port circuitry is scalable such that it may contain all the circuitry shown, or lesser circuitry. For example, (1) if analog testing is not required, sample/hold circuit 711 can be deleted, (2) if autonomous test operations are not required, generator 710 and counters 1–N can be deleted, and (3) if the core test input (I) width is only 16 bits, registers 2–N can be deleted. The essential input port circuitry includes comparator 714, register 1, MAR 720, update register 712, and decode logic 707.

Write strobe sequencer 713 receives control (C) from test controller 402 to perform four functions. The first function is to write address data from IB to MAR 720. Control (C) for the first function comes from control output 512 of test port state machine 510 during the Input Port Address state. The second function is to write mode or mode and counter data from IB to MAR 720 and counters 1–N. Control (C) for the second function comes from control output 512 of test port state machine 510 during the Input Test Mode state. The third function is to write test data from IB to registers 1–N. The fourth function is to store analog voltages from AI1 into sample/hold circuit 711. Control (C) for the third and fourth functions come from control output 511 of an enabled test operation state machine 507, 508, 509, as will be described later in FIGS. 9–16

Figure 7B:
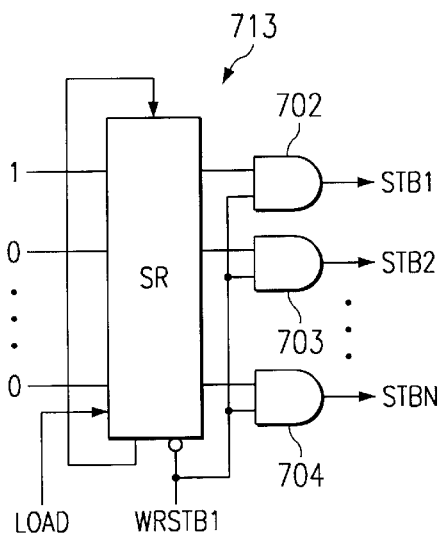
FIGS. 7B, 7C, 7D, 7E, and 7F are detailed diagrams of circuits used in the input port.

In FIG. 7B, write strobe sequencer 713 comprises a shift register (SR) with gated outputs. The shift register is parallel loaded with a pattern of 10 . . . 0 prior to a IB write sequence operation, with the logic one being input to And gate 702 and logic zeros to all other And gates 703, 704. The shift register receives a low-high-low WRSTB1 input from control (C). When the first WRSTB1 input occurs the input is allowed to pass through And gate 702 to strobe circuits connected to STB1 (i.e. register 1, MAR 720, and sample/hold 711). On the falling edge of the first WRSTB1 the shift register circulates the data such that the logic one is input to And gate 703. A subsequent WRSTB1 will strobe circuits connected to STB2 (i.e. register 2, counter 1, and sample/hold 711), then circulate the shift register data. This process repeats until all connected circuits have been strobed during the current write sequence operation. A new write sequence operation will repeat the above steps, starting with the loading the 10 . . . 0 pattern. A write sequence may not strobe every connected circuit. For example, one write sequence may only output a strobe on STB1, while another write operation may output strobes on all STB1–N outputs. Also, connected circuits may be enabled to respond to strobes or disabled from responding to strobes from the write strobe generator.

Figure 7C:
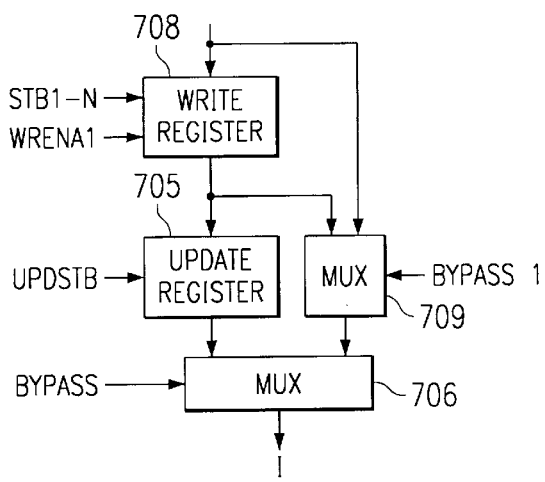

Data written into registers 1–N, it is either output from registers 1–N as it is written, or it is delayed and output from registers 1–N after all registers have been written. One example circuit for register 1 is shown in FIG. 7C. The circuit includes a write register 708, update register 705, and multiplexers 706 and 709. Write register 708 has a STB1 input from 713 for storing data and a WRENA1 input from mode (M) for enabling data to be stored. Update register 705 has an update strobe (UPDSTB) from control (C) for storing data from write register 708. Multiplexers 706 and 709 have controls (Bypass and Bypass1) from mode (M) and connections that provide register 1 with three modes of operation. In the first mode, data stored in write register 708 is output on input (I). In the second mode, data stored in update register 705 is output on input (I). In the third mode, data appearing at the inputs of the write register 705 is directly output on input (I). Registers 2–N provide the first and second modes, but not the third mode. The reason and importance of providing registers 1–N with the second mode will be described later in regard to FIG. 11. The reason and importance of providing register 1 with the third mode will be described later in regard to FIG. 9.

In FIG. 7A it is seen that each time IB data is written into a register 1–N the width of the input (I) data to the core I/O increases by the width of the IB (i.e. 16 bits). Thus the input port provides the capability of amplifying the input (I) data width by sequencing writes into registers 1–N to produce a core test data input (I) width which is a multiple of the IB data width.

Address data written into MAR 720 in response to STB1 is directly output to comparator 714. Mode data written to MAR 720 in response to STB1 is transferred to update register 712 during an update strobe input via bus 721 from control (C), separate from UPDSTB, then input to decode logic 707. While not shown, MAR 720 has a WRENA2 input from control (C) to enable or disable its response to STB1. The advantage of using decoder logic 707 is that mode data written into MAR 720 can be coded to produce appropriate mode (M) outputs from decode logic 707. For example, at power up the MAR 720 and update register 712 are reset to say all zeros. The all zeros input to the decode logic can be decoded to provide appropriate logic levels for the mode (M) outputs to enable the IC and connected core to be placed into functional mode. Also, the decode logic can produce a larger number of mode (M) decode outputs than is possible using only the width of the IB data bus. However, if the IB bus width is sufficient for all mode (M) outputs and if MAR 720 and update register 712 can be initialized to appropriate logic levels, the decode logic may be removed to allow the update register to output mode (M) signals directly.

Figure 7D:
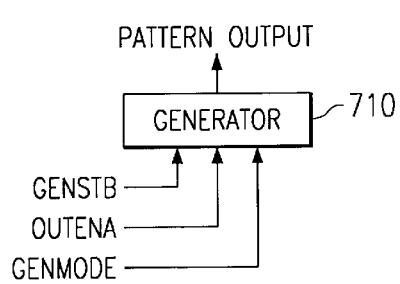
Figure 7F:
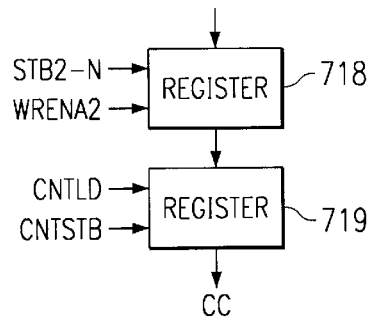

In FIG. 7F, count data written into counters 1–N is first written to a register 718 then loaded into a counter 719. Register 718 has STB input from 713 and WRENA2 input from control (C). Counter 719 has count load (CNTLD) and count strobe (CNTSTB) inputs from control (C), and count complete (CC) output to autonomous test operation state machines 509 in test controller 402. Autonomous controlled state machines control the counter via CNTLD and CNT-STB during testing.

Generator 710 is provided as an alternate method of inputting test data to the connected core, rather than inputting test data via IB. The generator comprises circuitry, such as linear feedback shift registers and/or counters, capable of generating test patterns to be applied to the connected core via inputs (I). When using the generator to input test data, the output of buffer 701 is disabled. The data output from the generator can be written to registers 1–N using write strobe sequencer 713 and first or second modes described in FIG. 7C. Alternatively, the data output from the generator may pass directly through register 1 be input to the connected core as describe in the third mode of FIG. 7C. FIG. 7D shows the signals input to the generator. The generator strobe (GENSTB), from an enabled autonomous test operation state machine via control (C), causes the generator to produce new output test data. The output enable (OUTENA), from mode (M), enables the generator outputs. The generator mode (GENMODE), from mode (M), configures the generator for producing a particular test output pattern sequence.

Figure 7E:
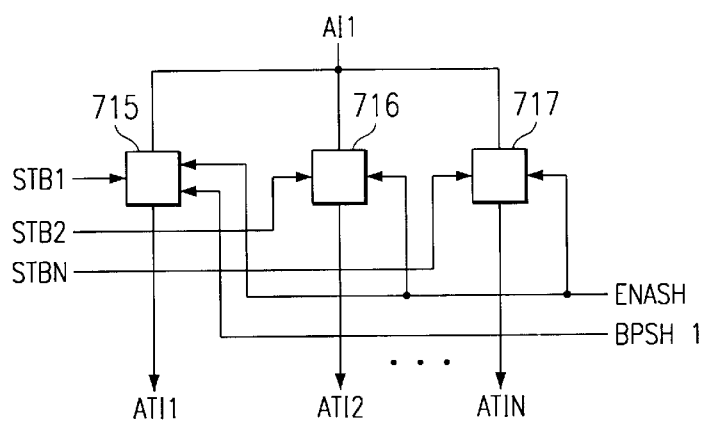

In FIG. 7E, sample/Hold circuit 711 is used to provide analog test voltages to the connected core. Sample/hold circuit 711 contains multiple sample and hold elements 715, 716, 717 connected to received the AI1 input from FIG. 5A and to output on analog test inputs 1–N (AST1–N). Each element is connected to a STB output from write strobe sequencer 713. Mode (M) input provides an enable sample/hold (ENASH) signal that enables the elements to respond to STB1–N inputs. External analog voltage inputs on AI1 can be stored in the sample and hold elements in response to STB1–N inputs from write strobe sequencer 713. The stored voltages are output to the connected core via input (I) on the AT1–N signals. Element 715 additionally receives a bypass sample/hold 1 (BYSHL) mode (M) input that enables it to pass the analog voltage on AI1 directly to AT1 and on to the connected core via the input (I).

I/O Port 404 Description

Figure 8A:
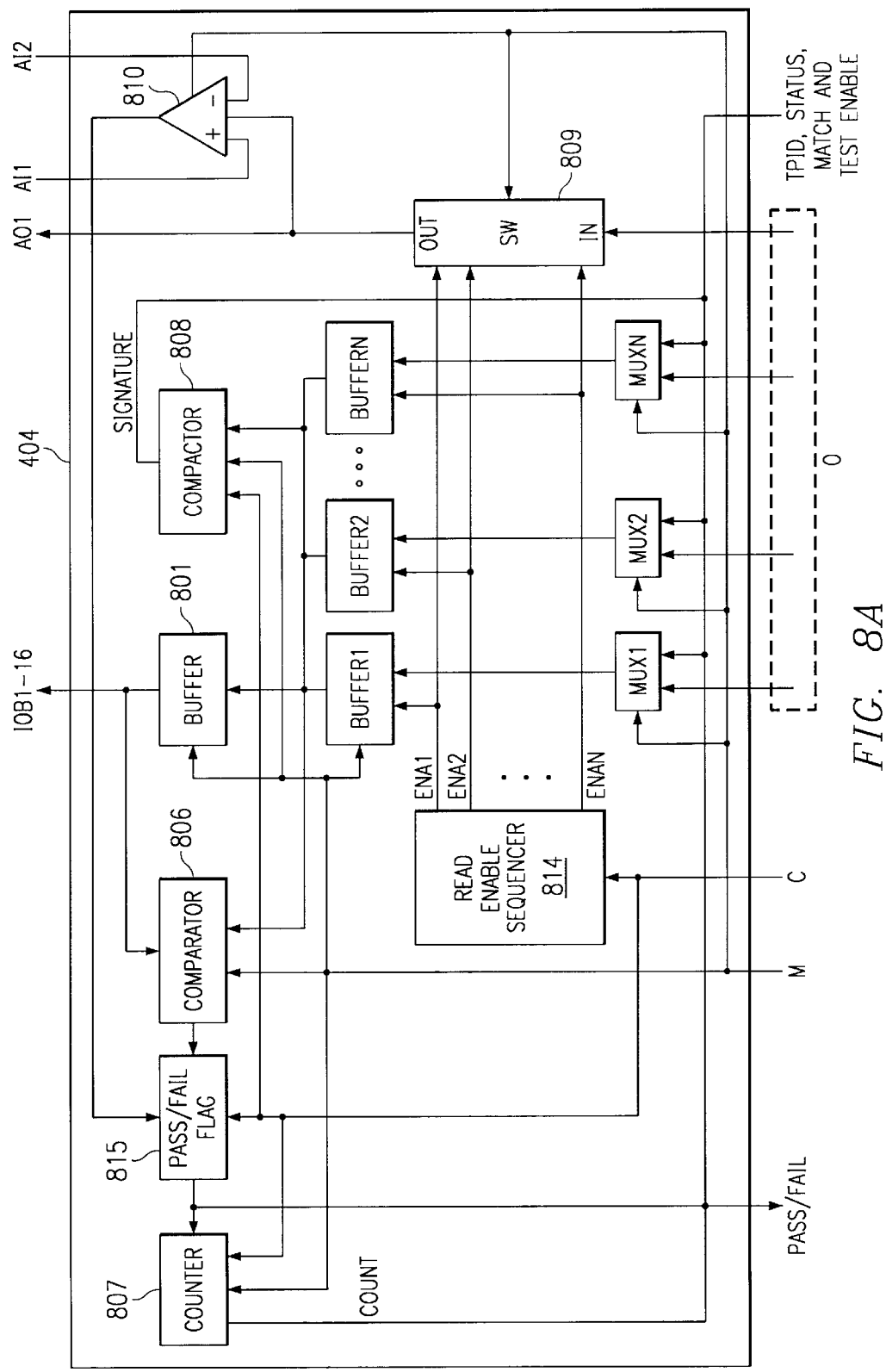
FIG. 8A is a detailed block diagram of an I/O port of the test port.

In FIG. 8A, I/O port 404 comprises a 3-state output buffer 801, 3-state buffers 1–N, multiplexers (Mux1–N), read enable sequencer 814, comparator 806, pass/fail flag 815, counter 807, compactor 808, analog switch 809, and window comparator 810. When test controller 402 is reset (i.e. in Reset Port state of FIG. 6A), the counter 807, pass/fail flag 815, compactor 808, and read enable sequencer 814 are initialized by control (C) input, and output buffer 801, comparator 806, analog switch 809, and window comparator 810 are disabled by mode (M) input. The output buffer 801 is used to: (1) buffer the IOB from the loads of the buffers 1–N, comparator 806, and comparator 808, (2) to disable IOB output from test port 105 when the test port is not addressed, and (3) to disable IOB output from test port 105 when the IOB is used to input data to the comparator.

As with input port 403, the I/O port 404 circuitry is scalable such that it may contain all the circuitry shown, or lesser circuitry. For example, (1) if analog testing is not required, analog switch 809 and window comparator 810 can be deleted, (2) if data compaction is not required, compactor 808 can be deleted, (3) if compare testing is not required, comparator 806, pass/fail flag 815, and counter 807 can be deleted, and (4) if the core test input (I) width is only 16 bits, multiplexers 2–N can be eliminated to allow direct connection of count, pass/fail, compactor, TPID, status, match, and TE data to buffers 2–N. The essential I/O port circuitry includes read enable sequencer 814, buffers 1–N, Mux1, and buffer 801.

Figure 8B:
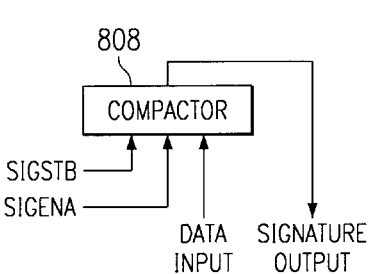
FIGS. 8B, 8C, 8D, and 8E are detailed diagrams of circuits used in the I/O port.

In FIG. 8B, the read enable sequencer 814 includes a shift register (SR). The shift register is identical in operation as the previously described shift register of FIG. 7B, in that at the beginning of a read sequence, the shift register is loaded with a 10 . . . 0 pattern and circulates the preloaded pattern along its outputs during the read sequence. It differs from the FIG. 7B shift register in that its enable outputs (ENA1–N) 802, 803, 804 are directly connected (not gated) to buffers 1–N. The data output from buffers 1–N comes from associated multiplexers 1–N. The multiplexers 1–N output data to buffers 1–N from either the data output (O) from the connected core, or from counter 807, pass/fail flag 815, compactor 808, TPID, status, match, and test enable (TE), as determined by the mode (M) input from the input port 403. The shift register receives a load and RDSTB input from control (C). The load input loads the shift register, and RDSTB shifts the shift register.

During the first read operation, shift register output 802 is set to a logic one to enable buffer 1 to output data to comparator 806, compactor 808, and buffer 801. Following the first read operation, a first RDSTB is input to the shift register to circulate the logic one from output 802 to output 803, which enables buffer 2 to output data to comparator 806, compactor 808, and buffer 801 for the second read operation. This process repeats until all required buffers 1–N have been enabled to output data to comparator 806, compactor 808, and buffer 801 during the current read sequence operation. A new read sequence operation will repeat the above steps, starting with the loading of the 10 . . . 0 pattern.

Depending on the mode (M) input to the multiplexers 1–N from input port 403, the data output from buffers 1–N during read operations will either be test data from the connected core, or test port information data (i.e. count, pass/fail, compactor, TPID, status, match, and test enable (TE) data). If the read operation is one that outputs test port information data, Mux1–N will be set to connect the information data to buffers1–N, and buffer 801 will be enabled to output the information data external of the IC via the IOB bus. The test port information data output mode is used to quickly output information from an addressed test port using the parallel IOB bus.

Figure 8C:
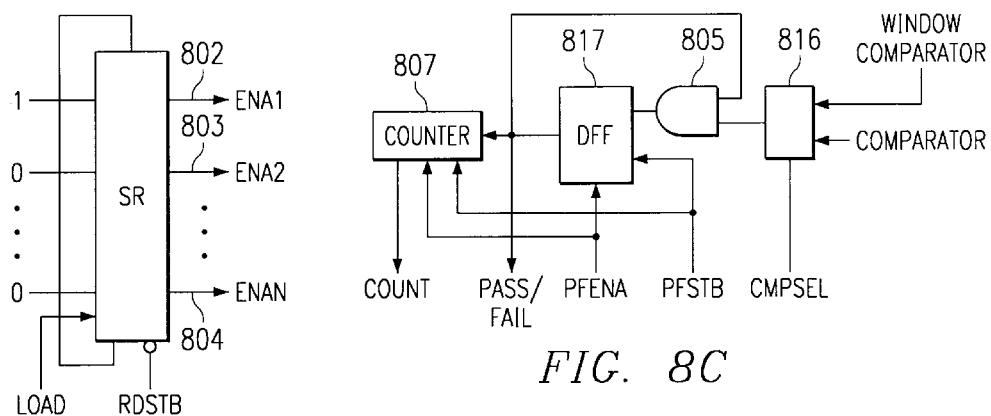

In FIG. 8C, counter 807 receives the pass/fail signal from DFF 817 in pass/fail flag circuit 815, a pass/fail enable (PFENA) signal from mode (M), and a pass/fail strobe (PFSTB) from control (C). Counter 807 outputs count data to Mux1–N. Pass/fail flag circuit comprises DFF 817, And gate 805, and multiplexer 816. DFF 817 receives PFENA and PFSTB, and outputs the pass/fail flag signal to And gate 805, counter 807, Mux1–N, test controller 402, and address register 401. And gate 805 receives the pass/fail signal and the output from multiplexer 816. And gate 805 outputs to DFF 817. Multiplexer 816 receives compare select (CMPSEL) input from mode (M), the output of comparator 806, and the output of window comparator 810. Multiplexer 816 outputs to And gate 805.

Prior to testing using the compare method of inputting compare data from IOB to comparator 806 (to be described later), DFF 817 is enabled and set high by PFENA to arm the counter for counting and to indicate an initial pass condition on the pass/fail flag signal. Also, multiplexer 816 is set to input the comparator output to DFF 817. During each core output (O) read operation from buffer1–N, DFF 817 and counter 807 are strobed by PFSTB input from the control (C). If the pass/fail flag output goes low in response to a mismatch between data input from IOB and data read from output (O), DFF 805 is latched low (by feedback through And gate 805) and the counter stops counting during all remaining PFSTBs.

Figures 8D, 8E:
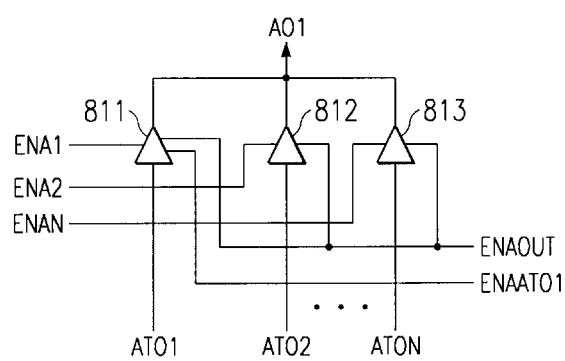

In FIG. 8D, compactor 808 receives data input from buffers 1–N, signature strobe (SIGSTB) input from control (C), and signature enable (SIGENA) input from mode (M). Compactor 808 outputs signature data to Mux1–N. When enable by SIGENA, compactor processes the data input from buffers 1–N into a signature during each SIGSTB.

In FIG. 8E, analog switch 809 comprises voltage follower buffers 811, 812, and 813. All buffers receive analog test outputs (ATO1–N) from the connected core, ENA1–N from read enable sequencer, and enable output (ENAOUT) from mode (M). Each buffer outputs to AO1 when enabled. Buffer 811 additionally receives enable ATO1 (ENAATO1) from mode (M), which enable buffer 811 to continuously pass ATO1 to AO1. During read operations and when enabled, each buffer responds to its enable input (ENAL) to output the analog voltage at is inputs to the AOI output.

I/O Port 404 Test Operation Modes

Read enable sequencer 814 provides a digital read operation whereby it responds to control (C) from the test controller 402 to output test data from buffers 1–N to buffer 801, comparator 806, and compactor 808. There are three types of digital read operations; (1) read data operation, (2) compare data operation, and (3) compact data operation. During a read data operation, I/O port 404 is configured such that test data output (O) from the connected core is output on the IOB bus to a tester during each read operation. During a compare data operation, I/O port 404 is configured such that test data output from the connected core is input to comparator 806 and compared with data input on the IOB bus from a tester, during each read operation. If the data matches, comparator 806 outputs a high to pass/fail flag 815 to indicate a pass. If the data does not match, comparator 806 outputs a low to pass/fail flag 815 to indicate a fail. During a compact data operation, test data output from the connected core is input to compactor 808 and processed into a signature during each read operation. The signature is read by a tester at the end of the test.

Read enable sequencer 814 also provides an analog read operation mode whereby it responds to control (C) from test controller 402 to output analog voltages from analog switch 809 to AO1 and window comparator 810. There are two types of analog read operations; (1) read voltage operation and (2) compare voltage operation. During a read voltage operation, I/O port 404 is configured such that voltages output (O) from the connected core are output on the AO1 bus to a tester during each read operation. During a compare voltage operation, I/O port 404 is configured such that voltages output (O) from the connected core are input to window comparator 810 and compared with voltages input to the window comparator from a tester via AI1 and AI2, during each read operation. If the test voltage from the connected core stays within a window defined by the voltages on AI1 and AI2, the window comparator outputs a high to pass/fail flag 815 to indicate a pass. If the voltage falls outside the window voltages, the window comparator outputs a low to pass/fail flag 815 to indicate a fail.

The pass/fail flag inputs the output of comparator 806 or window comparator 810 during each read operation, which ever is selected by multiplexer 816. If a pass input is received during a compare operation, the pass/fail flag remains high. If a fail input is received during a compare operation, the pass/fail flag is set low to indicate the failure. The counter, will halt counting when the pass/fail flag goes low, to indicate which read operation encountered a failure. The pass/fail flag signal can be routed off the IC via the test ports TSO output (see FIGS. 4A, 4B, and 5A) to indicate immediately to a connected tester when a failure occurs. A low output on pass/fail flag signal will cause the test port's TSO signal output to go low, via inverter, multiplexer 503, and transistor 504 of FIG. 5A, which causes the IC's bussed TSO output signal (406 of FIG. 4B) to go low.

If only 16 bits of test data are output (O) from a connected core, Mux1 and buffer 1 can be enabled by mode (M) to pass the 16 bits of data directly to comparator 806, IOB via buffer 801, and compactor 808. In this configuration, control (C) from test controller 402 can be input to the I/O port to compare or compact the directly output 16 bit data without using the read enable sequencer 814. Similarly, if only a single analog voltage signal is output (O) from a connected core, buffer 811 of analog switch 809 can be enabled by mode (M) to pass the signal on ATO1 directly to AO1 and window comparator 809. In this configuration, control (C) from test controller 402 can be input to the I/O port to compare the analog voltage signal without using the read enable sequencer.

In FIG. 8A it is seen that each time test output (O) data is read from a buffer 1–N, the width of the output (O) data from the core I/O increases by the width of the IOB. Thus the I/O port provides the capability of amplifying the test data output (O) width by sequencing reads from buffers 1–N to produce a core test data output (O) width which is a multiple of the IOB data width.

Digital Test Examples

The following provides examples of how the test port 105 can be used to test one or more digital circuits contained within a connected core. In these examples, it is assumed the connected core has been designed for interfacing its internal digital circuits to test port 105 for testing. Some of the important aspects of these examples include; (1) to illustrate how the test operation state machines 507, 508, 509 interface with the test port state machine 510 during test, (2) to illustrate how TPI controlled test operation state machines 507, 508 may be designed and operated, (3) to illustrate how autonomous test operation state machines 509 may be designed and operated, and (4) to illustrate the test flexibility of including specific types of test operation state machines in the test port 105 to expedite testing of a given circuit.

Digital Test Example 1

Figure 9A:
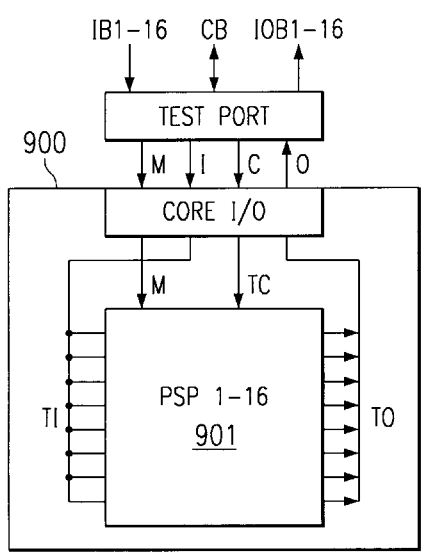
FIGS. 9A, 9B, and 9C are block diagrams of an integrated circuit including a digital circuit and scan circuits in an intellectual property core and a test port.

In FIG. 9A, the test port is used to test a digital circuit 901 in connected core 900. Circuit 901 is designed with a test mode for configuring the circuit into a parallel scan path (PSP) arrangement. In this example the number of scan paths corresponds to the width of the test port IB and IOB busses, i.e. 16. Also, all scan paths have an equal number of scan cells. The mode (M) input from the test port is used to configure the core I/O and circuit 901 into the PSP test mode, as previously described in regard to FIG. 3.

Figure 9B:
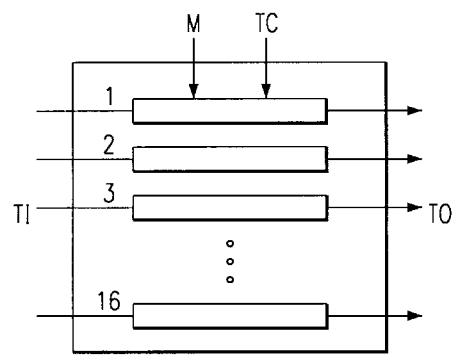
Figure 9C:
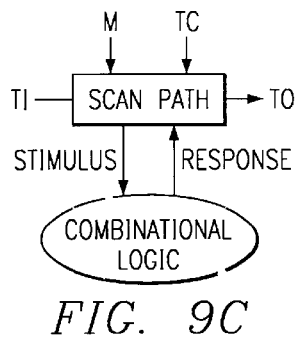

In FIG. 3, the mode (M) input controlled multiplexers to connect inputs (I) from the test port to the test inputs (TI) of core circuit 901 and outputs (O) to the test port to test outputs (TO) from core circuit 901. An example of the parallel scan paths 1-16, is shown in FIG. 9B. An example of one of the scan paths coupled to combinational logic to be tested is shown in FIG. 9C. The scan path consist of a number of scan cells that test the combinational logic by inputting stimulus to and capturing response from the combinational logic during each scan cycle. Preferably, all the scan paths are designed with an equal number of scan cells, as this will expedite testing according to the present invention as described below.

To control the parallel scan path test configuration of FIG. 9A, a TPI controlled test operation state machine, as previously described in FIG. 5A, is provided within the test port.

Figure 9D:
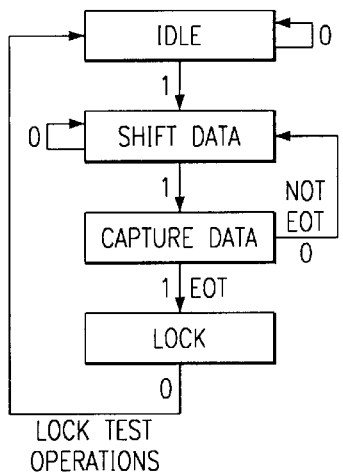
FIGS. 9D, 9E, 9F, 9G, 9H and 9I are state diagrams describing testing procedures for the digital circuit.

In FIG. 9D, the operation of the TPI controlled test operation state machine has four states. When unlocked and enabled, the test operation state machine enters the Shift Data state from the Idle state. The test operation state machine provides the control (C) for testing the PSPS. Within the Shift Data state, control (C) input to the PSPs causes data from IB to be shifted into the PSPs, while data from the PSPs is shifted to IOB. During shift operation, a direct input path from IB to the PSPs is provided by buffer 701 and register 1 of FIG. 7A, and a direct output path from the PSPs to IOB is provided by Mux1, buffer 1, and buffer 801 of FIG. 8A. Shift operations are used to input stimulus data to the PSPs, and to output response data from the PSPs.

When the PSPs fill with stimulus and empty response, a transition from the Shift Data state to the Capture Data state occurs. In the Capture Data state, control (C) is input to cause new response data from the combinational logic (FIG. 9C) to be captured into the PSPs. Following the capture of response data, the test operation state machine transitions to the Shift Data state to shift out the captured response and shift in next stimulus. The shift operation is then followed by another capture operation. Eventually, all stimulus data will have been applied and all response data obtained and the end of test (EOT) occurs by transitioning from the Capture Data state to the Lock State.

Figure 9E:
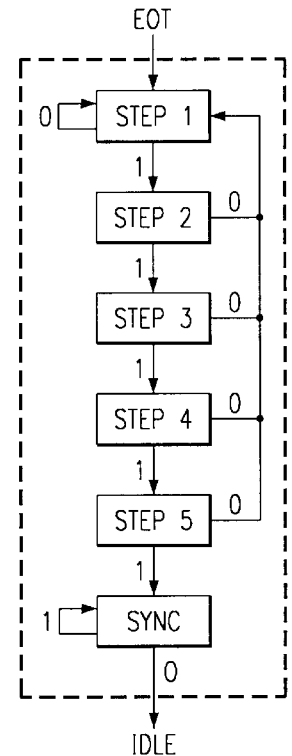
Figure 9I:
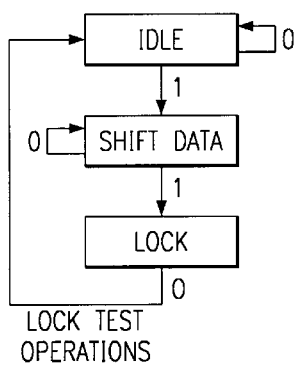

The Lock state, which is shown in detail in FIG. 9E, is similar to the Address and Test Lock states previously described in regard to FIGS. 6C and 6D, in that it consists of Step 1–5 states and a Sync state. Once entered, the Lock state of FIG. 9E requires a particular TPI sequence to exit from the Lock state, as mentioned for the Address and Test Lock states. The first part of the exit sequence is to receive five consecutive logic highs on TPI, which places the Lock state into the Sync state. The Sync state is maintained if additional logic highs are input on TPI. The second part of the exit sequence is to receive a logic zero on TPI, which causes a state transition from the lock state to the Idle state of the test operation state machine diagram of FIG. 9D. When the transition occurs from the Lock state to the Idle state, the test operation state machine outputs a reset signal to DFF 502 which locks the test operation state machine up in its Idle state by the lock output of DFF 502 going low.

Referring back to FIGS. 6C and 6D, it is seen that when the test operation state machine Lock state of FIG. 9E exits its Sync state and goes Idle, the Lock states of the test port state machine also exit their Sync states and enter the Next State 1 state. This is made possible by the fact that all Lock states are designed to use the same TPI escape sequence. Using the same TPI escape sequence to synchronously exit both the test port and test operation Lock states is an important aspect of the present invention. This feature, in combination with the ability to selectively enable a particular TPI controlled test operation state machine using the ENA1–2 inputs (FIG. 5A), facilitates a simple and flexible plug-n-play interface between the test port state machine and any number of user added TPI controlled test operation state machines.

Without this plug-n-play state machine interface, the test port state machine would need to be redesigned each time a new TPI controlled test operation state machine is defined and added to the test port. It is also important, when using this plug-n-play state machine interface technique, not to use the TPI escape sequence in the design of TPI controlled test operation state machines. For example, since the first part of the TPI escape sequence is five logic highs on TPI, that particular TPI sequence should not be used as a TPI sequence that controls state transitions of a TPI controlled test operation state machine. Using five logic highs as a TPI sequence in the design of test operation state machine would cause the test port state machine to exit from its lock states (FIG. 6C and 6D) and respond to TPI input. With both the test port and test operation state machines enabled and responding to TPI input, the operation of the test ports could be corrupted. All TPI controlled test operation state machines will contain a lock state as shown in FIG. 9E and described above.

Figure 9F:
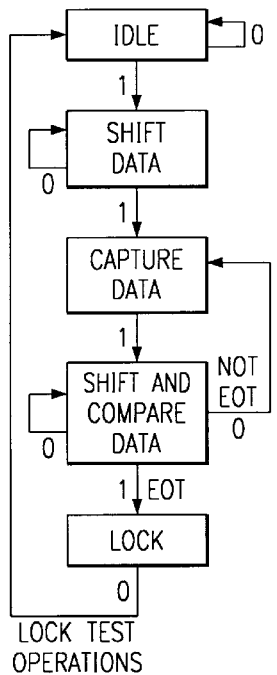

In FIG. 9F, a second TPI controlled test operation state machine is provided within the test port for testing core circuit 901 using the I/O port's compare technique described in FIG. 8A. When unlocked and enabled, the TPI controlled test operation state machine enters the Shift Data state from the Idle state to input first stimulus data from IB into the PSPs, then transitions into the Capture Data state to capture first response data. From Capture Data state, the Shift & Compare Data state is entered. Within the Shift & Compare Data state, data from IB is shifted into the PSPs, while data from PSPs is shifted to I/O port comparator 806. During shift operation, a direct input path from IB to the PSPs is provided by buffer 701 and register 1 of FIG. 7A, and a direct output path from the PSPs to comparator 806 is provided by Mux1, and buffer 1 of FIG. 8A. During each shift step, the PSP output data is compared with data input from IOB.

When the PSPs fill with stimulus and empty response, a transition from the Shift & Compare Data state to the Capture Data state occurs. In the Capture Data state, new response data from the combinational logic (FIG. 9C) is captured into the PSPs. Following the capture of response data, the test operation state machine transitions to the Shift & Compare Data state to shift out and compare the captured response and shift in next stimulus. The Shift & Compare operation is then followed by another capture operation. Eventually, all stimulus data will have been applied and all response data compared and the end of test (EOT) occurs by transitioning from the Shift & Compare Data state to the Lock State.

Following the test, the pass/fail flag 815 and counter 807 can be read to determine if and when a compare failure may have occurred during the test. Alternately, the pass/fail flag signal can be directly output on the IC's TSO pad (FIG. 4B) to a tester to provide an immediate failure indication, as described in FIG. 8A. One advantage of immediately detecting a failure using the IC's TSO pad is that the test can be stopped when a first failure occurs, reducing test time by aborting the remainder of the test.

It is important to note that the Shift Data state in FIG. 9F is used to initialize the circuit to known state prior to performing compare operations. For example, if compare operations were performed immediately, the pass/fail signal would immediately indicate a failure, since the circuit may not be in the correct starting condition for testing. Similar circuit initialization states, to input either digital or analog initialization signals, will be used in all following test operation state machines that use the compare method of testing circuits.

Figure 9G:
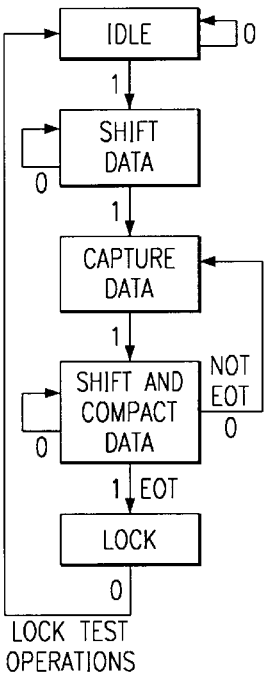

In FIG. 9G, a third TPI controlled test operation state machine is provided within the test port for testing core circuit 901 using the I/O port's compaction technique described in FIG. 8A. When unlocked and enabled, the TPI controlled test operation state machine enters the Shift Data state from the Idle state to input first stimulus data from IB into the PSPs, then transitions into the Capture Data state to capture first response data. From Capture Data state, the Shift & Compact Data state is entered. Within the Shift & Compact Data state, data from IB is shifted into the PSPs, while data from PSPs is shifted to I/O port compactor 808. During shift operation, a direct input path from IB to the PSPs is provided by buffer 701 and register 1 of FIG. 7A, and a direct output path from the PSPs to compactor 808 is provided by Mux1, and buffer 1 of FIG. 8A. During each shift step, the PSP output data is input to the compactor and processed into a signature.

When the PSPs fill with stimulus and empty response, a transition from the Shift & Compact Data state to the Capture Data state occurs. In the Capture Data state, new response data from the combinational logic (FIG. 9C) is captured into the PSPs. Following the capture of response data, the test operation state machine transitions to the Shift & Compact Data state to shift out and compact the captured response and shift in next stimulus. The Shift & Compact operation is then followed by another capture operation. Eventually, all stimulus data will have been applied and all response data compacted and the end of test (EOT) occurs by transitioning from the Shift & Compact Data state to the Lock State. Following the test, the signature contained within compactor 808 can be read to determined if the test passed or failed.

It is important to note that the Shift Data state in FIG. 9G is used to initialize the circuit to known state prior to performing compaction operations. For example, if compaction operations were performed immediately, the signature would always fail, since the circuit may not be in the correct starting condition for testing. Similar circuit initialization states will be used in all following test operation state machines that use the compaction method of testing circuits.

Figure 9H:
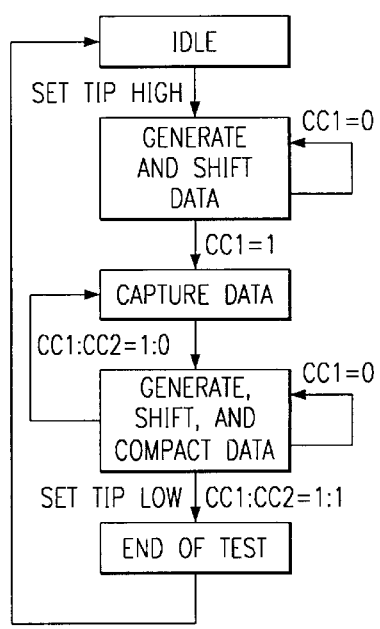

In FIG. 9H, an autonomous test operation state machine (see 509 of FIG. 5A) is provided within the test port for testing core circuit 901. When enabled, the autonomous test operation state machine sets the test input progress (TIP) signal high and enters the Generate & Shift Data state from the Idle state to input first stimulus data from generator 710 into the PSPs, then transitions into the Capture Data state to capture first response data. From Capture Data state, the Generate, Shift & Compact Data state is entered. Within the Generate, Shift & Compact Data state, data from generator 710 is shifted into the PSPs, while data from PSPs is shifted to compactor 808. During shift operation, a direct input path from generator 710 to the PSPs is provided by register 1 of FIG. 7A, and a direct output path from the PSPs to compactor 808 is provided by Mux1, and buffer 1 of FIG. 8A. During each shift step, the PSPs input stimulus data produced by generator 710 and output captured response data to compactor 806 to be processed into a signature.

When the PSPs fill with stimulus and empty response, a transition from the Generate, Shift & Compact Data state to the Capture Data state occurs. In the Capture Data state, new response data from the combinational logic (FIG. 9C) is captured into the PSPs. Following the capture of response data, the test operation state machine transitions to the Generate, Shift & Compact Data state to generate and compact additional data. The Generate, Shift & Compact operation is then followed by another capture operation. Eventually, all generated stimulus data will have been applied and all response data compacted and the end of test (EOT) occurs by setting TIP low and transitioning from the Generate, Shift & Compact Data state to the End Of Test state. The TIP signal can be routed off the IC via the TSO pad (FIGS. 4A and 4B) to indicate to the tester when the autonomous test begins (TIP goes high) and ends (TIP goes low). All autonomous test operation state machines will set the TIP signal high at the beginning of test, and set the TIP low at the end of test, as described above.

The autonomous test operation state machine transitions from the End Of Test state to the Idle state when the test port state machine 510 inputs a new test mode by entering the Input Test Mode state of FIG. 6A. For example, the IOB TPI controlled test operation state machine of FIG. 9J can be enabled by a new test mode input during the Input Test Mode state to allow the signature contained within compactor 808 to be read via IOB to determine if the test passed or failed.

During the autonomous test operation, counters 1 and 2 within input port 403 are controlled by control (C) output from the autonomous test operation state machine to load and count. Count data is written to the counters (see Input Test Mode state of FIG. 6A) prior to starting the autonomous test operation to provide the frequency of the count complete (CC1 and CC2) signals. The count complete signals determining how long the autonomous test operation state machine remains in the Generate & Shift data state (CC1) and Generate, Shift, & Compact Data state (CC1), and how many times to repeat the loop between the Generate, Shift, & Compact state and Capture Data state (CC2) In this example, counter 1 is loaded with a count equal to the scan cell length of the PSPs (all PSPs have equal scan cell lengths) and counter 2 is loaded with a count equal to the number of scan cycles required to input and output all stimulus and response patterns to the combinational logic being tested. Counter 1's count complete (CC1) signal indicates when all scan cells have been shifted in and out, and counter 2's count complete (CC2) signal indicates when all required stimulus and response patterns have been applied. In FIG. 9H, when a CC1=1 signal occurs, counter 1 is reload with the initial count data, except for when a CC2=1 signal occurs. When CC1=1 and CC2=1, the End Of Test state is entered.

Digital Test Example 2

Figure 10A:
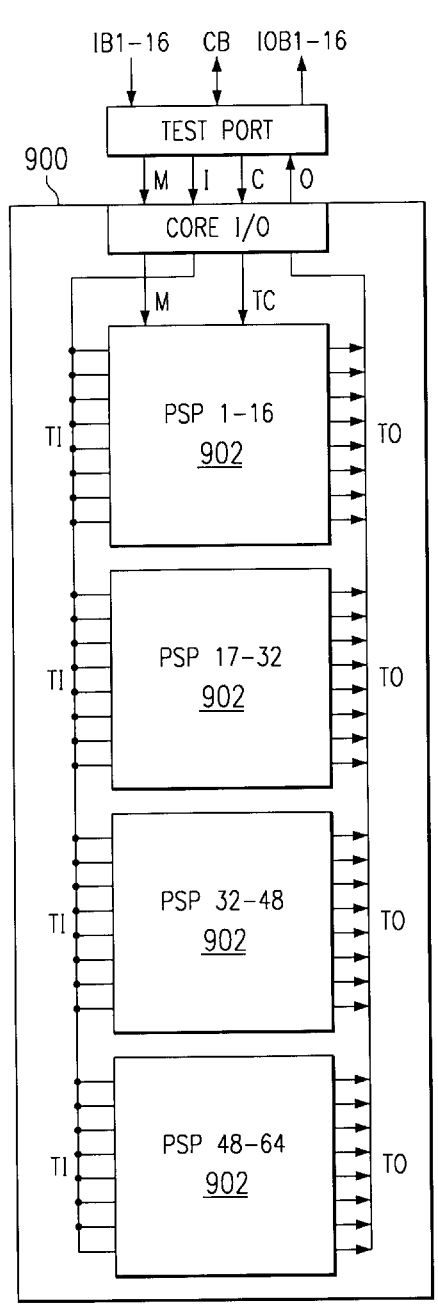
FIG. 10A is a block diagram of an integrated circuit including a digital circuit and scan circuits in an intellectual property core and a test port.

In FIG. 10A, the test port is used to test another digital circuit 902 in connected core 900. Circuit 902 is designed with a test mode for configuring the circuit into a number of PSP groups. Each PSP group contains a number of scan paths corresponding to the width of IB and IOB busses of the test port, i.e. 16 bits. Also, the scan paths of each PSP group have the same number of scan cells, i.e. are equal in length.

Figure 10B:
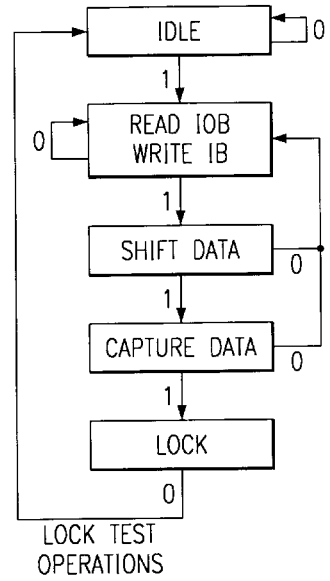
FIGS. 10B, 10C, 10D and 10E are state diagrams describing testing procedures for the digital circuit.

In FIG. 10B, a first TPI controlled test operation state machine is provided within the test port to provide test control (C). When unlocked and enabled, the test operation state machine enters the Read IOB Write IB state. In this state, the test port inputs (I) data to and outputs (O) data from core circuit 902 using the input port 403 write sequences to registers1–N and the I/O port 404 read sequences from buffers1–N, as previously described in FIGS. 7A and 8A. Data input (I) to core circuit 902 is input from IB and data output (O) from core circuit 902 is output on IOB.

Next, the test operation state machine enters the Shift Data state. In this state, the test operation state machine outputs control (C) to shift the data on the inputs (I) into the PSPs (via TI). This is a one shift operation state. This shift operation is used to input new stimulus data from the inputs (I) to the PSPs, and to output new response data from the PSPs to the outputs (O). After the shift operation, the test operation state machine re-enters the Read IOB Write IB state to read the response outputs (O) and input the next stimulus inputs (I). The test operation state machine will loop between the Read IOB Write IB state and Shift Data state a number of times to completely empty the PSPs of response and fill the PSPs with new stimulus. The number times this loop occurs is equal to the number of scan cells contained in the PSPs that need to be filled with stimulus and emptied of response When the PSPs are eventually filled with new stimulus and emptied of all response, a transition from the Shift Data state to the Capture Data state occurs. In the Capture Data state, control (C) is output to cause new response data to be loaded into PSPs. Following the response capture, the test operation state machine transitions to the Read IOB and Write IB state and repeats the above described stimulus input and response output procedure. The stimulus input and response output procedure is followed by another response capture step. Eventually, all stimulus data will have been applied and all response data will have been obtained and the test operation state machine will transition from the Capture Data state into the Lock state to end the test.

Figure 10C:
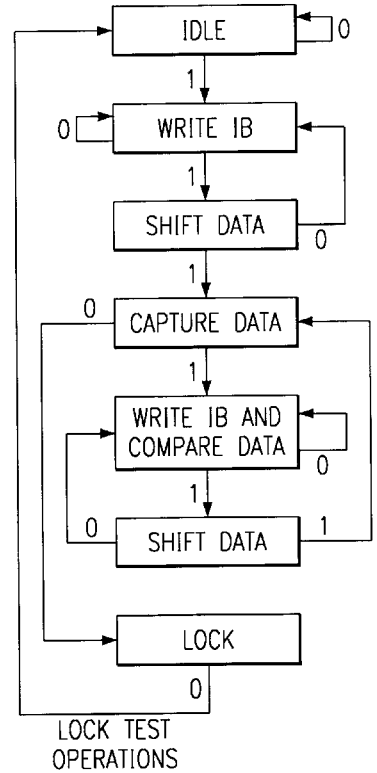

In FIG. 10C, a second TPI controlled test operation state machine can be unlocked and enabled to test core circuit 902. This test operation state machine tests by inputting (I) data to core circuit 902 from IB and comparing the data output (O) from core circuit 902 with data input on IOB. When unlocked and enabled, the test operation state machine enters the Write IB state. In the Write IB state, the test port inputs (I) data to core circuit 902 using the input port 403 write sequences to registers 1–N. The test operation state machine transitions to the Shift Data state to perform a single shift operation to shift the input (I) data into the PSPs (via TI), then returns to the Write IB state. The process repeats until the PSPs are filled with first stimulus data, then the Capture Data state is entered. In the Capture Data state the test operation state machine captures response into the PSPs, then transitions to the Write IB & Compare Data state.

In the Write IB & Compare Data state, the test port inputs (I) data to core circuit 902 from IB using write sequences and outputs (O) data from core circuit 902 to comparator 806 using read sequences. The data output (O) from core circuit 902 is compared with data input from IOB during each read sequence step. The test operation state machine transitions to the Shift Data state to perform a single shift operation to shift the next input (I) data into the PSPs (via TI) and output the next output (O) data from the PSPs, then returns to the Write IB & Compare Data state. This loop between the Write IB & Compare Data state and Shift Data state continues until the PSP are filled with new stimulus and emptied of previously captured response. When this occurs, the Capture Data state is entered to capture new response into the PSPs. From the Capture Data state, the Write IB & Compare Data and Shift Data state looping repeats, periodically transitioning to the Capture state whenever the PSPs are filled with stimulus and emptied of response. When all stimulus has been applied and all response compared, the test operation state machine transitions from the Capture Data state to the Lock state to end the test. As previously mentioned in regard to FIG. 9F, the pass/fail flag 815 of the I/O port can be monitored during the test via TSO or read at the end of test determine if the compare test passed or failed.

Figure 10D:
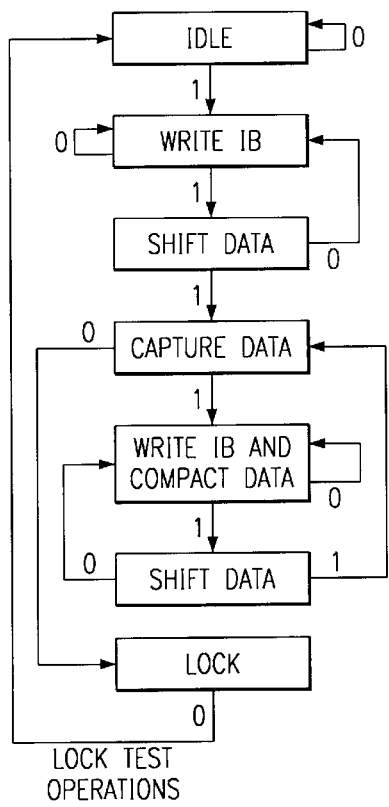

In FIG. 10D, a third TPI controlled test operation state machine can be unlocked and enabled to test core circuit 902. This test operation state machine tests by inputting (I) data to core circuit 902 from IB and compacting the data output (O) from core circuit 902 into compactor 808. This test is identical to that of FIG. 10C with the exception that the output (O) data from core circuit 902 is input to the compactor during the Write IB & Compact Data state, instead of being input to the comparator during the Write IB & Compare Data state as described in FIG. 10C. Also, during this test operation, data need not be input from IOB as described in the test operation of FIG. 10C. During the Write IB & Compact Data state, the output (O) data is simply input to the compactor 808 to be processed into a signature during each read sequence step. In the test operation of FIG. 10D, when all stimulus has been applied and all response compacted, the test operation state machine transitions from the Capture Data state to the Lock state to end the test. As previously mentioned in regard to FIG. 9G, the signature contained within compactor 808 can be read via the IOB to determine if the compaction test passed or failed.

Figure 10E:
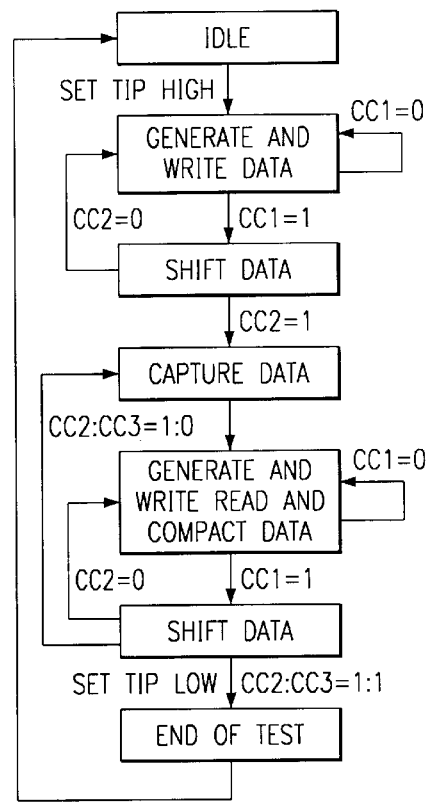

In FIG. 10E, an autonomous test operation state machine (see 509 of FIG. 5A) is provided within the test port for testing core circuit 902. When enabled, the autonomous test operation state machine enters the Generate & Write Data state from the Idle state to generate and input first stimulus data from generator 710 to the PSPs using write sequences into registers 1–N of input port 403. From the Generate & Write Data state, the test operation state machine transitions to the Shift Data state to perform a single shift operation to shift the generated input (I) data into the PSPs, then it returns to the Generate & Write Data state to generate and output the next input (I) data. The loop between the Generate & Write data state and Shift Data state continues until the PSPs are filled with first stimulus data.

When this occurs, the test operation state machine transitions from the Shift Data state to the Capture Data state to capture first response into the PSPs. From Capture Data state, the Generate & Write, Read & Compact Data state is entered. In this state, data generated from generator 710 is written to registers 1–N to be input (I) to core circuit 902 using write sequences, while data output (O) from core circuit 902 is read into compactor 808 using read sequences. After data has been generated and written as input (I) to core circuit 902, and output (O) data from core circuit 902 has been read and compacted, the Shift Data state is entered. In the Shift Data state, a single shift operation inputs the new input (I) data to the PSPs and outputs new response output (O) data from the PSPs. From the Shift Data state, the Generate & Write, Read & Compact Data state is re-entered to generate new core input (I) and compact the new core output (O) data.

This loop between the Generate & Write, Read & Compact Data state and Shift Data state continues until the PSPs fill with stimulus and empty of response. When this occurs, a transition from the Shift Data state to the Capture Data state occurs. In the Capture Data state, the PSPs capture new response data. From the Capture Data state, the test operation state machine transitions to the Generate & Write, Read & Compact Data state to generate new input (I) to core circuit 902 and compact new output (O) from core circuit 902. The process of looping between the Generate & Write, Read & Compact Data state and the Shift Data state resumes, periodically entering the Capture Data state to capture new response data. Eventually all generated stimulus will be applied and all response compacted and the autonomous test operation state machine will transition from the Shift Data state to the End Of Test state to end the test.

The autonomous test operation state machine of FIG. 10E transitions from the End Of Test state to the Idle state when the test port state machine 510 inputs a new test mode by entering the Input Test Mode state of FIG. 6A. As previously described in regard to FIG. 9H, a test mode input may be used to enable TPI controlled test operation state machine of FIG. 9J to allow the signature contained within compactor 808 to be read via IOB to determined if the test passed or failed. Also, as previously mentioned in regard to the autonomous test operation state machine of FIG. 9H, counters 1, 2, and 3 within input port 403 are controlled to load and count to regulate state transitions in the autonomous test operation state machine of FIG. 10E. In this example, counter 1 is loaded with a count that indicates the number write sequence steps that occur in the Generate & Write Data state and the number of write and read sequence steps that occur in the Generate & Write, Read & Compact Data state. Counter 2 is loaded with a count that indicates the number of times the loop occurs between the Generate & Write, Read & Compact Data state and Shift Data State. Counter 3 is loaded with a count that indicates the number of times the Capture Data state is entered from the Shift Data state. CC1–3 signals indicate the end of count in counters 1–3, respectively. End Of Test is determined by CC2 and CC3 both being high.

Digital Test Example 3

Figure 11A:
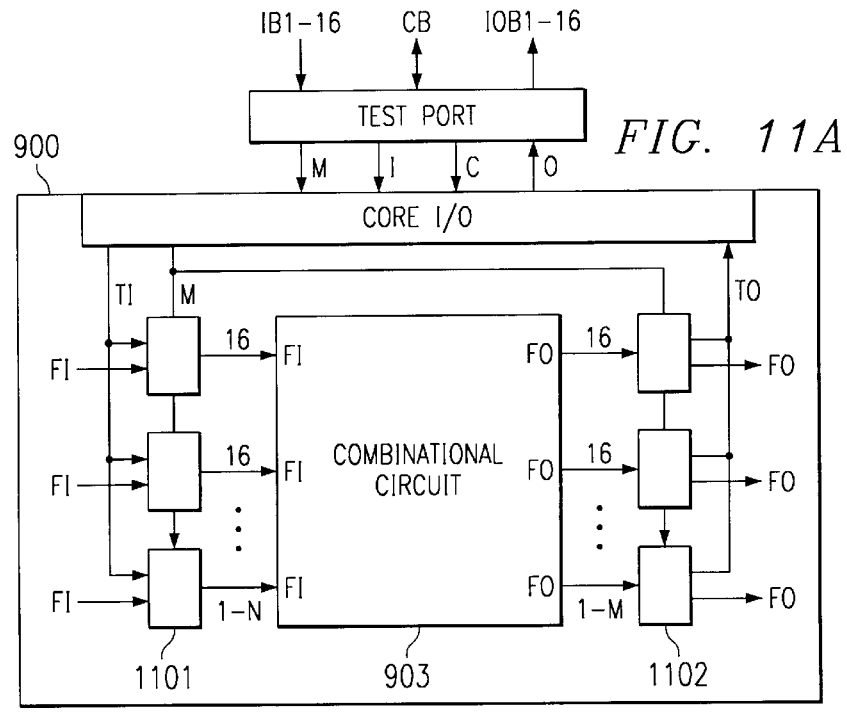
FIG. 11A is a block diagram of an integrated circuit including a digital circuit in an intellectual property core and a test port.

In FIG. 11A, the test port is used to test another digital circuit 903 in connected core 900. Circuit 903 is a combinational circuit with functional inputs (FI) and functional outputs (OF) connected to other circuits within core 900. Circuit 903 has no test mode, so testing must be performed by adding multiplexers 1101 to the circuit inputs and demultiplexers 1102 on circuit outputs. In functional mode, the multiplexers and demultiplexers are controlled by mode (M) to connect the circuit's FI and OF to the other circuit FI and OF.

In test mode, the multiplexers and demultiplexers are controlled by mode (M) to connect the circuit's FIs and FOs to the inputs (I) and outputs (O) of the test port. The multiplexers and demultiplexers are shown partitioned into widths equal to the IB and IOB width (16 bits) to indicate that multiple read and write sequences will be required to communicate test data between the test port and circuit 903 via the input (I) and output (O). The bottom multiplexer and demultiplexer are shown having from 1–N and 1–M signals, respectively, to indicate that the circuit's FI and OF will may not be equally divisible into exact 16 bit widths.

Figure 11B:
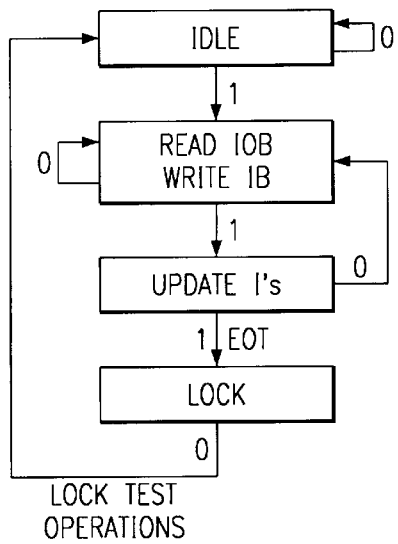
FIGS. 11B, 11C, 11D and 11E are state diagrams describing testing procedures for the digital circuit.

In FIG. 11B, a TPI controlled test operation state machine tests core circuit 903. The state machine consists of Idle, Read IOB Write IB, Update I's (inputs), and Lock states. The Idle, Read IOB Write IB, and Lock states operate as previously described. The Update I's state is a new state used to control update register 705 of registers 1–N in input port 403 of FIGS. 7A and 7C. During the Update I's state, the data from registers 1–N is output from update registers 705 by the UPSTB signal. The importance of using the update registers 705 is that they allow the input (I) data to the core to be maintained while the next input data is being written into registers 1–N and core output (O) data is being read from IOB, during the write and read sequences.

In FIG. 11, a second TPI controlled test operation state machine can be unlocked and enabled to test core circuit 903. This test operation state machine tests by inputting (I) data to core circuit 903 from IB and comparing the data output (O) from core circuit 903 with data input on IOB. When unlocked and enabled, the test operation state machine enters the Write IB state. In the Write IB state, the test port writes data to be input to core circuit 903 using write sequences to registers 1–N. When the write sequence is complete, the test operation state machine transitions to the Update I's state to input (I) the data to the core, then transitions to the Write IB & Compare Data state.

In the Write IB & Compare Data state, the test port writes the next data to be input to core circuit 903 using write sequences, and reads output (O) data from core circuit 903 to comparator 806 using read sequences. The data output (O) from core circuit 903 is compared with data input from IOB during each read sequence step. The test operation state machine transitions to the Update I's state to output the next input (I) date to the core, then returns to the Write IB & Compare Data state. This loop between the Write IB & Compare Data state and Update I's state continues until circuit 903 is tested. When circuit 903 is tested, the test operation state machine transitions from the Update I's state to the Lock state to end the test. As previously mentioned in regard to FIG. 9F, the pass/fail flag 815 of the I/O port can be monitored during the test via TSO or read at the end of test determine if the compare test passed or failed.

Figure 11C:
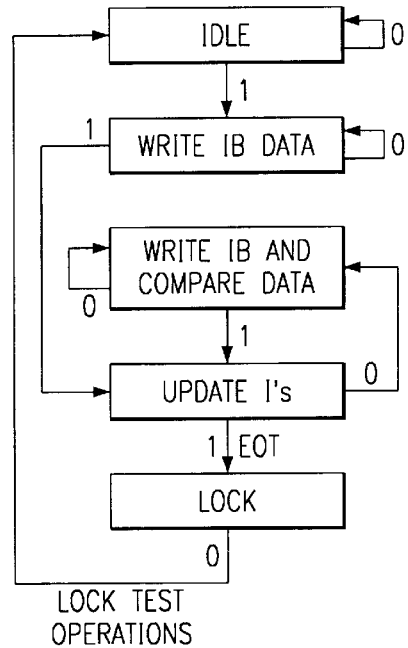
Figure 11D:
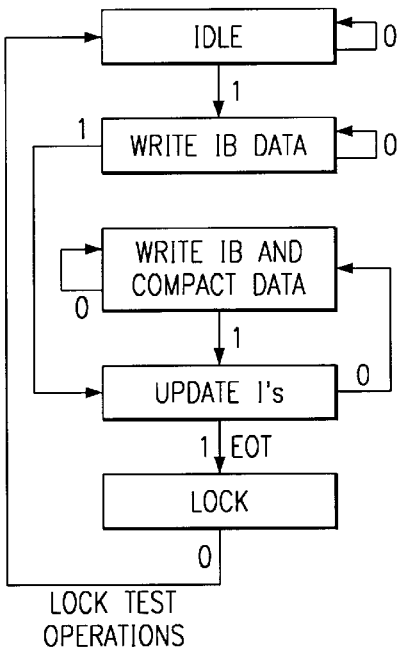

In FIG. 11D, a third TPI controlled test operation state machine can be unlocked and enabled to test core circuit 903. This test operation state machine is identical to that of FIG. 11C with the exception that the output (O) data from core circuit 902 is input to compactor 808 during the Write IB & Compact Data state, instead of being input to comparator 806 during the Write IB & Compare Data state as described in FIG. 11C. Also, during this test operation, data need not be input from IOB as described in the test operation of FIG. 11C. During the Write IB & Compact Data state, the output (O) data is simply input to compactor 808 to be processed into a signature during each read sequence step. In the test operation of FIG. 10D, when all test inputs (I) have been applied and all test outputs (O) compacted, the test operation state machine transitions from the Update I's state to the Lock state to end the test. The signature contained within compactor 808 can be read via the IOB to determine if the compaction test passed or failed.

Figure 11E:
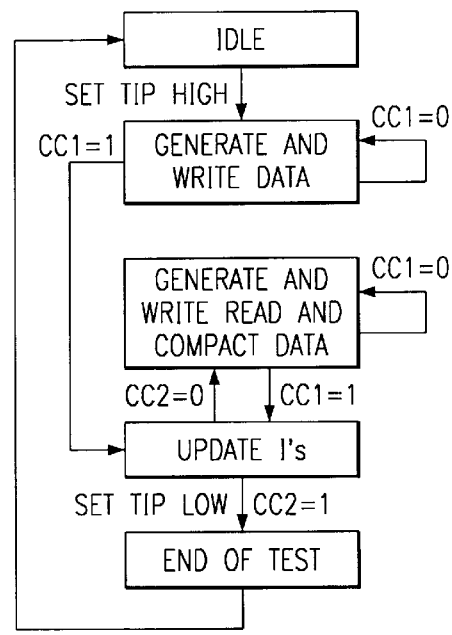

In FIG. 11E, an autonomous test operation state machine is provided within the test port for testing core circuit 903. When enabled, the autonomous test operation state machine enters the Generate & Write Data state from the Idle state to generate first stimulus data from generator 710 using write sequences into registers 1–N of input port 403. From the Generate & Write Data state, the test operation state machine transitions to the Update I's state to input (I) the generated data to core circuit 903, then transitions to the Generate & Write, Read & Compact state. In the Generate & Write, Read & Compact Data state, the next stimulus data is generated from generator 710 and written to registers 1–N using write sequences, while data output (O) from core circuit 903 is read into compactor 808 using read sequences. After next data has been written to registers 1–N and output (O) data has been compacted, the Update I's state is entered to update the next input (I) data to core circuit 903. From Update I's, the Generate & Write, Read & Compact Data state is re-entered to generate next data and compact the new output (O) data.

This loop between the Generate & Write, Read & Compact Data state and Update I's state continues until core circuit 903 is tested. When this occurs, a transition from the Update I's state to the End Of Test state occurs. A transition from the End Of Test state to the Idle state occurs when the test port state machine 510 inputs a new test mode by entering the Input Test Mode state of FIG. 6A, for example to enable TPI controlled test operation state machine of FIG. 9J to read the signature in compactor 808. As with other autonomous test operation state machines counters are used to control state transitions.

Digital Test Example 4

Figure 12A:
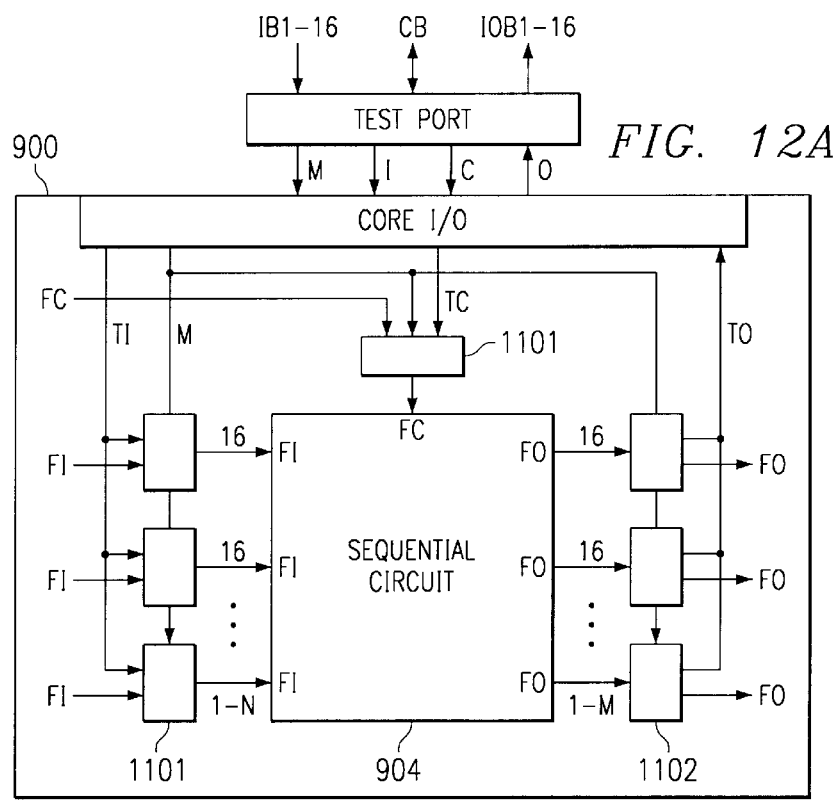
FIG. 12A is a block diagram of an integrated circuit including a digital sequential circuit in an intellectual property core and a test port.

In FIG. 12A, the test port is used to test another digital circuit 904 in connected core 900. Circuit 904 is a sequential circuit, such as a state machine, digital signal processor, microprocessor, FIFOs, or Cache memories with functional inputs (FI), functional outputs (OF), and functional control (FC) inputs. Circuit 904 has no test mode, so testing must be performed, as in FIG. 11A, by adding multiplexers 1101 to the circuit inputs and demultiplexers 1102 on the circuit outputs. In functional mode, the multiplexers an d demultiplexers are controlled by mode (M) to connect the circuit's FI OF, and FC to other circuits in the core. In test mode, the multiplexers and demultiplexers are controlled by mode (M) to connect the circuit's FI, OF, and FC to the inputs (I), outputs (O), and control (C) of the test port.

Figure 12B:
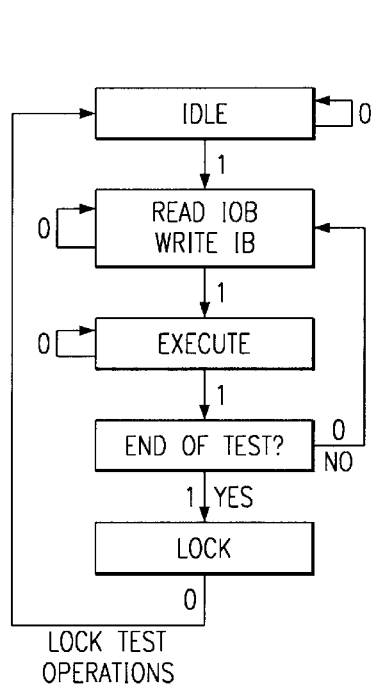
FIGS. 12B, 12C, 12D and 12E are state diagrams describing testing procedures for the digital sequential circuit.

In FIG. 12B, a TPI controlled test operation state machine tests circuit 904. The state machine consists of Idle, Read IOB Write IB, Execute, and Lock states. The Idle, Read IOB Write IB, and Lock states operate as previously described. The execute state is a new state used to input test control (TC) to the circuit via multiplexer 1101. During execute state, TC causes the circuit to (1) input data from input (I), (2) process data, and (3) output the processed data on output (O). When execute state is complete, the test operation state machine transitions to the Read IOB Write IB state if the End Of Test has not been reached to input (I) and output (O) new data, or, if the End Of Test is reached, the test operation state machine transitions to the Lock state.

Figure 12C:
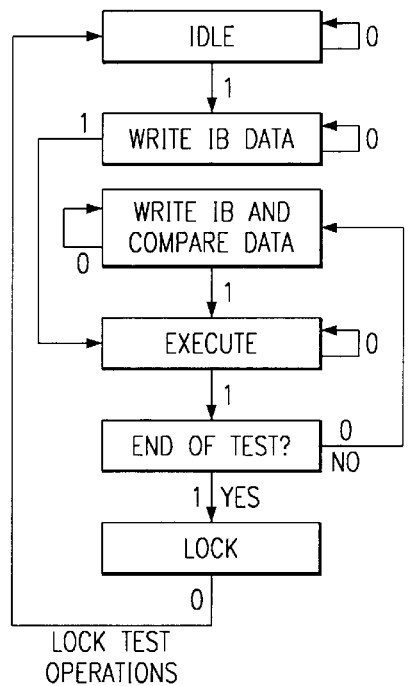

In FIG. 12C, another TPI controlled test operation state machine tests circuit 904. This state machine inputs (I) first data to the circuit during the Write IB Date state, then transitions to the Execute state to operate the circuit. From the Execute state, the test operation state machine transitions to the Write IB & Compare Data state to input new input (I) data and compare the output (O) data. Entering the Execute state operates the circuit. The test operation state machine loops between the Write IB & Compare Data state and Execute state until the test is complete, then transitions to the Lock state via the End Of Test state, then to the Idle state.

Figure 12D:
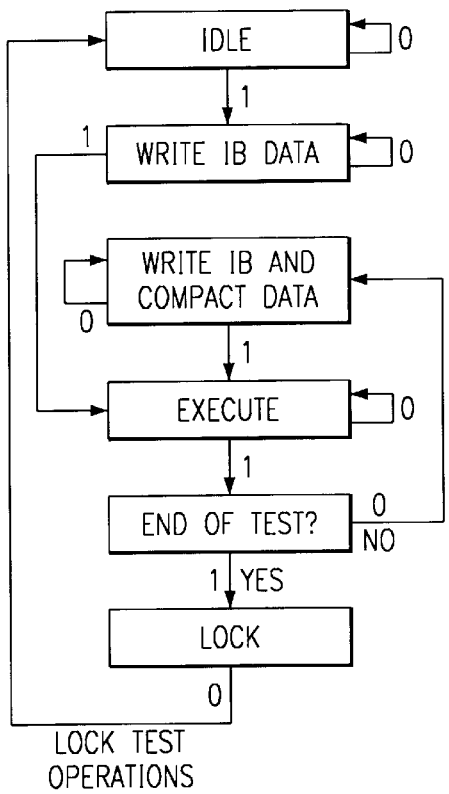

In FIG. 12D, another TPI controlled test operation state machine tests circuit 904. This state machine is identical to that of FIG. 12C, except instead of comparing data output from circuit 904, the FIG. 12D state machine compacts the data output from circuit 904.

Figure 12E:
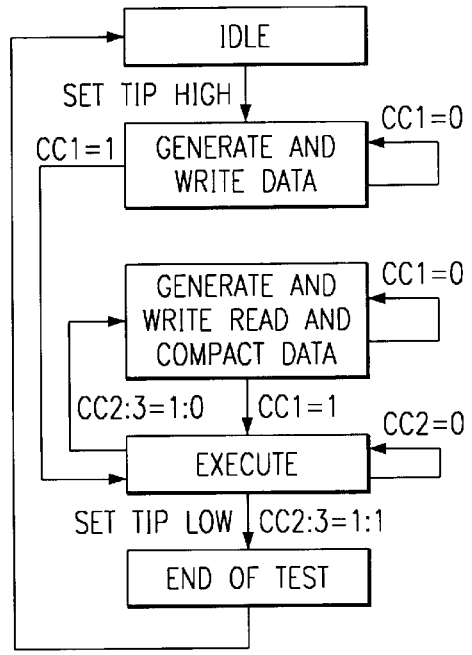

In FIG. 12E, another autonomous test operation state machine tests circuit 904. When enabled, the autonomous test operation state machine enters the Generate & Write Data state from the Idle state to generate first stimulus data from generator 710 using write sequences into registers 1–N of input port 403. From the Generate & Write Data state, the test operation state machine transitions to the Execute state to operate circuit 904, then transitions to the Generate & Write, Read & Compact state. In the Generate & Write, Read & Compact Data state, the next stimulus data is generated and input to circuit 904, while data output (O) from circuit 904 is read into compactor 808. From the Generate & Write, Read & Compact state, the execute state is entered to operate the circuit. This loop between the Generate & Write, Read & Compact Data state and Execute state continues until circuit 903 is tested. When this occurs, a transition from the Execute state to the End Of Test state occurs. A transition from the End Of Test state to the Idle state occurs when the test port state machine 510 inputs a new test mode by entering the Input Test Mode state of FIG. 6A, for example to enable TPI controlled test operation state machine of FIG. 9J to read the signature in compactor 808. As with other autonomous test operation state machines counters are used to control state transitions.

Analog Test Examples

The following provides examples of how the test port 105 can be used to test one or more analog circuits contained within a connected core. In these examples, it is assumed the connected core and has been designed for interfacing its internal analog circuits to test port 105 for testing. Some of the important aspects of these examples include; (1) to illustrate how analog testing can be accomplished using test operation state machines and the AIO2 and AIO2 IC pads of FIG. 5A, and (2) to illustrate how multiple analog circuits may be tested in parallel to reduce test time.

Analog Test Example 1

In FIG. 13A, the test port tests a digital to analog (DAC) circuit 905 in connected core 900. Circuit 905 includes functional inputs (FI), functional control (FC) input, and functional outputs (OF) which are analog outputs (AO). Circuit 905 has no test mode, so testing must be performed, as in FIG. 11A, by adding multiplexers 1101 to the circuit inputs and demultiplexer 1103 on the circuit output. Demultiplexer 1103 is different from demultiplexer 1102 in that it is designed for switching analog output voltages to TO and OF on an off. In functional mode, the multiplexers and demultiplexer are controlled by mode (M) to connect the circuit's FI, OF, and FC to other circuits in the core. In test mode, the multiplexers and demultiplexers are controlled by mode (M) to connect the circuit's FI, OF, and FC to the inputs (I), outputs (O), and control (C) of the test port.

In FIG. 13B, a TPI controlled test operation state machine tests circuit 905. The state machine consists of Idle, Input IB Data & Output AO (analog output), Execute, End Of Test, and Lock states. During test, the test port is configure by mode (M) to directly connect the IB bus to the circuit's 16 bit digital inputs (DI) via buffer 701 and register 1 of input port 403 and multiplexer 1101, and to directly connect the IC's AIO1 pad to the circuit's AO via demultiplexer 1103, buffer 811 of I/O port 404, and switch 505 of test controller 402.

When unlocked and enabled, the state machine transitions from the Idle state to the Input IB Data & Output AO state. In the Input IB Data & Output AO state, the circuit receives digital input from the tester driving IB and outputs an analog signal to the tester via the AIO1 pad. Entering the Execute state, the state machine outputs test control (TC) to the circuit to cause the circuit to input the digital data on IB, convert the data into an analog voltage, and output the analog voltage to the AIO1 pad. The state machine then transitions back into the Input IB Data & Output AO state, via the End Of Test state, where the tester measures or analyzes the analog voltage output on AIO1 and inputs new digital data on IB. The state machine can loop in the Input IB Data & Output AO state for as long as required to allow the tester time to measure/analyze the analog voltage output on AIO1. Transitioning to the Execute state, the input, conversion, and output control steps are repeated, then the Input IB Data & Output AO state is re-entered to all the tester to again measure/analyze the analog voltage output on AIO1 and input new data on IB. Eventually the circuit is tested and the state machine transitions to the Idle state via the End Of Test and Lock states.

In FIG. 13C, another TPI controlled test operation state machine is shown for testing circuit 905. The state machine consists of Idle, Input IB Data, Execute, Input IB Data & Compare AO, End Of Test, and Lock states. During test, the test port is configure by mode (M) to; (1) connect the IB bus to the digital input of circuit 905, (2) enable window comparator 810, pass/fail flag 815, and counter 807 of I/O port 404, (3) connect the pass/fail flag signal to the IC's TSO pad, (4) connect the analog output of circuit 905 to the window comparator, and (5) connect AIO1 and AIO2 pads to the window comparator via AI1 and AI2.

When unlocked and enabled, the state machine transitions from the Idle state to the Input IB Data state. In the Input IB Data state, the tester inputs a first digital data input to the circuit via IB. Transitioning to the Execute state, the state machine outputs test control (TC) to circuit 905 to cause the circuit to input the digital data on IB, convert the data into an analog voltage, and output the analog voltage to window comparator 810. While in the Execute state, the tester inputs upper and lower windowing voltages to the window comparator via AIO1 and AIO2. Transitioning to the Input IB Data & Compare AO state, the tester inputs the next data to the circuit via IB and the state machine outputs control to strobe the pass/fail flag 815 and counter 807. The pass/fail flag receives the output from the window comparator 810. If the window comparator output is high, the voltage output of circuit 905 lies between the upper and lower windowing voltages and the compare passes. If the window comparator output is low, the voltage lies outside the upper and lower windowing voltages and the compare fails.

Transitioning to the Execute state, the input, conversion, and output control steps are repeated, and the tester inputs the next upper and lower windowing voltages to window comparator 810. Transitioning to the Input IB Data & Compare AO state the tester inputs the next data to circuit 905 and the state machine compares the circuit voltage output by strobing the pass/fail flag and counter. This process of looping between the Input IB Data & Compare AO state and Execute state continues until circuit 905 is tested. The state machine then transitions to the Idle state via the End Of Test and Lock states. At the end of test, the pass/fail and counter can be read using IOB read test operation state machine of FIG. 9J. Also, the tester can detect immediate compare failures by monitoring the TSO pad output (FIG. 5A).

Analog Test Example 2

Figure 14A:
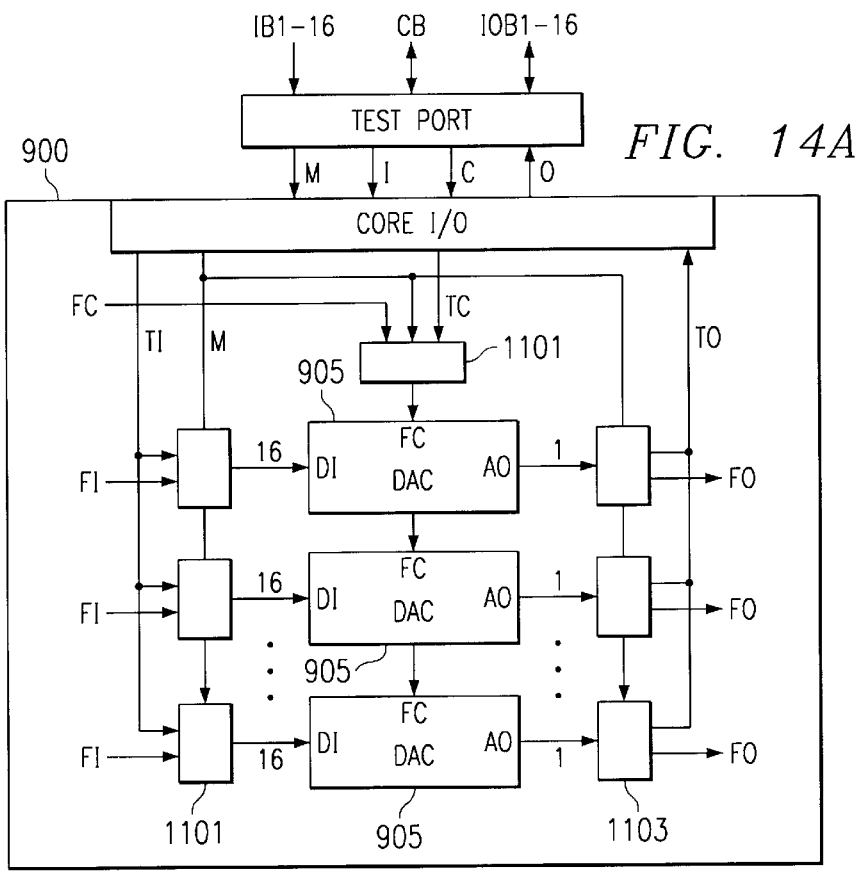
FIG. 14A is a block diagram of an integrated circuit including a plural digital to analog circuits in an intellectual property core and a test port.

In FIG. 14A, the test port is used to simultaneously test multiple digital to analog (DAC) circuits 905 in connected core 900. The structure is the same as described in FIG. 13A, except the test port inputs (I) data to circuits 905 using write sequences to registers 1–N of input port 403, and outputs (O) voltages from circuits 905 using read sequences to analog switch 809 of I/O port 404. Also, a multiplexer 1101 will be required for each circuit to switch between inputting FC or TC, unless all circuits are bussed to the same FC input.

Figure 14B:
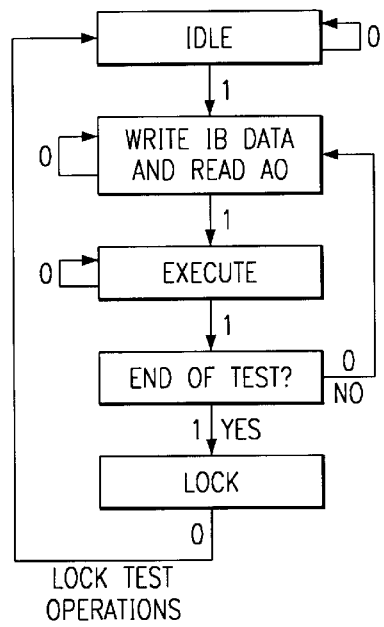
FIGS. 14B and 14C are state diagrams describing testing procedures for the digital to analog circuits.

In FIG. 14B, a TPI controlled test operation state machine simultaneously tests multiple circuits 905. The state machine consists of Idle, Write IB Data & Output AO, Execute, End Of Test, and Lock states. During test, the test port is configure by mode (M) to use write sequences to registers 1–N of input port 403 to input (I) data to all circuits 905, and use read sequences to analog switch 809 of I/O port 404 to output (O) voltages from all circuits 905 to the IC's AIO1 pad.

When unlocked and enabled, the state machine transitions from the Idle state to the Write IB Data & Output AO state. In the Write IB Data & Output AO state, the tester writes input (I) data to circuits 905 using registers 1–N and write strobe sequencer 713, and reads voltage outputs (O) from circuits 905 using analog switch 809 and read enable sequencer 814. Entering the Execute state, the state machine outputs TC to circuits 905 to cause the circuits to input (I) data, convert the data into an analog voltages, and output (O) the analog voltages. The state machine then transitions back into the Write IB Data & Output AO state where the new input (I) data is written to registers 1–N and the output (O) voltages are read from the analog switch 809 and input to the tester for measurement/analysis. Transitioning to the Execute state, the input, conversion, and output control steps are repeated, then the Write IB Data & Output AO state is re-entered to input (I) data and output (O) voltages. Eventually, circuits 905 are tested and the state machine transitions to the Idle state via the End Of Test and Lock states.

Figure 14C:
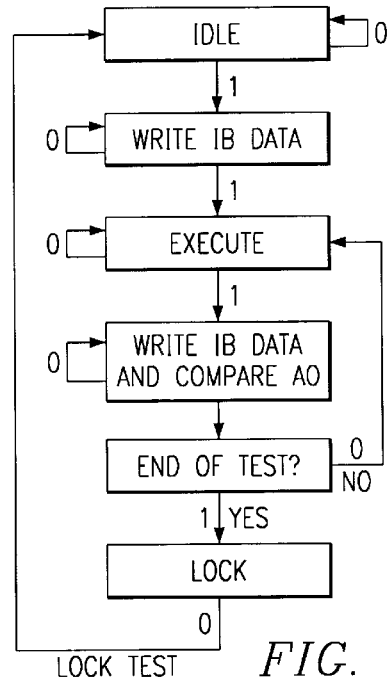

In FIG. 14C, another TPI controlled test operation state machine is shown for testing circuits 905. The state machine consists of Idle, Write IB Data, Execute, Write IB Data & Compare AO, End Of Test, and Lock states. During test, the test port is configured by mode (M) to; (1) connect registers 1–N of input port 403 to input (I) to circuits 905, (2) enable window comparator 810, pass/fail flag 815, and counter 807 of I/O port 404, (3) connect the pass/fail flag signal to the IC's TSO pad, (4) connect the outputs of circuits 905 to the window comparator via analog switch 809, and (5) connect AIO1 and AIO2 pads to the window comparator via AI1 and AI2.

When unlocked and enabled, the state machine transitions from the Idle state to the Write IB Data state. In the Write IB Data state, the tester writes IB data to registers 1–N, using write strobe sequencer 713, to be input (I) to circuits 905.

Transitioning to the Execute state, the state machine outputs TC to circuits 905 to cause the circuits to input (I) data, convert the data into an analog voltages, and output (O) the analog voltages to analog switch 809. Transitioning to the Write IB Data & Compare AO state, the state machine writes the next input (I) data to registers 1–N, and reads and compares the voltages output (O) from circuits 905 using analog switch 809, window comparator, pass/fail flag 815 and counter 807. During each voltage read and compare step, the tester can input different upper and lower windowing voltage setting to allow testing different voltage levels from each of the circuits 905. Compare pass or fail is determined as described previously. This process of looping between the Write IB Data & Compare AO state and Execute state continues until all circuits 905 are tested and the state machine transitions to the Idle state via the End Of Test and Lock states. At the end of test, the pass/fail and counter can be read using IOB read test operation state machine of FIG. 9J. Also, the tester can detect immediate compare failures by monitoring the TSO pad output (FIG. 5A).

Analog Test Example 3

In FIG. 15A, the test port is used to test a analog to digital (ADC) circuit 906 in connected core 900. Circuit 906 includes a functional input (FI) which is an analog input (AI), functional control (FC) input, and functional outputs (OF). Circuit 906 has no test mode, so testing must be performed, by adding multiplexer 1104 to the circuit input and demultiplexer 1102 on circuit outputs. Multiplexer 1104 is different from demultiplexer 1101 in that it is designed for switching analog voltages between AI and inputs TI and FI. In functional mode, the multiplexer and demultiplexer are controlled by mode (M) to connect the circuit's FI, OF, and FC to other circuits in the core. In test mode, the multiplexers and demultiplexers are controlled by mode (M) to connect the circuit's FI, OF, and FC to the inputs (I), outputs (O), and control (C) of the test port.

In FIG. 15B, a TPI controlled test operation state machine is shown for testing circuit 906. The state machine consists of Idle, Input AI (Analog Input) & Read IOB Data, Execute, End Of Test, and Lock states. During test, the test port is configure by mode (M) to directly connect the IC's AIO1 pad to the circuit's AI input (DI) via switch 505 of FIG. 5A, ATIL output of sample/hold circuit 711 of FIG. 7E, and multiplexer 1104, and to directly connect the circuit's output to the IOB bus via demultiplexer 1102, and I/O port 404 via Mux1, buffer1, and buffer 801 of FIG. 8A.

When unlocked and enabled, the state machine transitions from the Idle state to the Input AI & Read IOB state. In the Input AI & Read IOB state, the circuit receives analog voltage input from the tester driving AIO1 and outputs digital data to the tester via IOB. Entering the Execute state, the state machine outputs test control (TC) to the circuit to cause the circuit to input the analog voltage, convert the voltage into a digital representation, and output the digital representation on the IOB bus. The state machine then transitions back into the Input AI & Read IOB Data state, via the End Of Test state, where the tester reads the digital representation on IOB and inputs a new analog voltage on AIO1. Transitioning to the Execute state, the input, conversion, and output control steps are repeated, then the Input AI & Read IOB Data state is re-entered to again allow the tester to read the digital representation on IOB and input a new voltage on AIO1. Eventually the circuit is tested and the state machine transitions to the Idle state via the End Of Test and Lock states.

In FIG. 15C, another TPI controlled test operation state machine is shown for testing circuit 906. The state machine consists of Idle, Input AI, Execute, Input AI & Compare Data, End Of Test, and Lock states. During test, the test port is configure by mode (M) to; (1) connect the AIO1 pad to the analog input of circuit 906, (2) enable comparator 806, pass/fail flag 815, and counter 807 of I/O port 404, (3) connect the pass/fail flag signal to the IC's TSO pad, and (4) connect the digital output of circuit 906 to comparator 806.

When unlocked and enabled, the state machine transitions from the Idle state to the Input AI state. In the Input AI state, the tester inputs a first voltage input to the circuit via AIO1. Transitioning to the Execute state, the state machine outputs test control (TC) to circuit 906 to cause the circuit to input the voltage, convert the voltage into a digital representation, and output the digital representation to comparator 806. Transitioning to the Input AI & Compare Data state, the tester inputs the next voltage to the circuit via AIO1 and inputs compare data on IOB to comparator 806. The state machine outputs control to strobe the pass/fail flag 815 and counter 807. The pass/fail flag receives the output from the comparator 806. If the comparator output is high, the digital representation output from circuit 906 matches the data input on IOB and the compare passes. If the comparator output is low, the digital representation does not match the data input on IOB and the compare fails.

Transitioning to the Execute state, the input, conversion, and output control steps are repeated. Transitioning to the Input AI & Compare Data state the tester inputs the next voltage to circuit 906 and compare data on IOB, and the state machine compares the digital representation output from circuit 906 to the compare data on IOB by strobing the pass/fail flag and counter. This process of looping between the Input AI & Compare Data state and Execute state continues until circuit 906 is tested. The state machine then transitions to the Idle state via the End Of Test and Lock states. At the end of test, the pass/fail and counter can be read using IOB read test operation state machine of FIG. 9J. Also, the tester can detect immediate compare failures by monitoring the TSO pad output (FIG. 5A).

In FIG. 15D, another TPI controlled test operation state machine is shown for testing circuit 906. The state machine consists of Idle, Input AI, Execute, Input AI & Compact Data, End Of Test, and Lock states. This state machine is identical to the FIG. 15C state machine with the following exceptions; (1) the compactor 808 is enabled and controlled to input data from circuit 906 during the Input AI & Compact Data state to produce a signature, (2) the comparator 806, pass/fail flag 815, and counter 807 circuits are disabled, and (3) compare data is not input on IOB during the Input AI & Compact Data state. At end of test, the signature in comparator can be read via IOB.

Analog Test Example 4

Figure 16A:
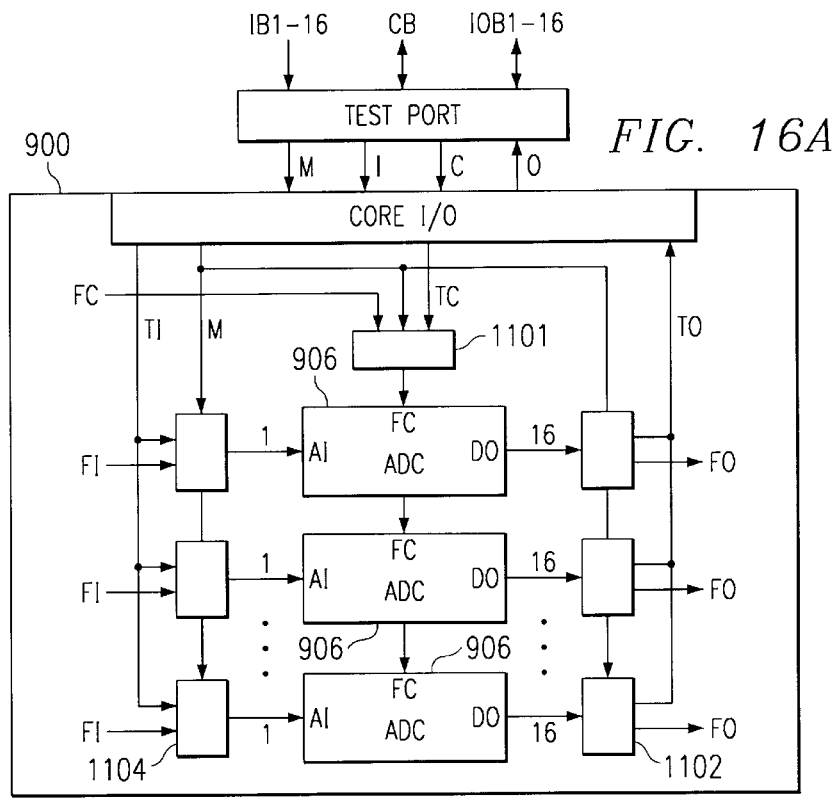
FIG. 16A is a block diagram of an integrated circuit including plural analog to digital circuits in an intellectual property core and a test port.

In FIG. 16A, the test port is used to test multiple ADC circuits 906 in connected core 900.

Figure 16B:
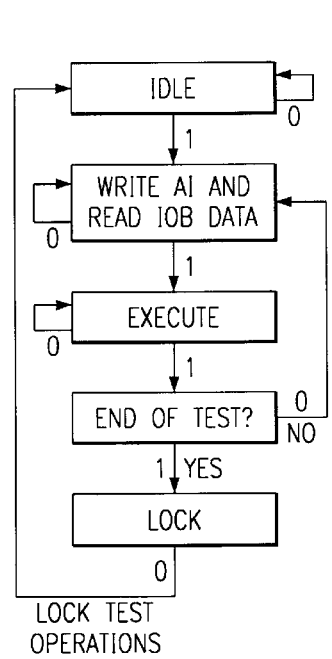
FIGS. 16B, 16C and 16D are state diagrams describing testing procedures for the analog to digital circuits.

In FIG. 16B, a TPI controlled test operation state machine is shown for testing circuits 906. The state machine consists of Idle, Write AI & Read IOB Data, Execute, End Of Test, and Lock states. During test, the test port is configured by mode (M) to connect the IC's AIO1 pad as an input to sample/hold circuit 711, connect individual ones of the ATI1–N outputs of sample/hold circuit 711 to individual ones of the AI inputs of circuits 906 via multiplexer 1104, and to connect the outputs of circuit's 906 to buffers 1–N of I/O port 404 via demultiplexers 1102.

When unlocked and enabled, the state machine transitions from the Idle state to the Write AI & Read IOB state. In the Write AI & Read IOB state, external voltages from a tester (via AIO1) are written to the sample/hold elements 715, 716, 717 during write sequences to be input to circuits 906, and data output (O) from circuits 906 are read during read sequences and output to the tester via IOB. Entering the Execute state, the state machine outputs test control (TC) to the circuits to cause them to input (I) the analog voltages, convert the voltages into a digital representations, and output (O) the digital representations to the test port. The state machine then transitions back into the Write AI & Read IOB Data state, where the next test voltages to be input (I) to circuits 906 are written into sample/hold circuit 711, and data (O) from circuits 906 are read and output to the tester via IOB. Transitioning to the Execute state, the input, conversion, and output control steps are repeated, then the Write AI & Read IOB Data state is re-entered to input (I) new voltages and read output (O). Eventually circuits 906 are tested and the state machine transitions to the Idle state via the End Of Test and Lock states.

Figure 16C:
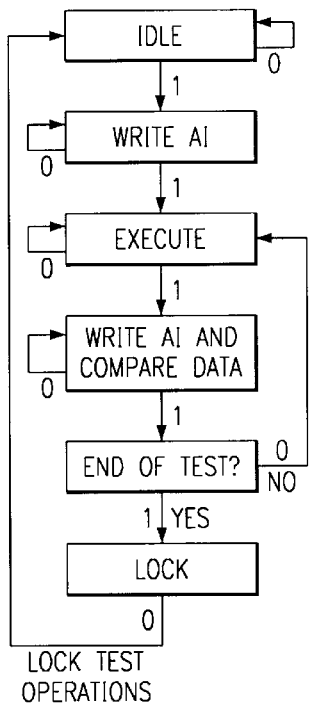

In FIG. 16C, another TPI controlled test operation state machine is shown for testing circuits 906. The state machine consists of Idle, Write AI, Execute, Write AI & Compare Data, End Of Test, and Lock states. During test, the test port is configure by mode (M) to: (1) connect the IC's AIO1 pad as an input to sample/hold circuit 711, (2) connect individual ones of the ATI1–N outputs of sample/hold circuit 711 to individual ones of the AI inputs of circuits 906, (3) connect the outputs of circuit's 906 to buffers 1–N of I/O port 404, (4) enable comparator 806, pass/fail flag 815, and counter 807 of I/O port 404, and (5) connect the pass/fail flag signal to the IC's TSO pad.

When unlocked and enabled, the state machine transitions from the Idle state to the Write AI state. In the Input AI state, the state machine inputs first voltages from the tester to the sample/hold circuit 711 using write sequencer 713. Transitioning to the Execute state, the state machine outputs test control (TC) to circuits 906 causing them to input the voltages from sample/hold circuit 711, convert the voltages into digital representations, and output the digital representations. Transitioning to the Write AI & Compare Data state, the state machine inputs next voltages from the tester to sample/hold circuit 711 using write sequencer 713 and, using read sequencer 814, compares the data output from the circuits 906 with data input on IOB, using comparator 806. During each read sequence step, the tester strobes the comparator output data into pass/fail flag 815 and increments counter 807. A high comparator output indicates a compare pass and a low indicates a compare fail, as previously mentioned.

Transitioning to the Execute state, the input, conversion, and output control steps are repeated. Transitioning to the Write AI & Compare Data state, the voltage input (I) and compare output (O) operations are repeated. This process of looping between the Write AI & Compare Data state and Execute state continues until circuits 906 are tested. The state machine then transitions to the Idle state via the End Of Test and Lock states. At the end of test, the pass/fail and counter can be read using IOB read test operation state machine of FIG. 9J. Also, the tester can detect immediate compare failures by monitoring the TSO pad output (FIG. 5A).

Figure 16D:
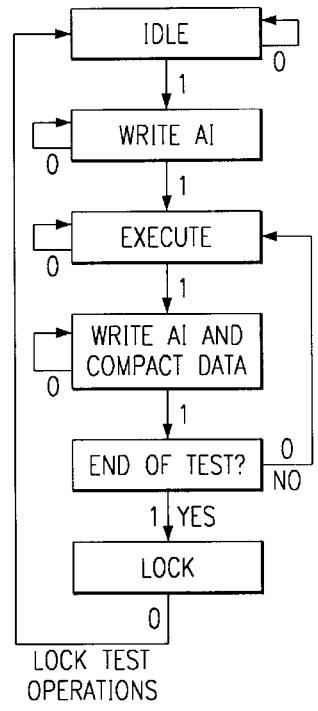

In FIG. 16D, another TPI controlled test operation state machine is shown for testing circuits 906. The state machine consists of Idle, Write AI, Execute, Write AI & Compact Data, End Of Test, and Lock states. This state machine is identical to the FIG. 16C state machine with the following exceptions; (1) the compactor 808 is enabled and controlled to input data from circuits 906 during the Write AI & Compact Data state to produce a signature, (2) the comparator 806, pass/fail flag 815, and counter 807 circuits are disabled, and (3) compare data is not input on IOB during the Write AI & Compact Data state. At end of test, the signature in comparator can be read via IOB.

RAM Test Example

The following provides an example of how the test port 105 can be used to test one or more RAMs contained within a connected core. In this example, it is assumed the connected core and has been designed for interfacing its internal RAMs to test port 105. Some of the important aspects of this example include: (1) illustrating how the generator and compactor circuit in the test port, in combination with an autonomous test operation state machine, can be used to test an embedded RAM, and (2) illustrating how multiple embedded RAMs may be tested in parallel.

Figure 17A:
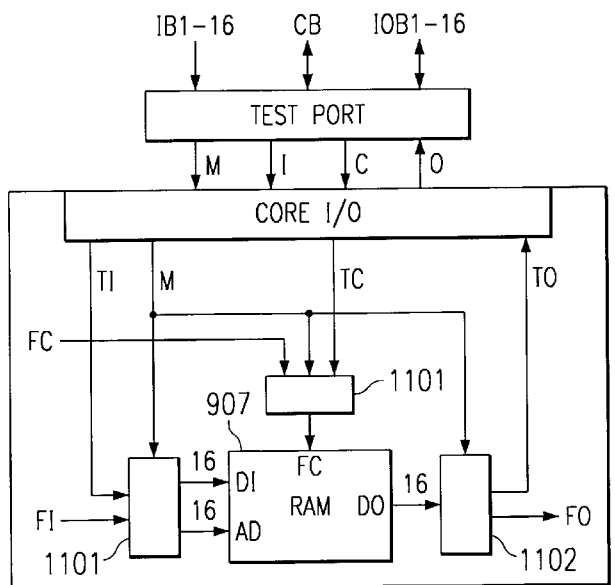
FIG. 17A is a block diagram of an integrated circuit including a random access memory, RAM, in an intellectual property core and a test port.

In FIG. 17A, the test port is used to test a RAM 907 circuit in connected core 900. RAM 907 includes functional input (FI) for address and data input, functional control (FC) input for read and write control, and functional outputs (OF) for data output. RAM 907 has no test mode, so testing must be performed, by adding multiplexer 1101 to the RAM inputs and demultiplexer 1102 on RAM outputs. In functional mode, the multiplexer and demultiplexer are controlled by mode (M) to connect the RAM's FI, OF, and FC to other circuits in the core. In test mode, the multiplexers and demultiplexers are controlled by mode (M) to connect the RAM's FI, OF, and FC to the inputs (I), outputs (O), and control (C) of the test port.

Figure 17B:
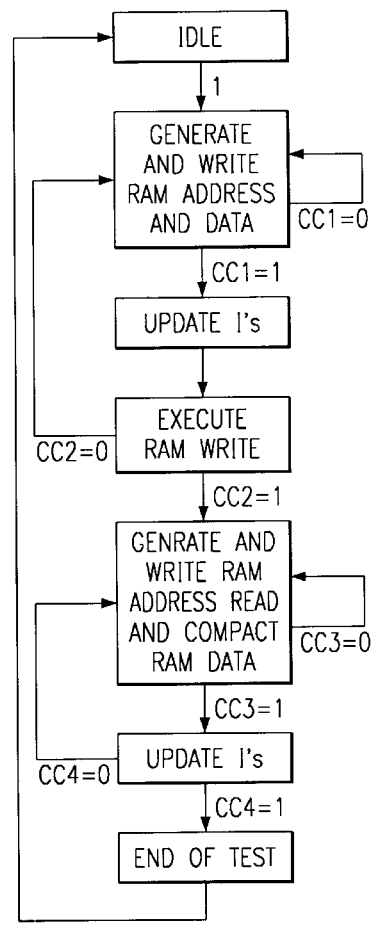
FIG. 17B is a state diagram describing testing procedures for the RAM.

In FIG. 17B, an autonomous test operation state machine is shown for testing RAM 907. The state machine consists of an Idle state, Generate & Write RAM Address & Data state, Execute RAM Write state, Generate & Write RAM Address, Read & Compact RAM Data state, Update I's state, and an End Of Test state. During test, the test port is configured by mode (M) to: (1) enable generator 710 for generating RAM address and data input to registers 1–N in response to write sequences from write strobe generator 713, (2) enable compactor 808 for compacting RAM data output from buffers 1–N into a signature in response to read sequences from read enable sequencer 814, and (3) connecting the test port inputs (I) and outputs (O) to the RAM via multiplexer 1101 and demultiplexer 1102.

When unlocked and enabled, the state machine transitions from the Idle state to the Generate & Write RAM Address & Data state. In this state, generator 710 produces and outputs the first RAM address and data to registers 1–N in response to write sequences. Entering the Update I's state, address and data written to registers 1–N is input (I) to the RAM. Entering the Execute RAM Write state, the state machine outputs test control (TC) to the RAM causing it to write the data input (I) to the RAM address input (I). Re-entering the Generate & Write RAM Address & Data state, generator 710 produces and outputs the next RAM address and data to registers 1–N in response to write sequences. Re-entering Update I's state inputs (I) the next address and data to the RAM. Re-entering the Execute RAM Write state, writes the next data to the next RAM address location. This loop continues until all RAM address locations have been written with data, then the state machine transitions to the Generate & Write RAM Address, Read & Compact RAM Data state.

In the Generate & Write RAM Address, Read & Compact RAM Data state, generator 710 is controlled to produce the RAM addresses it previously produced in the Generate &

Write RAM Address & Data state, but not the data. Also in this state, compactor 808 receives control to input and process data output (O) from the currently addressed RAM location. Entering this state for the first time from the Execute RAM Write state, causes the compactor to input and process data from the last address generated in the Generate & Write RAM Address & Data state above. Subsequent entries into this state will input and process data from RAM address locations generated by this state. Transitioning from this state to the Update I's state inputs (I) the next address to the RAM. The Update I's state is include to insure the RAM address is stable when RAM output data is being input and processed by compactor 808. If it is determined that address stability is not a problem, the Update I's states may be eliminated from the state machine. Looping between Generate & Write RAM Address, Read & Compact RAM Date state and Update I's state allows compacting all data previously written into the RAM locations. At the end of test the state machine returns to the Idle state, and the signature in compactor 808 may be read via the IOB. This autonomous test operation state machine, as with all previous autonomous test operation state machines, controls counters 1–4 in input port 403 to know when to transition from states, as indicated by the CC(1–4)=0 and CC(1–4)=1 count complete indicators.

Figure 17C:
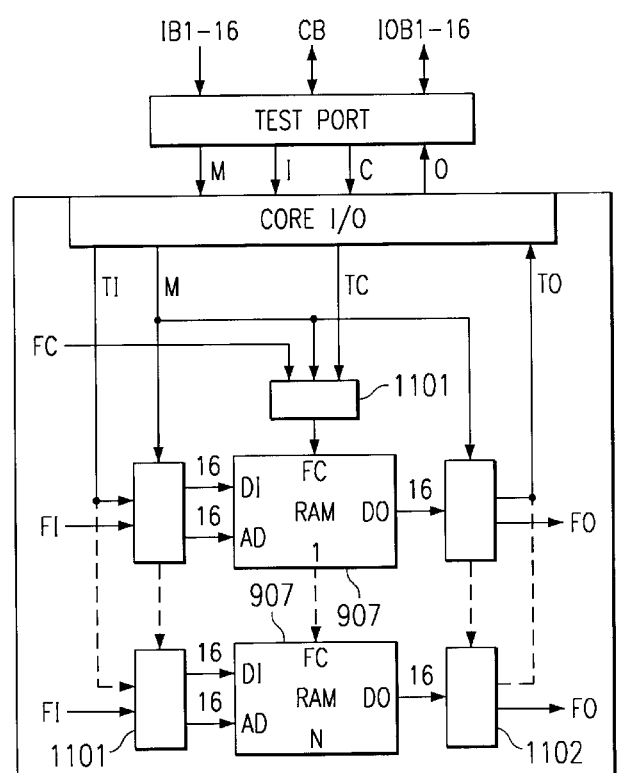
FIG. 17C is a block diagram of an integrated circuit including plural embedded RAMs in an intellectual property core and a test port.

In FIG. 17C, the test port performs the simultaneous testing of multiple embedded RAMs 907 within core 900. The test operation state machine of FIG. 17B can be used without modification to perform testing on the RAMs 907 of FIG. 17C. The only differences are: (1) the count loaded into the counter 1 during the Input Test Mode state of FIG. 6A is increased to generate an address and data input pair for each RAM tested, and (2) the count loaded into the counter 3 during the Input Test Mode state is increased to generate an address input for each RAM tested. Counts loaded into counters 2 and 4 remain the same since they relate to the address range of the RAMs, and in this example, all RAM 907 have the same address range.

Testing Fabric Circuitry

Figure 18:
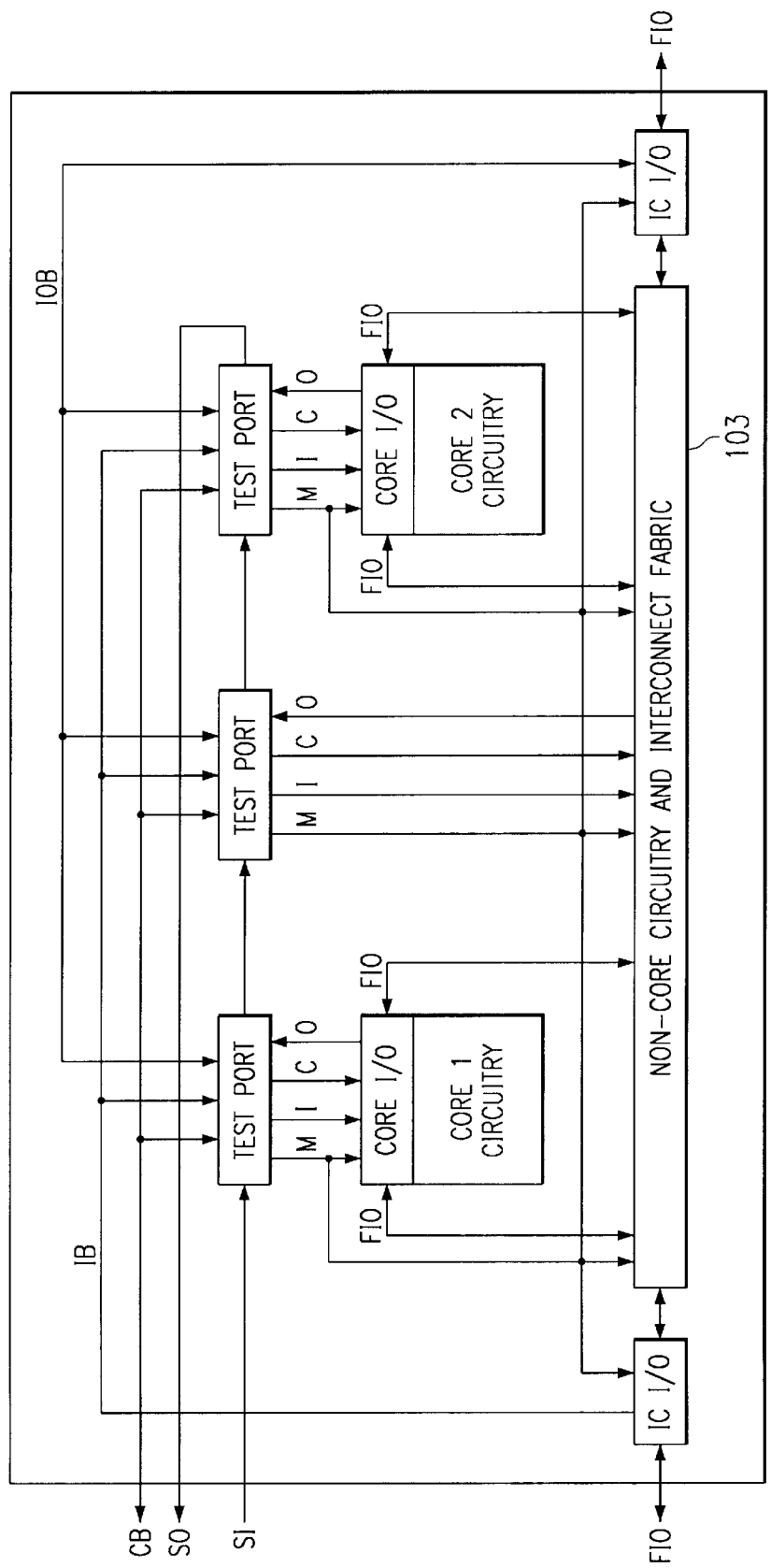
FIG. 18 is a block diagram of an integrated circuit including two intellectual property cores, and a test port connected to the interconnect fabric.

In FIG. 18, circuitry within fabric 103 may be tested using a test port. In this example, a test port is shown connected to the fabric. The fabric may contain the same types of circuits as described previously in core 900 of FIGS. 9–17. The test port connected to the fabric, tests fabric resident circuits the same way as it tested the core 900 resident circuits System-On-Chip Test Example 1

Figure 19:
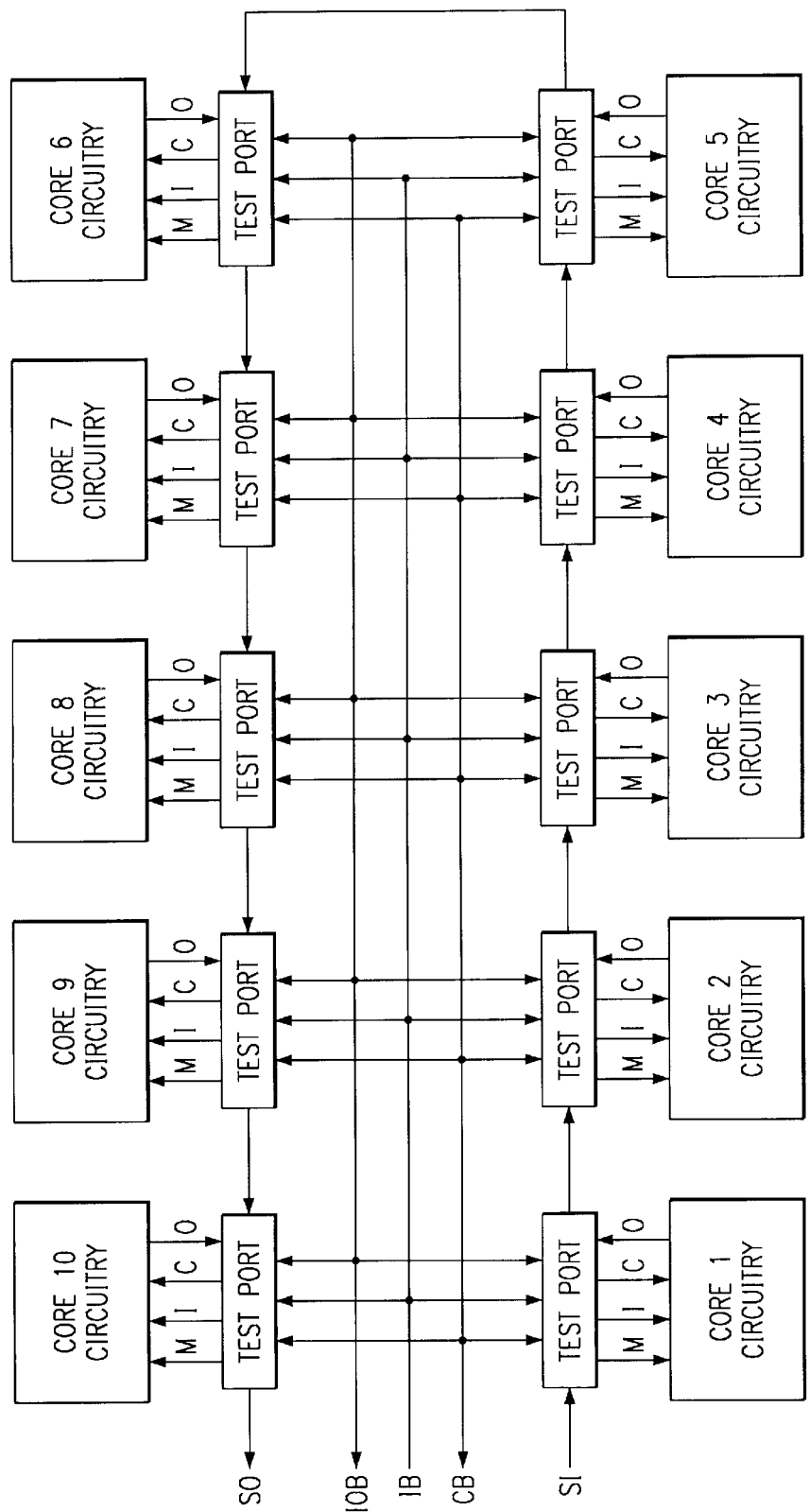
FIG. 19 is a block diagram of a system-on-a-chip including 10 intellectual property cores, each connected to a test port.

In FIG. 19, a system-on-chip comprises cores 1–10 with each core being connected to a test port. The process for testing the cores is as follows. First the test ports are scanned via SI and SO to load a unique address into each test port and to place the system in a test mode. It is important to note that serially scanning the test ports only has to occur once prior to starting the test. The actual test occurs using the much faster parallel access provided by the parallel IB and IOB busses. Next, an address is input to all test ports via the IB bus. Only the test port with the matching address is enabled for testing, all other test ports are locked out. Next, a test mode is input to the addressed test port, via the IB bus. The test mode unlocks and enables a TPI controlled 507 or autonomous 509 test operation state machine within the addressed test port and configures the connected core for testing. If a TPI controlled test operation state machine 507 is enabled, the test port state machine 510 becomes locked until the test completes. If an autonomous test operation state machine 509 is enabled, the test port state machine 510 is not locked and another test port may be addressed to input a test mode to test its connected core while the autonomous test operation state machine executes.

The following description assumes TPI controlled test operation state machines are used to test core 1–10. During the TPI controlled test operation, the test port communicates with an external tester via CB, IB, and IOB. At the end of the TPI controlled test operation, the test port state machine 510 is unlocked. The unlocked test port state machine may transition to the Idle 2 state, the Idle 1 state, or the scan address states of FIG. 6A. Transitioning to the Idle 2 state permits inputting a new test mode into the currently addressed test port. Transitioning to the Idle 1 state permits addressing another test ports to perform a test on its connected core. Transitioning to scan address state permits scanning all test ports via SI and SO. Assuming the transition is to Idle 1, all test ports exit from Test and Address Lock states and go to Idle 1. Transitioning from the Idle 1 state to the Input Port Address state loads the new test port address. Transitioning from Input Port Address state to the Idle 2 state, via Port Address Match state, selects the newly addressed test port and places all non-addressed test ports into the Address Lock state. From the Idle 2 state, a transition to the Update Test Mode state, via the Input Test Mode state, selects a TPI controlled test operation state machine in the newly addressed test port and configures the connected core for testing. Transitioning from the Update Test Mode state to Test Lock state, unlocks and enables the TPI controlled test operation state machine and locks and disables the test port state machine. The core is then tested using the TPI controlled test operation state machine.

The above TPI controlled test operation can be summarized into the steps of:

1 Scanning the test ports to load unique addresses into each test port and load data to configure the system into test mode.
2 Addressing a first test port via IB, enabling a TPI controlled test operation state machine, controlling the test operation via CB until it completes.
3 Addressing a second test port via IB, enabling a TPI controlled test operation state machine, controlling the test operation via CB until it completes.
4 Addressing a third test port via IB, enabling a TPI controlled test operation state machine, controlling the test via CB until it completes.
5 Addressing a fourth test port via IB, enabling a TPI controlled test operation state machine, controlling the test via CB until it completes
6 Addressing a fifth test port via IB, enabling a TPI controlled test operation state machine, controlling the test via CB until it completes.
7 Addressing a sixth test port via IB, enabling a TPI controlled test operation state machine, controlling the test via CB until it completes.
8 Addressing a seventh test port via IB, enabling a TPI controlled test operation state machine, controlling the test via CB until it completes.
9 Addressing a eighth test port via IB, enabling a TPI controlled test operation state machine controlling the test via CB until it completes.
10 Addressing a ninth test port via IB, enabling a TPI controlled test operation state machine, controlling the test via CB until it completes.
11 Addressing a tenth test port via IB, enabling a TPI controlled test operation state machine, controlling the test via CB until it completes.

12 Scanning the test ports to unload test status information and load data to configure the system into functional mode.

The steps of using autonomous test operations to test the system of FIG. 19 can be summarized as shown below.

1 Scanning the test ports to load unique addresses into each test port and load data to configure the system into test mode.
2 Addressing a first test port via IB and enabling an autonomous test operation state machine.
3 Addressing a second test port via IB and enabling an autonomous test operation state machine.
4 Addressing a third test port via IB and enabling an autonomous test operation state machine.
5 Addressing a fourth test port via IB and enabling an autonomous test operation state machine.
6 Addressing a fifth test port via IB and enabling an autonomous test operation state machine.
7 Addressing a sixth test port via IB and enabling an autonomous test operation state machine.
8 Addressing a seventh test port via IB and enabling an autonomous test operation state machine.
9 Addressing an eighth test port via IB and enabling an autonomous test operation state machine.
10 Addressing a ninth test port via IB and enabling an autonomous test operation state machine.
11 Addressing a tenth test port via IB and enabling an autonomous test operation state machine.
12 Waiting for all tests to complete by monitoring the TSO pad of CB bus. It will be pulled low until all an autonomous test operation state machines completed their test.
13 Scanning the test ports to unload test status information and load data to configure the system into functional mode.

System-On-Chip Test Example 2

Figure 20:
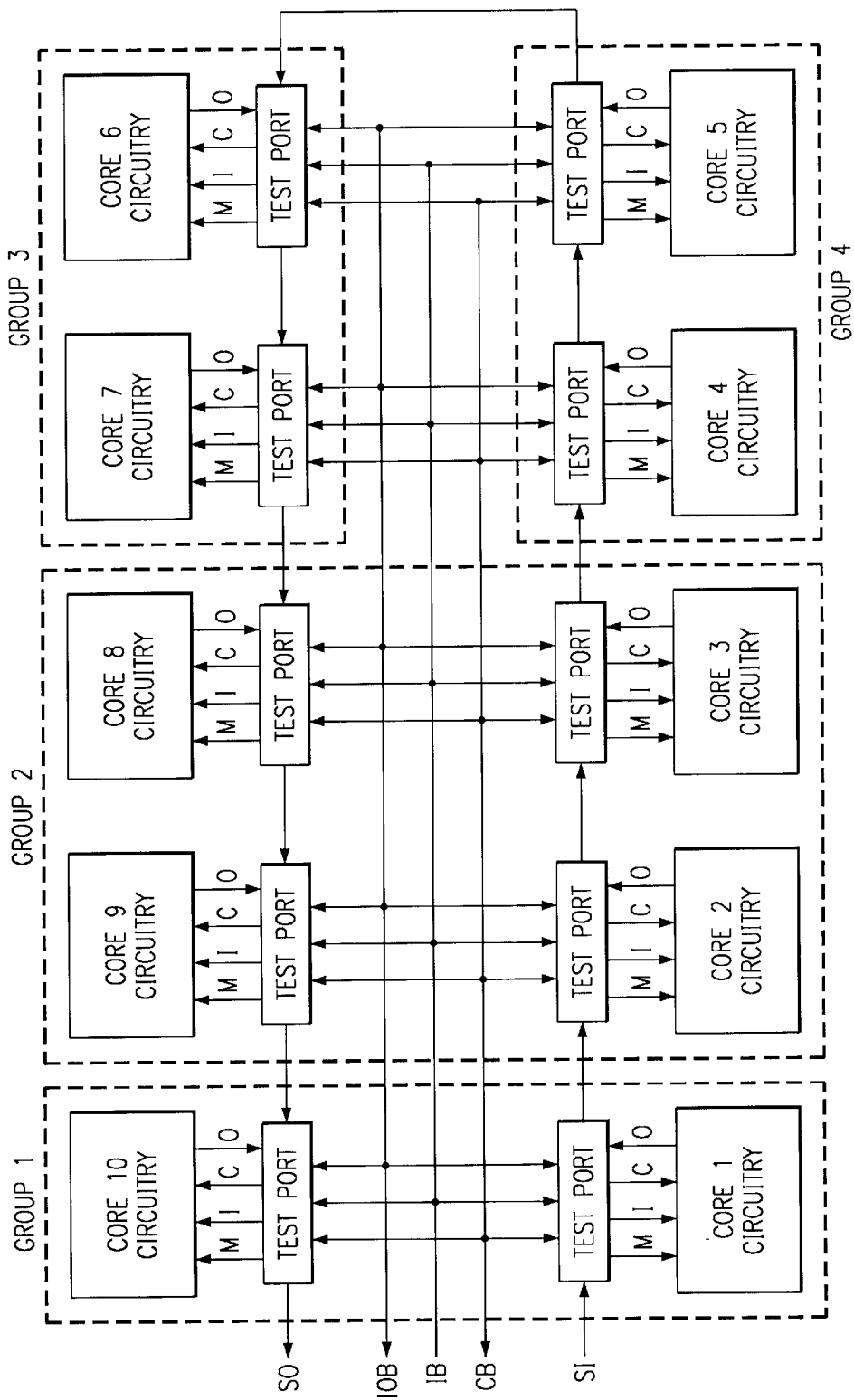
FIG. 20 is a block diagram of a system-on-a-chip including four groups of intellectual property cores, each connected to a test port and the intellectual property cores in each group being identical to one another.

In FIG. 20, a system-on-chip comprises cores 1–10, each with a test port. Cores 1 and 10 are identical cores. Cores 2, 3, 8 and 9 are the same, cores 4, 5 are the same, and cores 6 and 7 are the same, as indicated by the dotted line boxes. The test ports connected to identical ports are also identical. In the test examples of FIGS. 9F, 10C, 11C, 12C, 13C, 14C, 15C, and 16C, the compare method of testing was described. During the compare method of testing, external compare data from IOB or windowing voltages from AIO1 and AIO2 is input to the internal comparators (808 or 809) of I/O port 404 to be compared against data or voltages output (O) from the tested core. This compare method can be further used to simultaneously test identical cores in the system of FIG. 20.

To simultaneously test identical cores 1 and 10 their identical test ports are scanned with the same address. Likewise, the identical test ports of identical cores 2, 3, 8, and 9 are scanned with the same address, identical test ports of identical cores 4 and 5 are scanned with the same address, and identical test ports of identical cores 6 and 7 are scanned with the same address.

Next, test ports of cores 1 and 10 are both addressed, which is possible since they both contain the same address. Next, a compare type test operation state machine, such as FIG. 9F, is enabled in each addressed test port to simultaneously test cores 1 and 10 by inputting external compare data to the test ports via IOB When testing of cores 1 and 10 is complete, the test ports of cores 2, 3, 8, and 9 are addressed. Next, a compare type test operation state machine, such as FIG. 10C, is enabled in each addressed test port to simultaneously test cores 2, 3, 8, and 9 by inputting external compare data to the test ports via IOB.

When testing of cores 2, 3, 8, and 9 is complete, the test ports of cores 4 and 5 are addressed. Next, a compare type test operation state machine, such as FIG. 11C, is enabled in each addressed test port to simultaneously test cores 4 and 5 by inputting external compare data to the test ports via IOB.

When testing of cores 4 and 5 is complete, the test ports of cores 6 and 7 are addressed. Next, a compare type test operation state machine, such as FIG. 12C, is enabled in each addressed test port to simultaneously test cores 4 and 5 by inputting external compare data to the test ports via IOB.

At the end of testing identical cores 6 and 7, the system test is complete. The address registers of all test ports are scanned to output their pass/fail information and to input data to place the system in functional mode. At the end of the scan operation, the tester evaluates the pass/fail information from each test port to see which core passed or failed a given test.

The ability to address and simultaneously test groups of identical cores in the system of FIG. 20 enables the system to be tested using only four test sessions. Without this ability, the system test would have required ten test sessions. This is an important advantage, since reducing system test time lowers the manufacturing cost of wafers and packaged integrated circuits. For example, fewer conventional expensive wafer probe and IC testers are needed if the test time of die on wafers and packaged ICs is reduced.

Using Functional Buses for IB and IOB Buses

Figure 21:
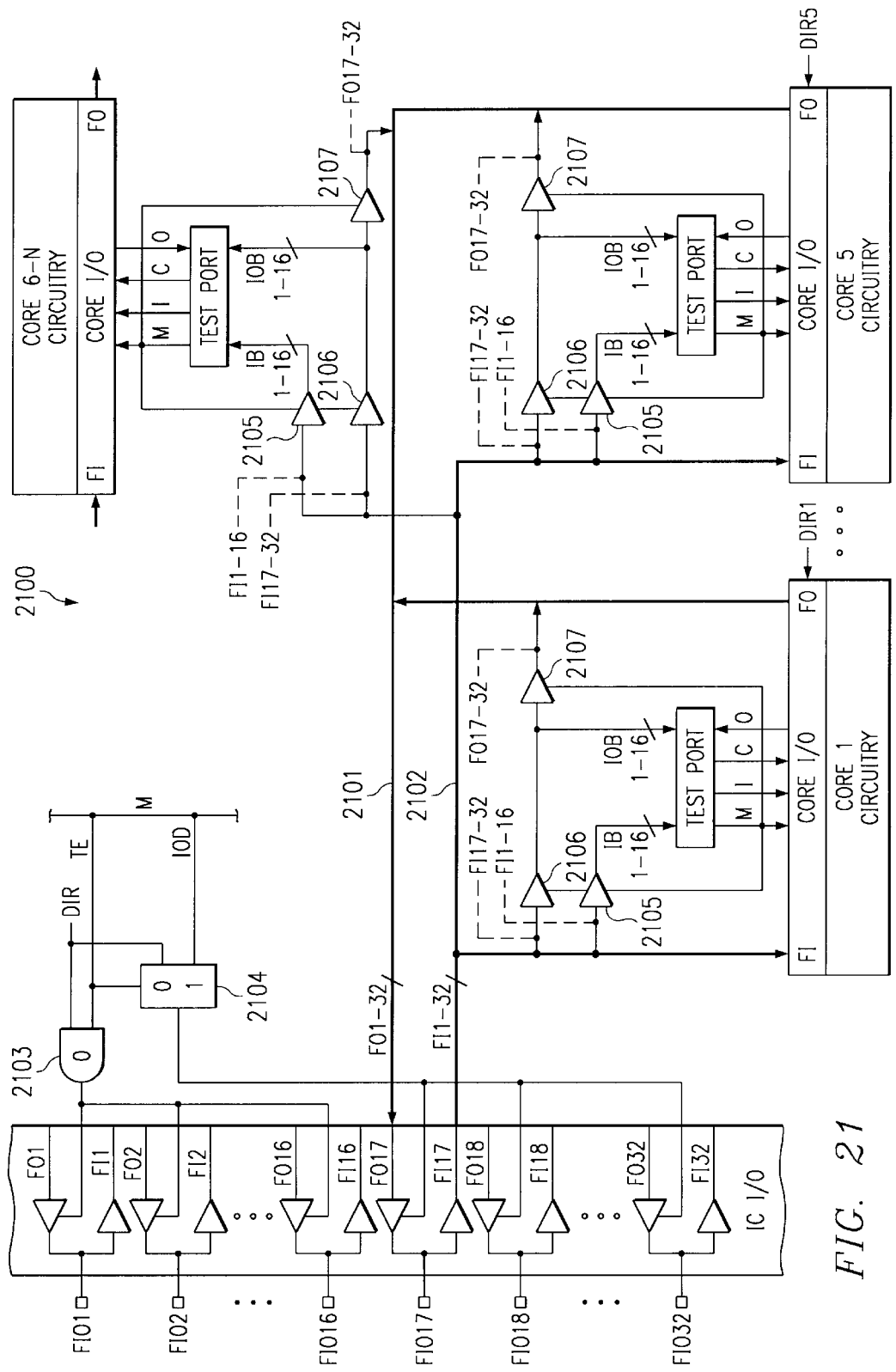
FIG. 21 is a block diagram of an integrated circuit having 1–N cores, each connected to a test port.

In FIG. 21, an IC 2100 contains cores 1–N, each with a test port. The functional architecture of the IC includes a 32 bit functional output (OF) bus 2101 and a 32 bit functional input (FI) bus 2102 connected between cores 1–5 and a 32 bit functional input/output (FIO) bus at the IC I/O. During functional operation, the test enable (TE) signal from the test ports to Or gate 2103 and multiplexer 2104, which are added for testing, is low. A low on TE enables the Or gate and multiplexer to pass the functional DIR signal to regulate the input or output operation of the 32 bit FIO bus. Also during functional operation, a selected one of the cores 1–5 is enabled, via functional DIR1–5 signals, to functionally output to the FIO bus and functionally input from the FIO bus.

In FIG. 21 it is seen that since the FI and OF buses are routed to cores 1–5, they can also be locally connected to the IB and IOB buses of the test ports of each core. This allows the IB and IOB test port buses to use the pre-existing functional buses for test data input and output, and eliminates the need to route separate global IB and IOB buses for core 1–5 test ports, as seen in FIG. 1. For example, the 16 bit IB of core 1–5 test ports is locally connected to the 1–16 bit wires of the 32 bit FI bus via 3-state buffers 2105, and the 16 bit IOB is locally connected to the remaining 17–32 bit wires of the 32 bit FI bus via 3-state buffers 2106. Further, the 16 bit IOB is locally connected to the 17–32 bit wires of the 32 bit OF bus via 3-state buffers 2107. During functional operation, the 3-state buffers are disabled by mode (M) output from the test ports to isolate the IB and IOB buses from the FI and OF buses.

During test operation, the TE signal is set high by one or more of the test ports to disable the functional DIR signal from controlling the 32 bit FIO bus. With TE high, IC I/O pads FIO1–16 are forced to become inputs to input data on the 1–16 bit wires of the 32 bit FI bus. Since IB of core 1–5 test ports is locally connected to the 1–16 bit wires of the 32 bit FI bus via buffer 2105, it can receive data from the FIO1–16 pads during test operations while buffers 2105 are enabled. Also with TE high, the input or output operation of IC I/O pads FIO17–32 is regulated by the IOD signal, via multiplexer 2104, from one or more of the test ports. Since IOB of core 1–5 test ports is locally connected to the 17–32 bit wires of the 32 bit FI bus via buffers 2106, it can receive data from the FIO17–32 pads during test operations while buffers 2106 are enabled and while IOD controls pads FIO17–32 to operate as inputs. Also, since IOB of core 1–5 test ports is locally connected to the 17–32 bit wires of the 32 bit OF bus via buffers 2107, it can output data to the FIO17–32 pads during test operations while buffers 2107 are enabled and while IOD controls pads FIO17–32 to operate as outputs. Further, during test mode, the functional DIR1–N inputs to cores 1–5 that regulate whether the core OF's are enabled or disabled can be controlled by mode (M) to disable the core OF's when buffers 2107 are enabled, to avoid contention. One method of allowing mode (M) to control the DIR1–5 inputs is to use a multiplexer 301, as shown in FIG. 3.

With the IC configured for testing as described above, the test ports can test cores 1–5 by communicating test data to and from the cores using the existing FI and OF buses and the localized connections between the FI and OF buses and IB and IOB buses. Since only localized connections exist between the FI and OF and IB and IOB buses, IC area overhead for test wiring is reduced by using functional buses as test buses. It is an advantage therefore when implementing test ports, according to the present invention, in ICs whose functional architecture requires functional input and output buses, to reuse the functional buses as global IB and IOB test buses.

In FIG. 21 it is seen that while cores 6–N are not functionally connected to function buses 2101 and 2102, their test port IB and IOB buses may be advantageously connected to the functional buses to further reduce area for routing IB and IOB test buses. This is especially true if the functional buses are routed close to cores 6–N. The IB and IOB buses of core 6–N test ports are interfaced to the functional buses 2101 and 2102 via 3-state buffers 2105, 2106, and 2107. The 3-state buffers of cores 6–N test ports are controlled as described with the 3-state buffers of cores 1–5 test ports.

Sharing IC Pads For Use By Test Port or IEEE TAP Interfaces

Figure 22:
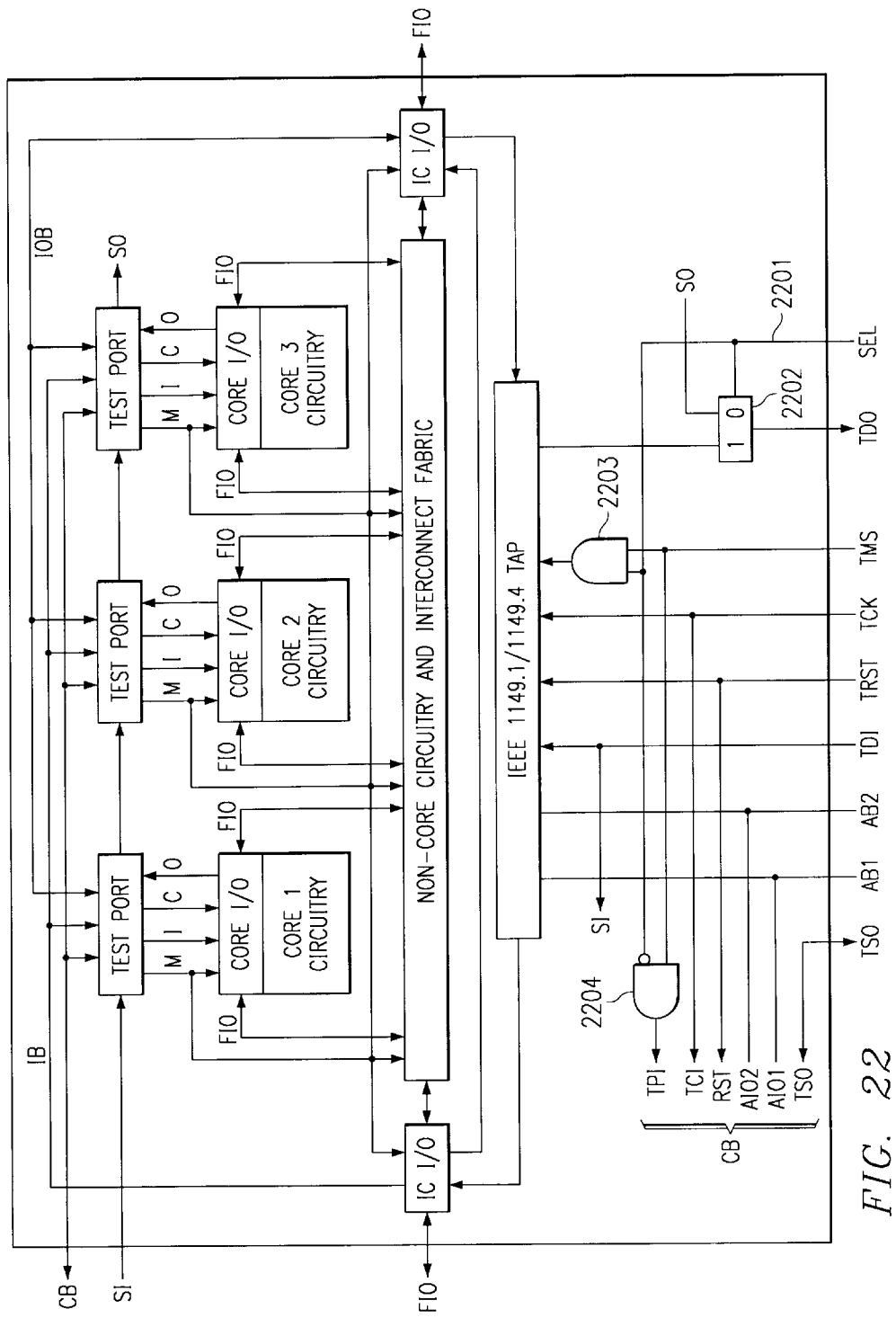
FIG. 22 is a block diagram of an integrated circuit having an IEEE 1149.1/1149.4 test access port (TAP) interface.

FIG. 22 shows an IC implementing an IEEE standard 1149.1/1149.4 test access port (TAP) interface. The TAP interface comprises IC pads dedicated for; analog bus 1 (AB1), analog bus 2 (AB2), test data input (TDI), test reset (TRST), test clock (TCK), test mode select (TMS), and test data output (TDO) signals. The IC also implements the test port and control bus (CB) of the present invention. CB's AIO1 signal is wired to the AB1 signal to allow sharing pad AB1. CB's AIO2 signal is wired to the AB2 signal to allow sharing pad AB2. CB's RST input is wired to the TRST input to allow sharing the TRST pad. CB's TCI input is wired to the TCK input to allow sharing the TCK pad. CB's TPI input is connected to TMS input via And gate 2204 to allow sharing the TMS pad. The TMS input is connected to the TAP via And gate 2203. A select (SEL) pad is added to the IC for controlling And gates 2204 and 2203. When SEL is high, And gate 2203 passes TMS input to the TAP, and And gate 2204 gates the TPI input to the test ports low. When SEL is low, And gate 2203 gates the TMS input to the TAP low, and And gate 2204 passes the TMS input, as TPI input, to the test ports. The SI input to the core 1 test port is wired to the TDI input to allow sharing the TDI pad. The SO output from core 3 test port is connected to the TDO output via multiplexer 2201 to allow sharing the TDO pad. When SEL is high, multiplexer 2201 outputs TDO from the TAP to the TDO pad. When SEL is low, multiplexer 2201 outputs SO from core 3 test port to the TDO pad.

Using the described connections, gates 2203 and 2204, multiplexer 2202, and the added SEL pad, the test port interface is shared with the IEEE TAP interface, such that no additional IC pads are required, except for the SEL pad. The SEL pad determines whether the shared pads are used for accessing the test port of the present invention, or for accessing the IEEE TAP.

Low Cost Wafer and IC Tester

Figure 23A:
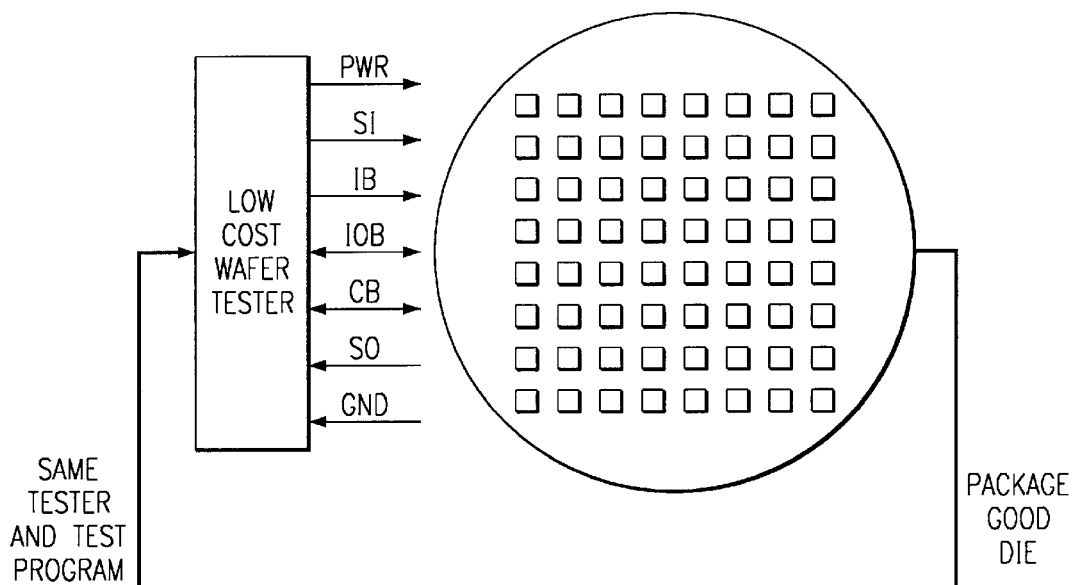
FIG. 23 is a block diagram of a low cost tester used as a wafer tester and as an IC tester.

In FIG. 23A, a low cost wafer tester is shown providing power (PWR), SI, IB, IOB, CB, SO, and ground (GND) contacts to a wafer containing the system on chip die of FIGS. 20. The tester is low cost because it only requires signals to power up the die, and communicate with the die serially via CB, SI, and SO, and in parallel via CB, IB, and IOB. The tester makes contact to each die, via the signals above, using conventional probe methods or using other more advanced contacting techniques. The tester can test all die on wafer in parallel or in selected groups of parallel die on wafer. The tests performed in parallel are as described on the individual system on chip in FIG. 20. The ability to test multiple die simultaneously using the compare test method of FIG. 20 reduces wafer test time and thus wafer manufacturing cost. After testing the die, the good die are packaged and retested as shown in FIG. 23B.

Figure 23B:
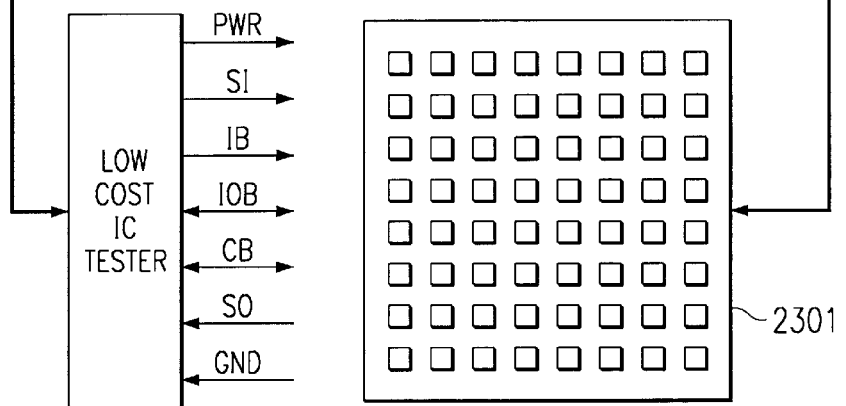

In FIG. 23B, a low cost IC tester is shown providing power (PWR), SI, IB, IOB, CB, SO, and ground (GND) contacts to the packaged ICs arranged on a test fixture 2301. Again, the tester is low cost because it only requires signals to power up the ICs, and communicate with the ICs serially via CB, SI, and SO, and in parallel via CB, IB, and IOB. The tester makes contact to each IC, via the signals above, using fixture 2301 which is designed to provide contacts between each IC and the tester. The tester can test all ICs on the fixture in parallel or in selected groups of parallel ICs on the fixture. The tests performed in parallel are as described on the individual system on chip in FIG. 20. The ability to test multiple ICs simultaneously using the compare test method of FIG. 20 reduces IC test time and thus IC manufacturing cost. After testing the ICs, the good ICs are tested at-speed on a conventional IC tester for final screening test. No ICs that fail the low cost test will get to the conventional at-speed tester, which again further reduces manufacturing cost by allowing only known good ICs to consume test time on the conventional IC tester.

The low cost wafer and IC tester are the same tester programs. While the test architecture has been described for use in a system IC, it applies equally well to a system core. While the addressed test port has been described for being used as a core test interface, it can be used as an IC test interface as well.

I claim:

1. An integrated circuit comprising:
   A. functional input and output signal leads;
   B. input and output circuits connected to the functional input and output signal leads;
   C. plural core circuits;
   D. interconnect wires and circuits connecting the input and output circuits and the core circuits;

E. at least two addressable test ports, each test port being associated with one core circuit and being connected to the associated core circuit and to the interconnect wires and circuits; and
F. external control signal leads connected to each test port and carrying the same external control signals to each test port; and
G. each test port includes:
   H. an address register connected in series to a serial input lead and a serial output lead;
   I. a test controller connected to control bus leads having a mode signal lead connected to the core circuit;
   J. an input port connected to input bus leads, which are connected to the interconnect wire and circuits, and the input port being connected to input leads that connect to the core circuit; and
   K. an input/output port that is connected to input/output bus lead, which are connected to the interconnect wires and circuits, and the input/output port being connected to output leads connected to the core circuit and to a status lead connected to the core circuit.

2. The integrated circuit of claim 1 in which the control bus leads include leads for analog inputs/outputs, a test status output, a test protocol input, a test clock input, and a reset input.

3. The integrated circuit of claim 1 in which the test controller includes a test port state machine and plural test operation state machines connected to leads for a test protocol input and a test clock input and the test port state machine being connected to a reset input.

4. The integrated circuit of claim 1 in which the input port includes a comparator circuit, an input register circuit, a mode and address register circuit, an update register circuit and a decode logic circuit interconnected with one another.

5. The integrated circuit of claim 1 in which the input/output port includes read enable sequencer circuitry, input buffer circuitry, multiplexer circuitry and input/output buffer circuitry.

* * * * *